(12) United States Patent
Smakman et al.

(10) Patent No.: US 10,527,950 B2
(45) Date of Patent: Jan. 7, 2020

(54) APPARATUS FOR DIRECT WRITE MASKLESS LITHOGRAPHY

(71) Applicant: ASML NETHERLANDS B.V., Veldhoven (NL)

(72) Inventors: Erwin Paul Smakman, Eindhoven (NL); Coen Adrianus Verschuren, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/314,740

(22) PCT Filed: Jun. 27, 2017

(86) PCT No.: PCT/EP2017/065794
§ 371 (c)(1),
(2) Date: Jan. 2, 2019

(87) PCT Pub. No.: WO2018/015113
PCT Pub. Date: Jan. 25, 2018

(65) Prior Publication Data
US 2019/0227442 A1    Jul. 25, 2019

(30) Foreign Application Priority Data
Jul. 19, 2016 (EP) .................... 16180163

(51) Int. Cl.
*G03F 7/20* (2006.01)
*G03F 9/00* (2006.01)

(52) U.S. Cl.
CPC ...... *G03F 7/70625* (2013.01); *G03F 7/70383* (2013.01); *G03F 7/70391* (2013.01); *G03F 7/70508* (2013.01); *G03F 9/7026* (2013.01)

(58) Field of Classification Search
CPC ............ G03F 7/70391; G03F 7/70625; G03F 7/70383; G03F 7/70275
(Continued)

(56) References Cited

U.S. PATENT DOCUMENTS

| 5,229,872 A | 7/1993 | Mumola |
| 5,296,981 A | 3/1994 | Ogawa |

(Continued)

FOREIGN PATENT DOCUMENTS

| EP | 1653280 | 5/2006 |
| EP | 1739494 | 1/2007 |

(Continued)

OTHER PUBLICATIONS

International Search Report and Written Opinion issued in PCT Patent Application No. PCT/EP2017/065794, dated Oct. 2, 2017.

(Continued)

*Primary Examiner* — Hung Nguyen
(74) *Attorney, Agent, or Firm* — Pillsbury Winthrop Shaw Pittman LLP

(57) ABSTRACT

An exposure apparatus including: a substrate holder constructed to support a substrate; a patterning device configured to provide radiation modulated according to a desired pattern, the patterning device including an array of radiation source modules configured to project the modulated radiation onto a respective array of exposure regions on the substrate; and a distributed processing system configured to process projection related data to enable the projection of the desired pattern onto the substrate, the distributed processing system including at least one central processing unit and a plurality of module processing units each associated with a respective radiation source module.

20 Claims, 22 Drawing Sheets

(58) Field of Classification Search
USPC .................................. 355/53, 67, 72–76
See application file for complete search history.

(56) References Cited

U.S. PATENT DOCUMENTS

| | | | |
|---|---|---|---|
| 5,523,193 A | 6/1996 | Nelson | |
| 7,965,373 B2* | 6/2011 | Hoeks | G03F 7/70508 355/53 |
| 2005/0219496 A1 | 10/2005 | Oshida et al. | |
| 2005/0282087 A1 | 12/2005 | Opower et al. | |
| 2007/0009146 A1 | 1/2007 | Hendricus Hoeks et al. | |
| 2008/0311314 A1 | 12/2008 | Lin | |
| 2011/0188016 A1 | 8/2011 | De Jager et al. | |
| 2016/0195822 A1* | 7/2016 | Van De Kerkhof | G03F 7/70275 355/72 |
| 2018/0373159 A1* | 12/2018 | Smakman | B22F 3/1055 |

FOREIGN PATENT DOCUMENTS

| | | |
|---|---|---|
| JP | 2005055524 | 3/2005 |
| JP | 2006047958 | 2/2006 |
| JP | 2006126460 | 5/2006 |
| JP | 2007011329 | 1/2007 |
| JP | 2007101687 | 4/2007 |
| TW | 200707134 | 2/2007 |
| WO | 98/33096 | 7/1998 |
| WO | 98/38597 | 9/1998 |
| WO | 2010032224 | 3/2010 |
| WO | 2015022125 | 2/2015 |

OTHER PUBLICATIONS

Japanese Office Action issued in the corresponding Japanese Patent Application No. 2018-568792, dated Nov. 14, 2019.

* cited by examiner

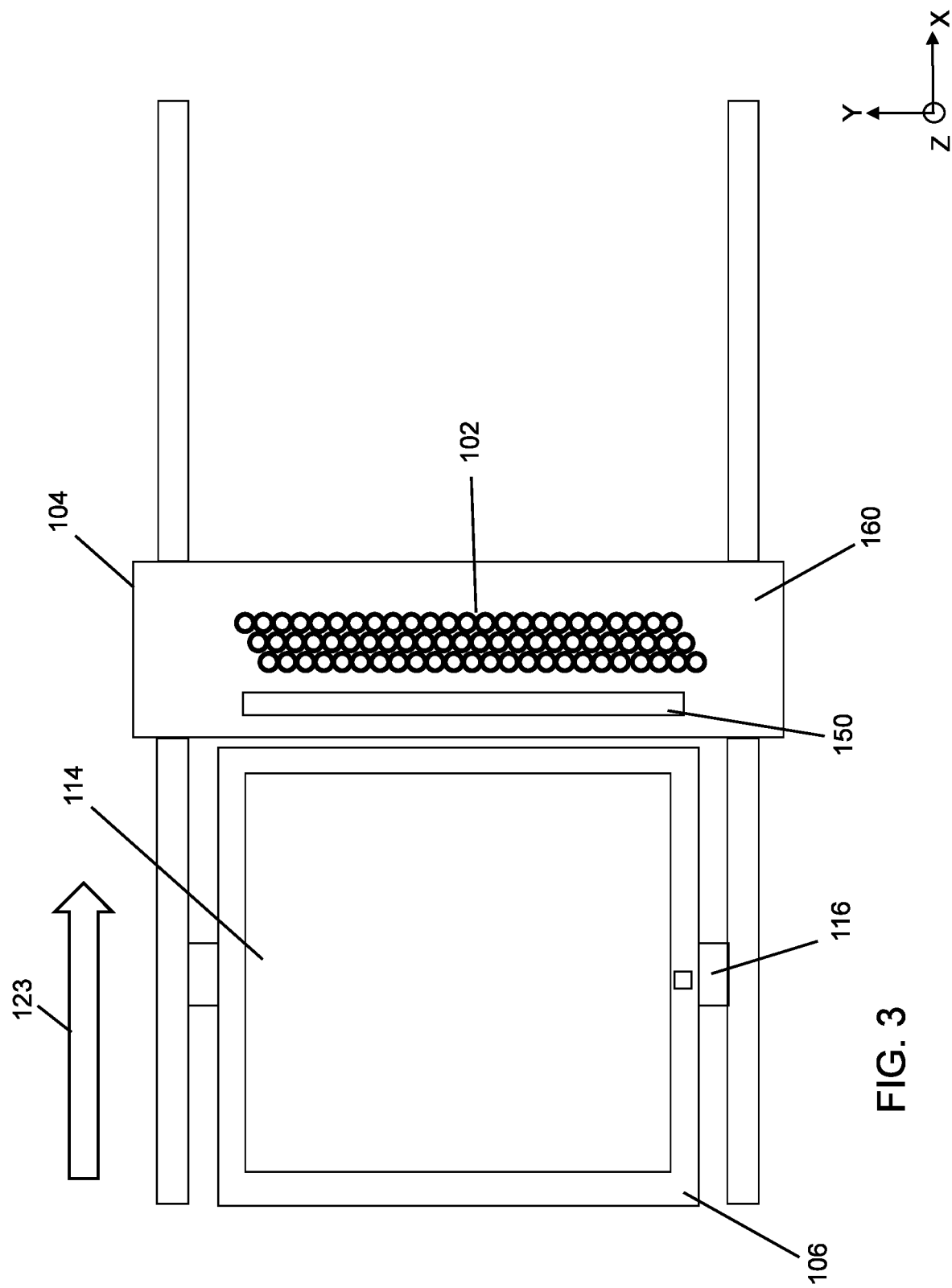

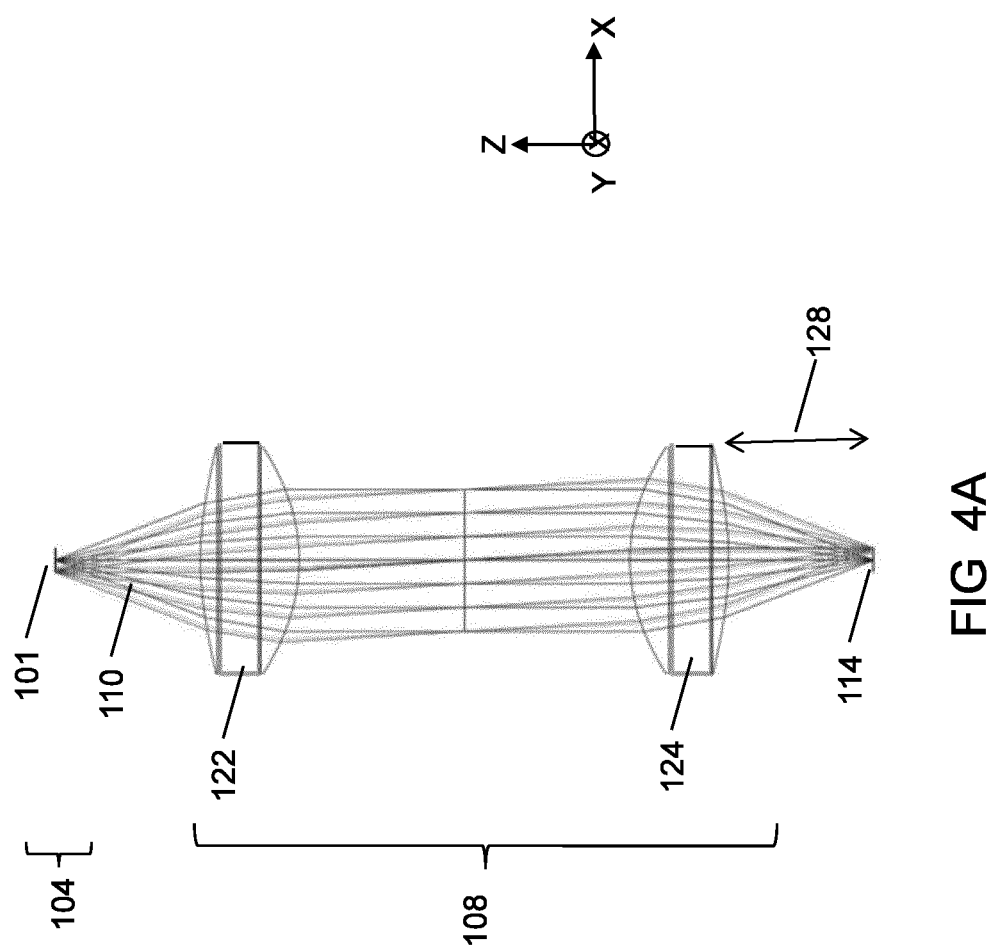

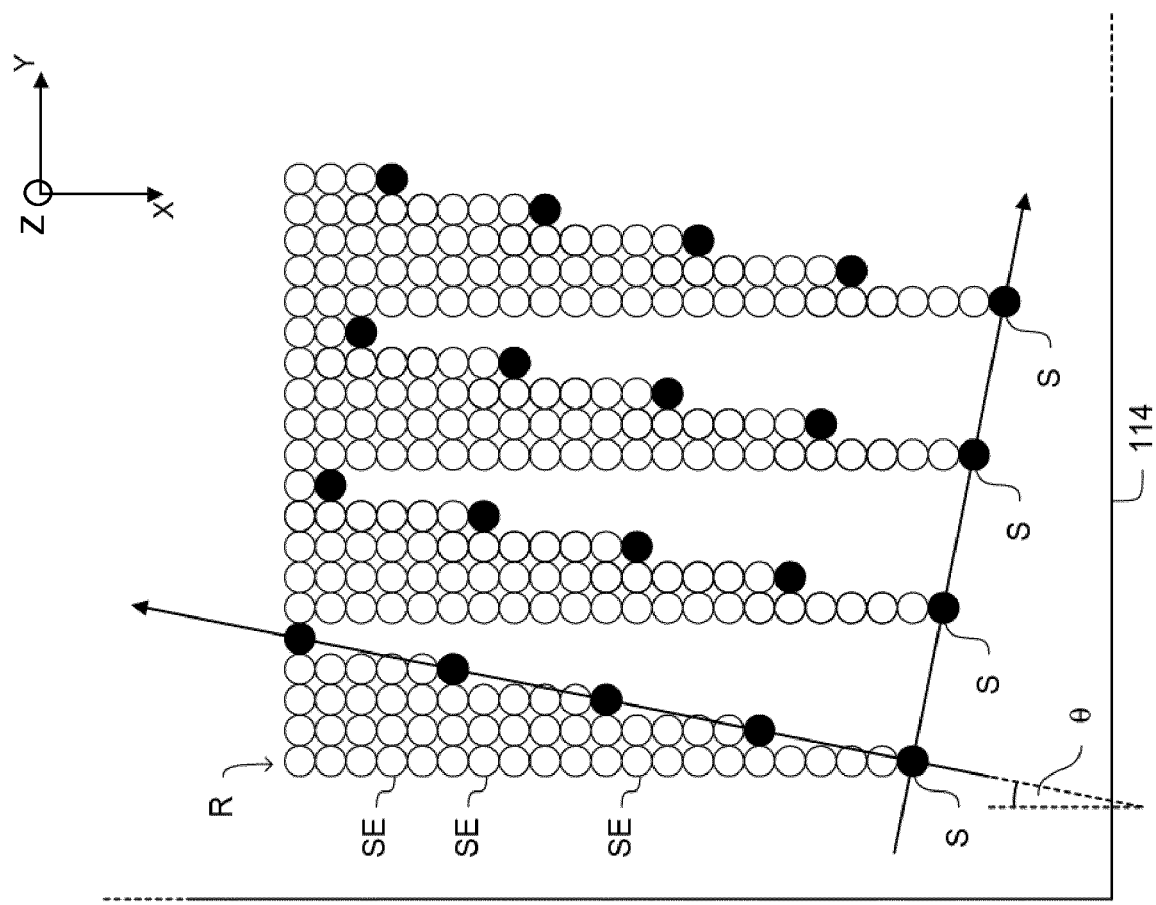

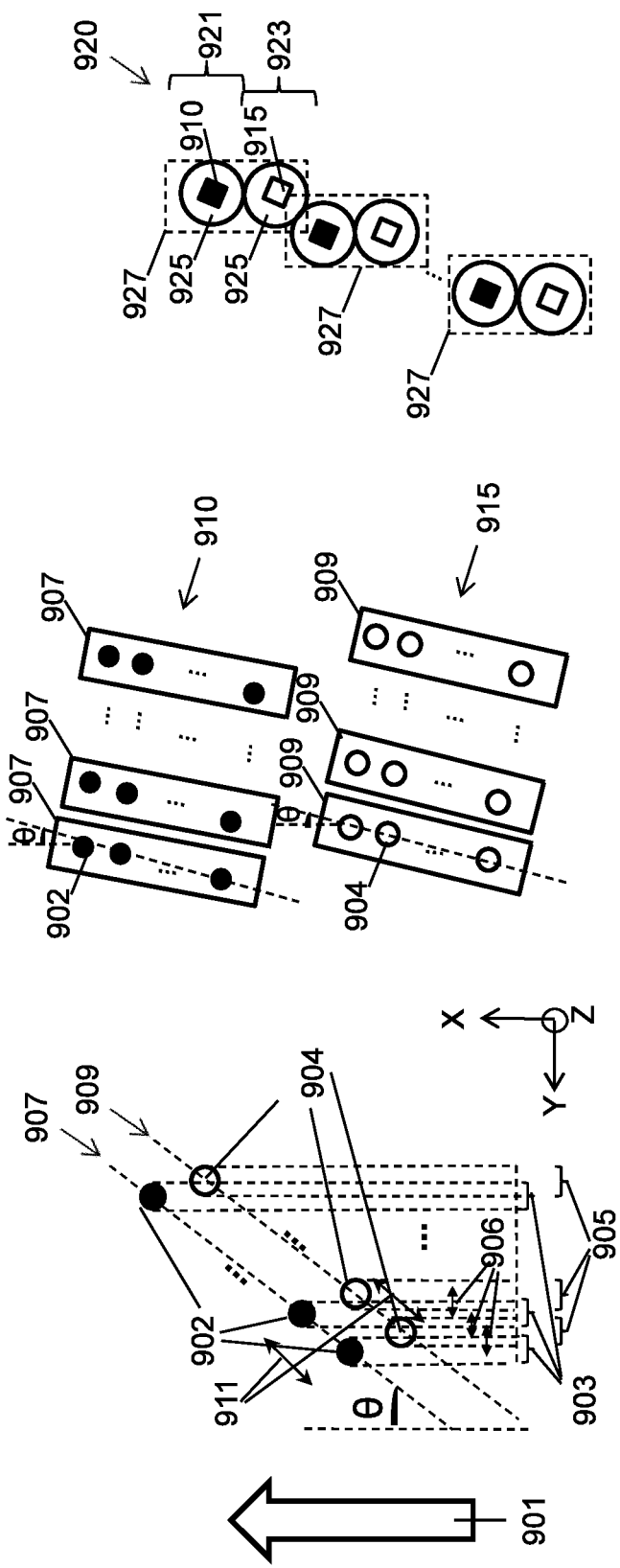

APPARATUS FOR DIRECT WRITE MASKLESS LITHOGRAPHY

CROSS-REFERENCE TO RELATED APPLICATIONS

This application is the U.S. national phase entry of PCT patent application no. PCT/EP2017/065794, which was filed on Jun. 27, 2017, which claims the benefit of priority of European patent application no. 16180163.4, which was filed on Jul. 19, 2016, and which is incorporated herein in its entirety by reference.

FIELD

The present disclosure relates to a lithographic apparatus for maskless lithography.

BACKGROUND

A lithographic apparatus is a machine that applies a desired pattern onto a substrate or part of a substrate. A lithographic apparatus may be used, for example, in the manufacture of integrated circuits (ICs), flat panel displays, and other devices or structures having fine features. In a conventional lithographic apparatus, a patterning device, which may be referred to as a mask or a reticle, may be used to generate a circuit pattern corresponding to an individual layer of the IC, flat panel display, or other device). This pattern may be transferred on (part of) the substrate (e.g. silicon wafer or a glass plate), e.g. via imaging onto a layer of radiation-sensitive material (resist) provided on the substrate.

Instead of a circuit pattern, the patterning device may be used to generate other patterns, for example a color filter pattern, or a matrix of dots. Instead of a conventional mask, the patterning device may comprise a patterning array that comprises an array of individually addressable elements that generate the circuit or other applicable pattern. An advantage of such a "maskless" system compared to a conventional mask-based system is that the pattern can be provided and/or changed more quickly and for less cost.

Thus, a maskless system includes a programmable patterning device (e.g., a spatial light modulator, a contrast device, etc.). The programmable patterning device is programmed (e.g., electronically or optically) to form the desired patterned beam using the array of individually addressable elements. Types of programmable patterning devices include micro-mirror arrays, liquid crystal display (LCD) arrays, grating light valve arrays, and the like.

SUMMARY

It is desirable, for example, to provide a flexible, low-cost lithography apparatus that includes a programmable patterning device.

In an embodiment, there is provided an exposure apparatus comprising:
- a substrate holder constructed to support a substrate;
- a patterning device configured to provide radiation modulated according to a desired pattern, the patterning device comprising an array of a plurality of radiation source modules configured to project the modulated radiation onto a respective array of a plurality of exposure regions on the substrate;
- a distributed processing system configured to process projection related data to enable the projection of the desired pattern onto the substrate, the distributed processing system comprising at least one central processing unit and a plurality of module processing units associated with respective plurality of radiation source modules.

BRIEF DESCRIPTION OF THE DRAWINGS

The accompanying drawings, which are incorporated herein and form a part of the specification, illustrate embodiments of an invention and, together with the description, further serve to explain the principles of embodiments of the invention and to enable a person skilled in the pertinent art to make and use the embodiments.

FIG. 3 depicts a schematic top view of a part of a lithographic apparatus according to an embodiment.

FIG. 4A and FIG. 4B depict a schematic side view of a part of a lithographic apparatus according to an embodiment.

FIG. 6 depicts an embodiment of a scheme of transferring a pattern to a substrate.

FIGS. 9A, 9B, 9C, 9D and 9E are schematic diagrams of a manufacturing method according to an embodiment.

One or more embodiments will now be described with reference to the accompanying drawings. In the drawings, like reference numbers may indicate identical or functionally similar elements.

DETAILED DESCRIPTION

One or more embodiments of a maskless lithographic apparatus, a maskless lithographic method, a programmable patterning device and other apparatus, articles of manufacture and methods are described herein. In an embodiment, a low cost and/or flexible maskless lithographic apparatus is provided. As it is maskless, no conventional mask is needed to expose, for example, ICs or flat panel displays.

In an embodiment, the lithographic apparatus is highly flexible. In an embodiment, the lithographic apparatus is scalable to substrates of different sizes, types and characteristics. Thus, the lithographic apparatus can enable multiple applications (e.g., IC, flat panel display, packaging, etc.) with a single lithographic apparatus or using multiple lithographic apparatus using a largely common lithographic apparatus platform.

In an embodiment, the lithographic apparatus is low cost. In an embodiment, only common off-the-shelf components are used (e.g., radiation emitting diodes, a simple movable substrate holder, and a lens array). In an embodiment, pixel-grid imaging is used to enable simple projection optics. In an embodiment, a substrate holder having a single scan direction is used to reduce cost and/or reduce complexity.

Figure 1:
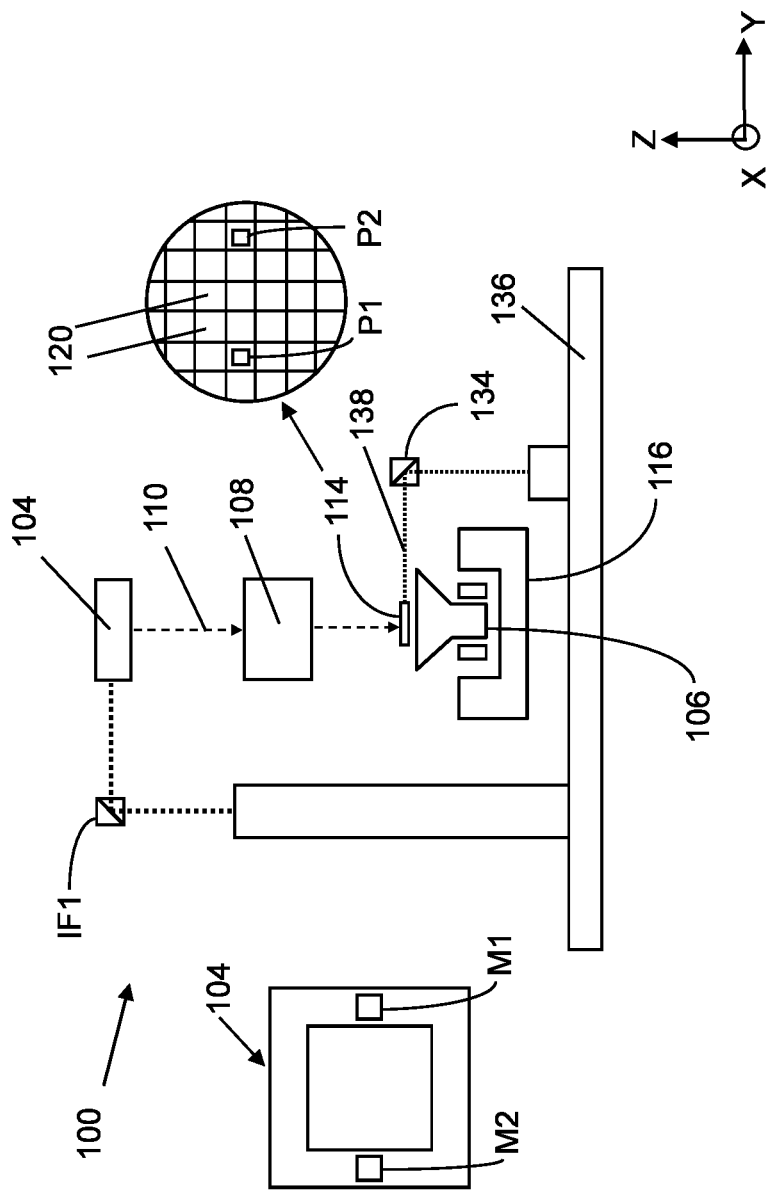
FIG. 1 depicts a schematic side view of a part of a lithographic apparatus according to an embodiment.

FIG. 1 schematically depicts a part of a lithographic projection apparatus 100 according to an embodiment. Apparatus 100 includes a patterning device 104, an object holder 106 (e.g., an object table, for instance a substrate table), and a projection system 108.

In an embodiment, the patterning device 104 comprises a plurality of individually addressable elements 102 to modulate radiation to apply a pattern to beam 110. In an embodiment, the position of the plurality of individually addressable elements 102 can be fixed relative to projection system 108. However, in an alternative arrangement, a plurality of individually addressable elements 102 may be connected to a positioning device (not shown) to accurately position one or more of them in accordance with certain parameters (e.g., with respect to projection system 108).

In an embodiment, the patterning device 104 is a self-emissive contrast device. Such a patterning device 104 obviates the need for a radiation system, which can reduce, for example, cost and size of the lithographic apparatus. For example, the individually addressable elements 102 are radiation emitting diodes, such as light-emitting diodes (LEDs), organic LEDs (OLEDs), polymer LEDs (PLEDs), laser diodes (e.g., solid state laser diodes), vertical external cavity surface emitting lasers (VECSELs), vertical cavity surface emitting lasers (VCSELs), or any combination thereof. In an embodiment, the individually addressable elements 102 are all LEDs. In an embodiment, the individually addressable elements 102 emit radiation having a wavelength in the range of about 380-440 nm, e.g., about 400 or 405 nm. In an embodiment, each of the individually addressable elements 102 can provide an output power selected from the range of 1-100 microwatts ($\mu W$). In an embodiment, each of the individually addressable elements 102 can provide an output current of about 3 microamperes ($\mu A$). In an embodiment, each of the individually addressable elements 102 has an emission cross-sectional width of about 2 micrometers ($\mu m$) or less, e.g., about 1 micrometer or less (for example, assuming 1:1 optics; if using de-magnifying optics, e.g. 2:1 or 4:1, larger emission cross-sectional widths can be used, such as about 8 $\mu m$ or less).

In an embodiment, the self-emissive contrast device comprises more individually addressable elements 102 than needed to allow a "redundant" individually addressable element 102 to be used if another individually addressable element 102 fails to operate or doesn't operate properly. Further, more individually addressable elements 102 than might be needed could be used to have elements 102 work together to deliver a certain power or dose in case individual elements 102 can't provide sufficient optical output alone or to have elements 102 "share the load" by reducing the usage of elements 102 from their maximum or design specification.

The lithographic apparatus 100 comprises an object holder 106. In this embodiment, the object holder comprises an object table 106 to hold a substrate 114 (e.g., a resist-coated silicon wafer or glass substrate). The object table 106 may be movable in up to 6 degrees of freedom (e.g., in at X and/or Y directions) and be connected to a positioning device 116 to accurately position substrate 114 in accordance with certain parameters. For example, a positioning device 116 may accurately position substrate 114 with respect to projection system 108 and/or the patterning device 104. In an embodiment, movement of object table 106 may be realized with the positioning device 116 comprising a long-stroke module (coarse positioning) and optionally a short-stroke module (fine positioning), which are not explicitly depicted in FIG. 1. A similar system may be used to position the individually addressable elements 102, such that, for example, the individually addressable elements 102 can be moved in up to 6 degrees of freedom (e.g., in at X and/or Y directions), e.g., scan in a direction substantially parallel with a scanning direction of the object table 106 and optionally step in an orthogonal direction to the scanning direction. Beam 110 may alternatively/additionally be moveable, while the object table 106 and/or the individually addressable elements 102 may have a fixed position to provide the required relative movement. Such an arrangement may assist in limiting the size of the apparatus.

In an embodiment, which may e.g. be applicable in the manufacture of flat panel displays, the object table 106 may be stationary and positioning device 116 is configured to move substrate 114 relative to (e.g., over) object table 106. For example, the object table 106 may be provided with a system to scan the substrate 114 across it at a substantially constant velocity. Where this is done, object table 106 may be provided with a multitude of openings on a flat uppermost surface, gas being fed through the openings to provide a gas cushion which is capable of supporting substrate 114. This is conventionally referred to as a gas bearing arrangement. Substrate 114 is moved over object table 106 using one or more actuators (not shown), which are capable of accurately positioning substrate 114 with respect to the path of beam 110. Alternatively, substrate 114 may be moved with respect to the object table 106 by selectively starting and stopping the passage of gas through the openings. In an embodiment, the object holder 106 can be a roll system onto which a substrate is rolled and positioning device 116 may be a motor to turn the roll system to provide the substrate onto an object table 106.

Projection system 108 (e.g., a quartz, glass, plastic (e.g., COC) and/or $CaF_2$ lens system or optical element, or a catadioptric system comprising lens elements made from such materials, or a mirror system, or an optical element (e.g., glass element) with an additional layer of polymer, or an optical element comprising a flat surface and a spherical surface, which can be modified to an aspherical surface using, e.g., a polymer layer, etc.) can be used to project the patterned beam modulated by the individually addressable elements 102 onto a target portion 120 (e.g., one or more dies) of substrate 114. Projection system 108 may image the pattern provided by the plurality of individually addressable elements 102 such that the pattern is coherently formed on the substrate 114. Alternatively, projection system 108 may project images of secondary sources for which the elements of the plurality of individually addressable elements 102 act as shutters.

In this respect, the projection system may comprise a focusing element, or a plurality of focusing elements (herein referred to generically as a lens array) e.g., a micro-lens array (known as an MLA) or a Fresnel lens array, e.g. to form the secondary sources and to image spots onto the substrate 114. In an embodiment, the lens array (e.g., MLA) comprises at least 10 focusing elements, e.g. at least 100 focusing elements, at least 1,000 focusing elements, at least 10,000 focusing elements, at least 100,000 focusing elements, or at least 1,000,000 focusing elements. In an embodiment, the number of individually addressable elements in the patterning device is equal to or greater than the number of focusing elements in the lens array. In an embodiment, the lens array comprises a plurality of focusing elements, at least one focusing element is optically associated with one or more of the individually addressable elements in the array of individually addressable elements, e.g. with only one of the individually addressable elements in the array of individually addressable elements, or with 2 or more of the individually addressable elements in the array of individually addressable elements, e.g., 3 or more, 5 or more, 10 or more, 20 or more, 25 or more, 35 or more, or 50 or more; in an embodiment, at least one focusing element of the plurality of optical elements is optically associated with less than 5,000 individually addressable elements, e.g. less than 2,500, less than 1,000, less than 500, or less than 100.

In an embodiment, the lens array comprises two or more focusing elements (e.g. more than 1,000, the majority, or about all) that are each optically associated with a plurality of individually addressable elements in a two-dimensional array.

In an embodiment, the patterning device 104 is movable at least in the direction to and away from the substrate, e.g. with the use of one or more actuators. Being able to move the patterning device to and away from the substrate allows, e.g., for focus adjustment without moving the substrate or the lens array (e.g. for local focus adjustments on non-flat substrates).

In an embodiment, the lens array comprises plastic focusing elements (which may be easy to make, e.g. injection molding, and/or affordable), where, for example, the wavelength of the radiation is greater than or equal to about 400 nm (e.g. 405 nm). In an embodiment, the wavelength of the radiation is selected from the range of about 350 nm-500 nm, e.g., the range of about 375-425 nm. In an embodiment, the lens array comprises quartz or glass focusing elements.

In an embodiment, each or a plurality of the focusing elements may be an asymmetrical lens (e.g., having one or more asymmetric surfaces). The asymmetry may be the same for each of the plurality of focusing elements or may be different for one or more focusing elements of a plurality of focusing elements than for one or more different focusing elements of a plurality of focusing elements. An asymmetrical lens may facilitate converting an oval radiation output into a circular projected spot, or vice versa.

In an embodiment, the focusing element has a high numerical aperture (NA) that is arranged to project radiation onto the substrate out of the focal point to obtain a low NA for the system. A higher NA lens may be more economic, prevalent and/or better quality than an available low NA lens. In an embodiment, low NA is less than or equal to 0.3, in an embodiment 0.18, 0.15 or less. Accordingly, a higher NA lens has a NA greater than the design NA for the system, for example, greater than 0.3, greater than 0.18, or greater than 0.15.

While, in an embodiment, the projection system 108 is separate from the patterning device 104, it need not be. The projection system 108 may be integral with the patterning device 108. For example, a lens array block or plate may be attached to (integral with) a patterning device 104. In an embodiment, the lens array may be in the form of individual spatially separated lenslets, each lenslet attached to (integral with) one or more individually addressable elements of the patterning device 104 as discussed in more detail below.

Optionally, the lithographic apparatus may comprise a radiation system to supply radiation (e.g., ultraviolet (UV) radiation) to the plurality of individually addressable elements 102. If the patterning device is a radiation source itself, e.g. a laser diode array or a LED array, the lithographic apparatus may be designed without a radiation system, i.e. without a radiation source other than the patterning device itself, or at least a simplified radiation system.

The radiation system includes an illumination system (illuminator) configured to receive radiation from a radiation source. The illumination system includes one or more of the following elements: a radiation delivery system (e.g., suitable directing mirrors), a radiation conditioning device (e.g., a beam expander), an adjusting device to set the angular intensity distribution of the radiation (generally, at least the outer and/or inner radial extent (commonly referred to as σ-outer and σ-inner, respectively) of the intensity distribution in a pupil plane of the illuminator can be adjusted), an integrator, and/or a condenser. The illumination system may be used to condition the radiation that will be provided to the individually addressable elements 102 to have a desired uniformity and intensity distribution in its cross-section. The illumination system may be arranged to divide radiation into a plurality of sub-beams that may, for example, each be associated with one or more of the plurality of the individually addressable elements. A two-dimensional diffraction grating may, for example, be used to divide the radiation into sub-beams. In the present description, the terms "beam of radiation" and "radiation beam" encompass, but are not limited to, the situation in which the beam is comprised of a plurality of such sub-beams of radiation.

The radiation system may also include a radiation source (e.g., an excimer laser) to produce the radiation for supply to or by the plurality of individually addressable elements 102. The radiation source and the lithographic apparatus 100 may be separate entities, for example when the radiation source is an excimer laser. In such cases, the radiation source is not considered to form part of the lithographic apparatus 100 and the radiation is passed from the source to the illuminator. In other cases the radiation source may be an integral part of the lithographic apparatus 100, for example when the source is a mercury lamp.

In an embodiment, the radiation source, which in an embodiment may be the plurality of individually addressable elements 102, can provide radiation having a wavelength of at least 5 nm, e.g. at least 10 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. In an embodiment, the radiation has a wavelength of at most 450 nm, e.g. at most 425 nm, at most 375 nm, at most 360 nm, at most 325 nm, at most 275 nm, at most 250 nm, at most 225 nm, at most 200 nm, or at most 175 nm. In an embodiment, the radiation has a wavelength including 436 nm, 405 nm, 365 nm, 355 nm, 248 nm, 193 nm, 157 nm, 126 nm, and/or 13.5 nm. In an embodiment, the radiation includes a wavelength of around 365 nm or around 355 nm. In an embodiment, the radiation includes a broad band of wavelengths, for example encompassing 365 nm, 405 nm and 436 nm. A 355 nm laser source could be used. In an embodiment, the radiation has a wavelength of about 405 nm.

In operation of the lithographic apparatus 100, where the patterning device 104 is not radiation emissive, radiation is incident on the patterning device 104 (e.g., a plurality of individually addressable elements) from a radiation system (illumination system and/or radiation source) and is modulated by the patterning device 104.

Alternatively, in operation of the lithographic apparatus 100, where the patterning device is self-emissive and comprises a plurality of individually addressable elements 102 (e.g., LEDs), the plurality of the individually addressable elements are modulated by a control circuit (not shown) so that each of the individually addressable elements may be turned "ON" or "OFF" according to a desired pattern, where "ON" is a radiation emission state with higher intensity or dose than when "OFF". In an embodiment, "ON" or "OFF" can include varying gray levels.

The patterned beam 110, after having been created by the plurality of individually addressable elements 102, passes through projection system 108, which focuses beam 110 onto a target portion 120 of the substrate 114.

With the aid of positioning device 116 (and optionally a position sensor 134 on a base 136 (e.g., an interferometric measuring device that receives an interferometric beam 138, a linear encoder or a capacitive sensor)), substrate 114 can be moved accurately, e.g., so as to position different target portions 120 in the path of beam 110. Where used, the positioning device for the plurality of individually addressable elements 102 can be used to accurately correct the position of the plurality of individually addressable elements 102 with respect to the path of beam 110, e.g., during a scan.

Although the lithography apparatus 100 according to an embodiment is described herein as being configured to expose a resist on a substrate, the apparatus 100 may be used to project a patterned beam 110 for use in resistless lithography.

The lithographic apparatus 100 may be of a reflective type (e.g. employing reflective individually addressable elements). Alternatively, the apparatus may be of a transmissive type (e.g. employing transmissive individually addressable elements).

The depicted apparatus 100 can be used in one or more modes, such as:

1. In step mode, the individually addressable elements 102 and the substrate 114 are kept essentially stationary, while an entire patterned radiation beam 110 is projected onto a target portion 120 at one go (i.e. a single static exposure). The substrate 114 is then shifted in the X- and/or Y-direction so that a different target portion 120 can be exposed to the patterned radiation beam 110. In step mode, the maximum size of the exposure field limits the size of the target portion 120 imaged in a single static exposure.

2. In scan mode, the individually addressable elements 102 and the substrate 114 are scanned synchronously while a pattern radiation beam 110 is projected onto a target portion 120 (i.e. a single dynamic exposure). The velocity and direction of the substrate relative to the individually addressable elements may be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the length (in the scanning direction) of the target portion.

3. In pulse mode, the individually addressable elements 102 are kept essentially stationary and the entire pattern is projected onto a target portion 120 of the substrate 114 using pulsing (e.g., provided by a pulsed radiation source or by pulsing the individually addressable elements). The substrate 114 is moved with an essentially constant speed such that the patterned beam 110 is caused to scan a line across the substrate 114. The pattern provided by the individually addressable elements is updated as required between pulses and the pulses are timed such that successive target portions 120 are exposed at the required locations on the substrate 114. Consequently, patterned beam 110 can scan across the substrate 114 to expose the complete pattern for a strip of the substrate 114. The process is repeated until the complete substrate 114 has been exposed line by line.

4. In continuous scan mode, essentially the same as pulse mode except that the substrate 114 is scanned relative to the modulated beam of radiation B at a substantially constant speed and the pattern on the array of individually addressable elements is updated as the patterned beam 110 scans across the substrate 114 and exposes it. A substantially constant radiation source or a pulsed radiation source, synchronized to the updating of the pattern on the array of individually addressable elements may be used.

Combinations and/or variations on the above described modes of use or entirely different modes of use may also be employed.

Figure 2:
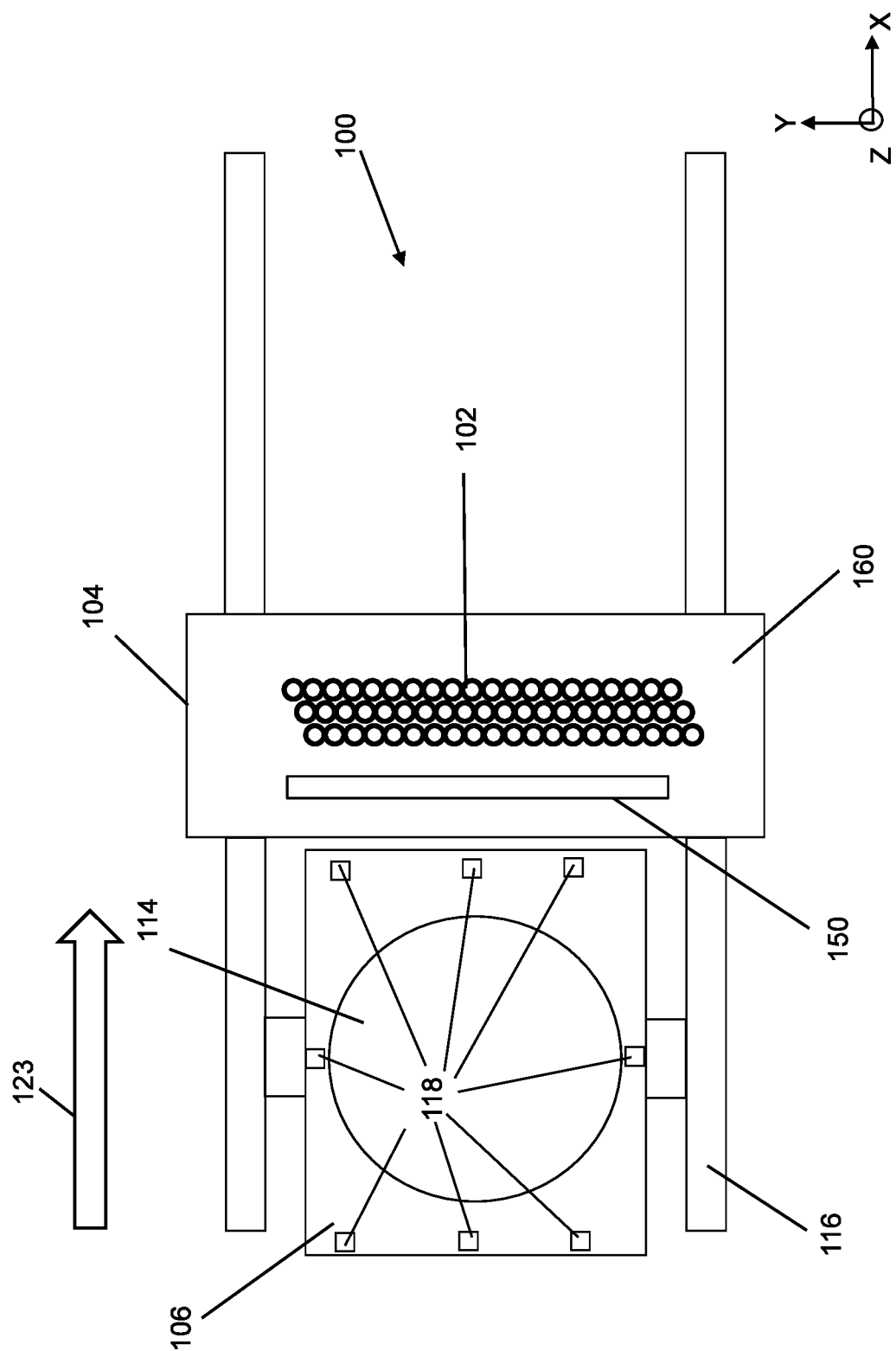
FIG. 2 depicts a schematic top view of a part of a lithographic apparatus according to an embodiment.

FIG. 2 depicts a schematic top view of a part of a lithographic apparatus according to an embodiment for use with substrates (e.g., 300 mm wafers). As shown in FIG. 2, the lithographic apparatus 100 comprises a substrate table 106 to hold a substrate 114. Associated with the substrate table 106 is a positioning device 116 to move the substrate table 106 in at least the X-direction as shown in arrow 123. Optionally, the positioning device 116 may move the substrate table 106 in the Y-direction and/or Z-direction. The positioning device 116 may also rotate the substrate table 106 about the X-, Y- and/or Z-directions. Accordingly, the positioning device 116 may provide motion in up to 6 degrees of freedom. In an embodiment, the substrate table 106 provides motion only in the X-direction, an advantage of which is lower costs and less complexity.

The lithographic apparatus 100 further comprises a plurality of individually addressable elements 102 arranged on a frame 160. Frame 160 may be mechanically isolated from the substrate table 106 and its positioning device 116. Mechanical isolation may be provided, for example, by connecting the frame 160 to ground or a firm base separately from the frame for the substrate table 106 and/or its positioning device 116. In addition or alternatively, dampers may be provided between frame 160 and the structure to which it is connected, whether that structure is ground, a firm base or a frame supporting the substrate table 106 and/or its positioning device 116.

In this embodiment, each of the individually addressable elements 102 is a radiation emitting diode, e.g., an LED. For the sake of simplicity, three rows of individually addressable elements 102 extending along the Y-direction (and spaced in the X-direction) are shown in FIG. 2, each row having, in this embodiment, sufficient columns to extend across the width of the substrate; a greater number of rows of individually addressable elements 102 may be arranged on the frame 160. In an embodiment, each of the individually addressable elements 102 is configured to provide a plurality of radiation beams. In an embodiment, each of the individually addressable elements 102 depicted in FIG. 2 comprises a plurality of individually addressable elements 102 (thus each circle labeled 102 in FIG. 2 represents a plurality of individually addressable elements 102). In an embodiment, one or more rows of individually addressable elements 102 are staggered in the Y-direction from an adjacent row of individually addressable elements 102 as shown in FIG. 2. In an embodiment, the individually addressable elements 102 are substantially stationary, i.e., they do not move significantly or at all during projection.

The lithographic apparatus 100, particularly the individually addressable elements 102, may be arranged to provide pixel-grid imaging as described in more detail herein. However, in an embodiment, the lithographic apparatus 100 need not provide pixel-grid imaging. Rather, the lithographic apparatus 100 may project the radiation of the individually addressable elements 102 onto the substrate in a manner that does not form individual pixels for projection onto the substrate but rather a substantially continuous image for projection onto the substrate.

Element 150 of lithographic apparatus 100 as depicted in FIG. 2 may comprise a measurement system. Such a measurement system may e.g. comprise an alignment sensor, a level sensor, or both. For example, in an embodiment, the lithographic apparatus 100 comprises an alignment sensor 150. The alignment sensor is used to determine alignment between the substrate 114 and, for example, the individually addressable elements 102 before and/or during exposure of the substrate 114. The results of the alignment sensor 150 can be used by a controller of the lithographic apparatus 100 to control, for example, the positioning device 116 to position the substrate table 106 to improve alignment. In addition or alternatively, the controller may control, for example, responsive to a signal from sensor 150, a positioning device associated with the individually addressable elements 102 to position one or more of the individually addressable elements 102 (including, for example, positioning one or more of the elements 102 relative to one or more other elements 102) to improve alignment and/or, responsive to a signal from sensor 150, a deflector associated with the individually addressable elements 102 to position one or more of the beams (including, for example, positioning one or more of the beams relative to one or more other beams) to improve alignment. In an embodiment, the alignment sensor 150 may include pattern recognition functionality/software to perform alignment.

In an embodiment, the lithographic apparatus 100, in addition or alternatively, comprises a level sensor 150. The level sensor 150 is used to determine whether the substrate 106 is level with respect to the projection of the pattern from the individually addressable elements 102. The level sensor 150 can determine level before and/or during exposure of the substrate 114. The results of the level sensor 150 can be used by a controller of the lithographic apparatus 100 to control, for example, the positioning device 116 to position the substrate table 106 to improve leveling. In addition or alternatively, the controller may control, for example, responsive to a signal from sensor 150, a positioning device associated with a projection system 108 (e.g., a lens array) to position an element of the projection system 108 (e.g., a lens, or a smaller lens array, of a lens array, including, for example, positioning a lens, or a smaller lens array, of a lens array relative to another lens, or another smaller lens array, of the lens array) to improve leveling. In an embodiment, the level sensor may operate by projecting an ultrasonic beam at the substrate 106 and/or operate by projecting an electromagnetic beam of radiation at the substrate 106.

In an embodiment, results from the alignment sensor and/or the level sensor may be used to alter the pattern provided by the individually addressable elements 102. The pattern may be altered to correct, for example, distortion, which may arise from, e.g., optics (if any) between the individually addressable elements 102 and the substrate 114, irregularities in the positioning of the substrate 114, unevenness of the substrate 114, etc. Thus, results from the alignment sensor and/or the level sensor can be used to alter the projected pattern to effect a non-linear distortion correction. Non-linear distortion correction may be useful, for example, for flexible displays, which may not have consistent linear or non-linear distortion.

In operation of the lithographic apparatus 100, a substrate 114 is loaded onto the substrate table 106 using, for example, a robot handler (not shown). The substrate 114 is then displaced in the X-direction as shown in the arrow 123 under the frame 160 and the individually addressable elements 102. The substrate 114 is measured by the level sensor and/or the alignment sensor 150 and then is exposed to a pattern using individually addressable elements 102. For example, the substrate 114 is scanned through the focal plane (image plane) of the projection system 108, while the substrate is moving and the individually addressable elements 102 are switched at least partially or fully "ON" or "OFF" in the patterning device 104. Features corresponding to the pattern of the patterning device 104 are formed on the substrate 114. The individually addressable elements 102 may be operated, for example, to provide pixel-grid imaging as discussed herein.

In an embodiment, the substrate 114 may be scanned completely in the positive X-direction and then scanned completely in the negative X-direction. In such an embodiment, an additional level sensor and/or alignment sensor 150 on the opposite side of the individually addressable elements 102 may be required for the negative X-direction scan.

FIG. 3 depicts a schematic top view of a part of a lithographic apparatus according to an embodiment for exposing substrates in the manufacture of, for instance, flat panel displays (e.g., LCDs, OLED displays, etc.). Like the lithographic apparatus 100 shown in FIG. 2, the lithographic apparatus 100 comprises a substrate table 106 to hold a flat panel display substrate 114, a positioning device 116 to move the substrate table 106 in up to 6 degrees of freedom, an alignment sensor 150 to determine alignment between the individually addressable elements 102 and the substrate 114, and a level sensor 150 to determine whether the substrate 114 is level with respect to the projection of the pattern from the individually addressable elements 102.

The lithographic apparatus 100 further comprises a plurality of individually addressable elements 102 arranged on a frame 160. In this embodiment, each of the individually addressable elements 102 is a radiation emitting diode, e.g., an LED. For the sake of simplicity, three rows of individually addressable elements 102 extending along the Y-direction are shown in FIG. 3 and having sufficient columns to cover the width of the substrate; a greater number of rows of individually addressable elements 102 may be arranged on the frame 160. In an embodiment, each of the individually addressable elements 102 is configured to provide a plurality of radiation beams. In an embodiment, each of the individually addressable elements 102 depicted in FIG. 3 comprises a plurality of individually addressable elements 102 (thus each circle labeled 102 in FIG. 3 represents a plurality of individually addressable elements 102). Further, in an embodiment, a number of the rows of individually addressable elements 102 are staggered in the Y-direction from one or more adjacent rows of individually addressable elements 102 as shown in FIG. 3. The lithographic apparatus 100, particularly the individually addressable elements 102, may be arranged to provide pixel-grid imaging. In an embodiment, the individually addressable elements 102 are substantially stationary, i.e., they do not move significantly during projection.

In operation of the lithographic apparatus 100, a panel display substrate 114 is loaded onto the substrate table 106 using, for example, a robot handler (not shown). The substrate 114 is then displaced in the X-direction as shown in arrow 123 under the frame 160 and the individually addressable elements 102. The substrate 114 is measured by the level sensor and/or the alignment sensor 150 and then is exposed to a pattern using individually addressable elements 102. One or more lenses may be used to project the patterning beams from the individually addressable elements 102 to the substrate. The individually addressable elements 102 may be operated, for example, to provide pixel-grid imaging as discussed herein.

As discussed above, a plurality of individually addressable elements 102 are optically associated with a lens of projection system 108. In an embodiment, the patterning beams from the plurality of individually addressable elements 102 substantially cover the field of view of the associated lens of projection system 108. In an embodiment, a plurality of individually addressable elements 102 collectively forms a two-dimensional emitter array, each array associated with a single lens of projection system 108. And so, in an embodiment, there are provided a plurality of emitter arrays, each array associated with a single lens of a lens array (extending in the X-Y plane) of projection system 108. Thus, in an embodiment, a single lens forms all of, or part of, the projection system 108 for an array of individually addressable elements 102.

FIG. 4A depicts a schematic side view of a part of a lithographic apparatus according to an embodiment. As shown in FIG. 4A, the lithographic apparatus 100 comprises a patterning device 104 and a projection system 108. The patterning device 104 comprises an emitter array 101. As discussed above, the emitter array 101 comprises a plurality of individually addressable elements 102 in a two-dimensional array. In an embodiment, each of the individually addressable elements 102 is a LED.

The projection system 108 comprises two lenses 122, 124 along an optical axis. The first lens 122, a field lens, is arranged to receive the modulated radiation beams 110 from the emitter array 101. The radiation beams 110 diverge toward the field lens 122. The field lens 112 then effectively collimates the radiation beams and directs them toward a second lens 124, an imaging lens. The lens 124 focuses the beams 110 onto the substrate 114. In an embodiment, the lens 124 can provide a NA of 0.15 or 0.18. In an embodiment, the lens 122 and/or the lens 124 may be moved in up to 6 degrees of freedom (e.g., in the X-Y-Z directions) using an actuator.

As shown in FIG. 4A, a free working distance 128 is provided between the substrate 114 and the lens 124. This distance allows the substrate 114 and/or the lens 124 to be moved to allow, for example, focus correction. In an embodiment, the free working distance is in the range of 1-3 mm, e.g., about 1.4 mm.

In an embodiment, the projection system 108 can be a 1:1 projection system in that the array spacing of the image spots on the substrate 114 is the same as the array spacing of the individually addressable elements 102 of the patterning device 104. To provide improved resolution, the image spots can be much smaller than the size of each individually addressable element 102 of the patterning device 104 by adjusting the field lens 122, the imaging lens 124, or both.

Figure 4B:
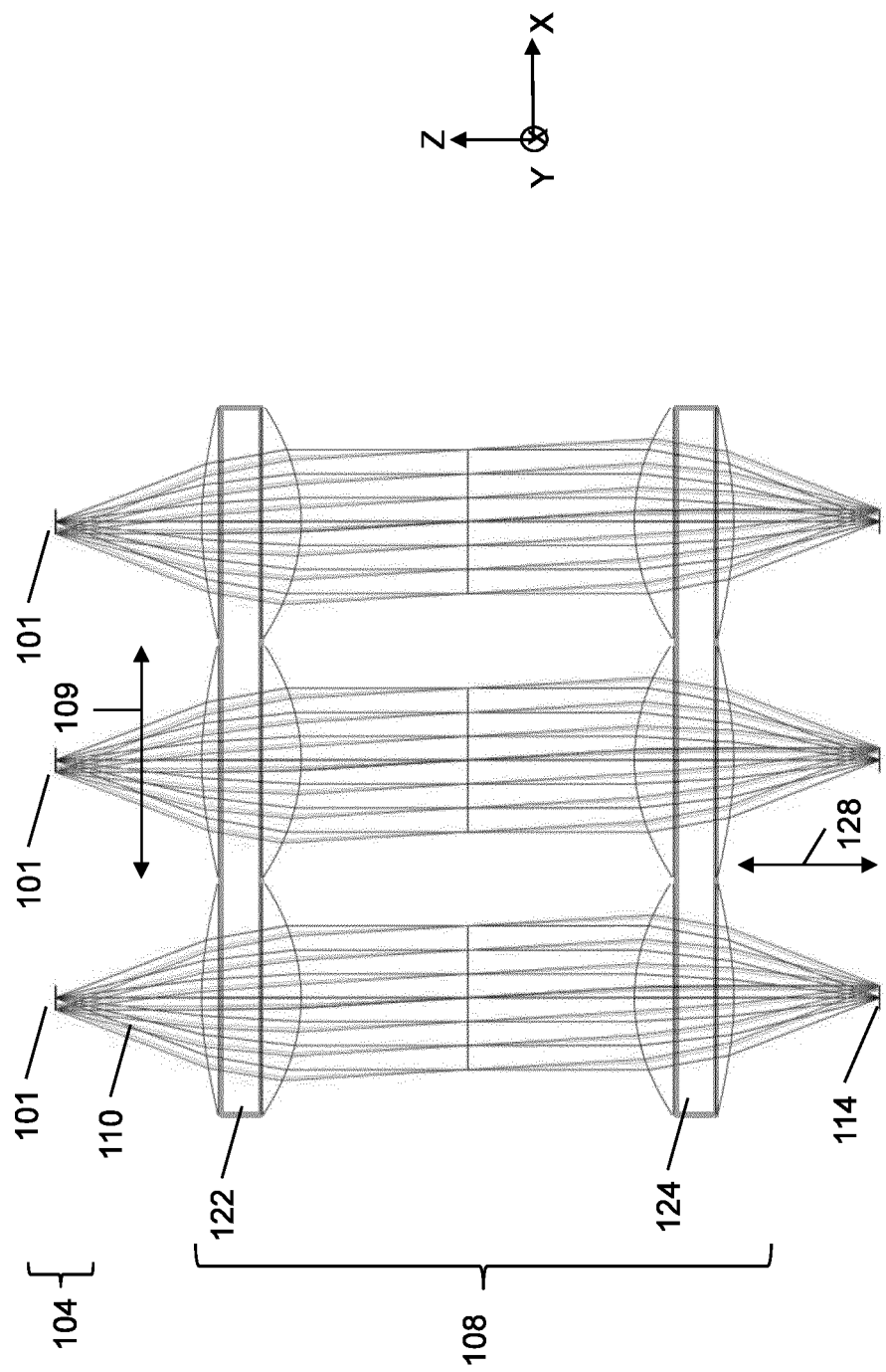

Referring to FIG. 4B, in an embodiment, the patterning device 104 comprises two or more emitter arrays 101. Accordingly, two or more projection systems 108 are used to project the patterning beams from such a patterning device 104 to the substrate 114. In an embodiment, there may be 100's, or 1000's of emitter arrays, each emitter array associated with a projection system 108, comprising lens 122 and/or lens 124. In an embodiment, the cross-sectional width (e.g., diameter) 109 of lens 122 and/or 124 is 1 millimeter (mm). FIG. 4B depicts an embodiment of a plurality of emitter arrays 101 employed in the patterning device 104 is depicted. Different sets of the modulated radiation beams 110, each set corresponding to an emitter array 101 of two or more emitter arrays 101 in the patterning device 104, pass through respective lenses 122 and 124 and are focused to the substrate 114. As a result, an array of radiation spots (each spot having a size of, for example, around 1 µm) is exposed onto the substrate 114. The individually addressable elements 102 of the patterning device 104 may be arranged at a pitch, which may result in the same pitch of imaging spots at substrate 114.

In an embodiment, each emitter array 101 and the associated lens 122 and/or lens 124 may be collectively considered as an individual optical engine component. The individual optical engine component may be manufactured as a unit for easy replication. In an embodiment, the individual optical engine component may be used to print brushes substantially covering the field of view of the lens 122, 124. Moreover, frame 160 may be configured to be expandable and configurable to easily adopt any number of such optical engine components. In this way, an improperly working optical engine component (e.g., if an individually addressable element of emitter array 101 is not working properly) may be easily replaced with a functioning optical engine component.

Figure 5:
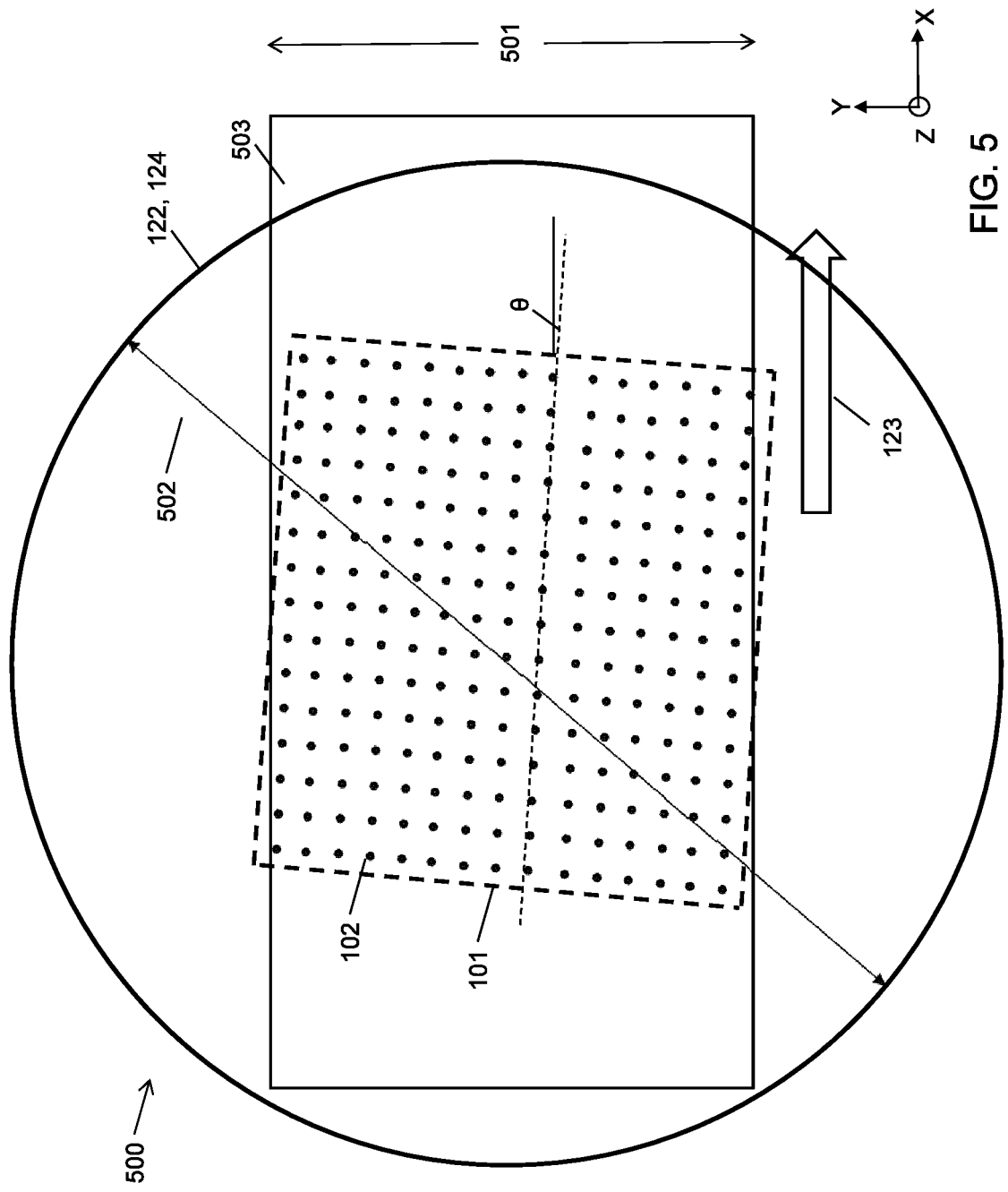
FIG. 5 depicts a schematic top view of a part of a lithographic apparatus according to an embodiment.

Referring to FIG. 5, a highly schematic top view of an individual optical engine component 500 is depicted. The individual optical engine component 500 comprises an emitter array 101 and lens 122 and/or 124. In an embodiment, the emitter array 101 comprises a plurality of individually addressable elements 102 arranged in a two-dimensional array, substantially covering a field of view area of the lens 122, 124. As shown in FIG. 5, the emitter array 101 comprises 225 individually addressable elements 102 arranged in a square 15×15 array in which each side of the array is, for example, about 70 µm long. Thus, the diagonal of the array is about 100 µm long, approximately equal to the width (e.g., diameter) of the field of view of the lens 122, 124. In an embodiment, the cross-sectional width (e.g., diameter) 502 of lens 122 and/or 124 is about 1 millimeter (mm). In an embodiment, the spot size of the beam of an individually addressable element 102 is about 1 micron. In an embodiment, each individually addressable element 102 delivers about 3 µW optical power or less onto the substrate (which is, for example, for a flat panel display application for a scanning speed of around 10 mm/s and resist sensitivity of around 20 mJ/cm$^2$). In an embodiment, the pitch, defined as the distance between centers of adjacent individually addressable elements 102, is, e.g., about 5 µm. In an embodiment, the array is imaged (1:1) onto the substrate 114 with doublets 122, 124. In an embodiment, the lenses 122, 124 are arranged at about 1 mm pitch.

Each individually addressable element 102 emits an electromagnetic radiation toward the substrate 114, thereby generating a radiation spot on the substrate 114. As shown in FIG. 5, the emitter array 101 is situated at an angle θ relative to the scanning direction 123 of relative movement between the substrate 114 and the individually addressable elements 102 (e.g., the direction 123 of movement of the substrate 114). This is so that, when there is relative movement between the substrate 114 and the individually addressable elements 102 in the scanning direction, each radiation spot effectively passes over a different area of the substrate (although there can be some overlap), thereby enabling production of a brush 503 of modulated radiation whose width is related to the field of view of the lens 122. In an embodiment, the width 501 of the brush 503 is 70 µm. In an embodiment, the angle θ is at most 20°, 10°, for instance at most 5°, at most 3°, at most 1°, at most 0.5°, at most 0.25°, at most 0.10°, at most 0.05°, or at most 0.01°. In an embodiment, the angle θ is at least 0.0001°, e.g. at least 0.001°. The angle of inclination θ is determined in accordance with the image spot size (which is a function of working distance between the substrate and the lens 122, 124), the pitch between adjacent radiation spots, and the field of view of the lens 122, 124.

FIG. 6 illustrates schematically a top view of how the pattern on the substrate 114 may be generated. The filled in circles represent the array of spots S projected onto the substrate 114 by individually addressable elements 102 in the emitter array 101. The substrate 114 is moved relative to the projection system 108 in the X-direction as a series of exposures are exposed on the substrate 114. The open circles represent spot exposures SE that have previously been exposed on the substrate 114. As shown, each spot projected onto the substrate 114 by individually addressable elements 102 in the emitter array 101 exposes a column R of spot exposures on the substrate 114. The complete pattern for the substrate 114 is generated by the sum of all the columns R of spot exposures SE exposed by each of the spots S. Such an arrangement is commonly referred to as "pixel grid imaging." It will be appreciated that FIG. 6 is a schematic drawing and that spots S and/or the spot exposures SE exposed by different spots S may overlap in practice.

Similar to that shown in FIG. 5, the array of radiation spots S is arranged at an angle θ relative to the scanning direction (in this example, the edges of the substrate 114 lie parallel to the X- and Y-directions). This is done so that, when there is relative movement between the substrate 114 and the individually addressable elements 102 in the scanning direction, each radiation spot will effectively pass over a different area of the substrate 114, thereby allowing for producing a brush in a single scan. As discussed above, the angle of inclination θ is determined in accordance with the image spot size, the pitch between adjacent radiation spots, and the field of view of the lens 122, 124.

Various embodiments may be employed to write patterns to cover the whole surface area of the substrate 114 by using one or more individual optical engine components 500. Firstly, in respect of the brush 503, in an embodiment, an optical engine component 500 is large enough to fully expose the width of the brush 503. If an optical engine component 500 is not large enough to fully expose the width of the brush 503 in a single scan, various embodiments can be used to fully cover the brush 503 width. In an embodiment, an optical engine component 500 is scanned multiple times while in between these scans a small motion is made in a direction orthogonal to the scan direction to "fill" in the gaps. In an embodiment, a plurality of optical engine components 500 are provided along the scan direction but that are situated at an offset in a direction orthogonal to the scan direction, thus the second, third, etc. optical engine component 500 fills the gaps left by a first optical engine component 500.

Then, it is desirable to expose the full substrate (e.g., wafer, flat panel display, etc.) using a plurality of brushes 503 (e.g., brushes 503 having a width of, e.g., 70 microns). Accordingly, a plurality of optical engine components 500 is provided. In an embodiment, the substrate is mostly fully covered with optical engine components 500 at a pitch of, e.g., 1 mm. Then, relative movement is provided between the optical engine components 500 and the substrate 114 to scan multiple times in a meandering fashion. In this embodiment, the relative motion between optical engine components 500 and the substrate can be limited to, e.g., about 1 mm in both orthogonal directions X and Y. So, if the relative movement between each of the optical engine components 500 and the substrate is repeated over 1 mm$^2$ in a meandering fashion (i.e., including an offset in the direction perpendicular to the scan direction for each scan) with brush strokes of about 70 microns width, effectively all areas on the substrate can be exposed. Redundancy (e.g., using another individually addressable element to expose an area of an individually addressable element 102 that fails or doesn't work properly) can be implemented by enlarging the scan range. For example, if the scan range is 2 mm rather than 1 mm, a plurality of optical engine components 500 can then contribute to the exposure of an area on the substrate associated primarily with one of the optical engine components 500.

In an embodiment, wherein the substrate is relatively large and it is not necessary or possible to cover the entire area of the substrate with optical engine components 500 (e.g., because the collective radiation power is not needed), optical engine components 500 can be provided so as to cover the width of the substrate in a direction orthogonal to the scan direction, e.g., as shown in FIGS. 2 and 3. In this manner, the substrate could be exposed in a single scanning pass of relative movement between the optical engine components 500 and the substrate. In an embodiment, there are sufficient columns of optical engine components 500 such that the full substrate width can be exposed in a single scan. So, e.g. if one optical engine component exposes a width of 70 microns at a pitch of 1 mm, 15 rows of optical engine components 500 (arranged along the scan direction and displaced from each other along the direction orthogonal to the scan direction such that the respective brushes of the optical engine components 500 overlap) should be sufficient for full exposure. Of course, a sufficient number of columns of optical engine components 500 would be provided along the Y-direction to cover the width of the substrate. More rows can be added in case more radiation power is needed (e.g., a same location on the substrate can be exposed multiple times—a first time by a first optical engine component and then again by another optical engine component—and/or to provide redundancy as discussed above).

In an embodiment, if less radiation power is required and the radiation can be modulated at a high frequency, the substrate can be scanned in one direction over its entire length and then a meander can be provided over, e.g., 1 mm in the orthogonal direction to the scan direction. Thus, the optical engine components 500 may not collectively extend across the width of the substrate in the Y-direction. In that case, the optical engine components 500 may collectively write a first portion of the substrate in a first scan, then an offset in the Y-direction is applied and then one or more further scans (e.g., in reverse direction, then forward direction, and so on, i.e., a meandering fashion) can be applied to expose the remaining portion of the substrate. Like previous embodiments, redundancy can be implemented by meandering over more than, e.g., 1 mm. For example, with a 4 mm meander, there is a plurality of optical engine components 500 contributing to the exposure of a single area on the substrate designated primarily for a particular optical engine component 500.

In an embodiment, a brush produced on the substrate 114 in a scan is slightly overlapped with a brush produced in a previous scan.

Figure 7C:
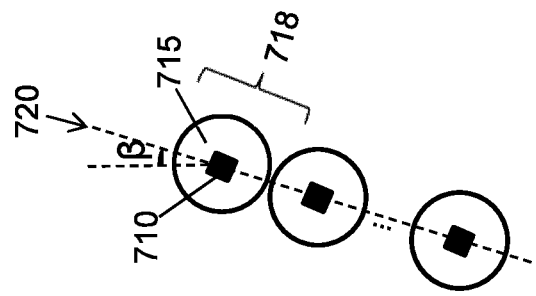
FIGS. 7A, 7B, 7C, 7D and 7E are schematic diagrams of a manufacturing method according to an embodiment.
Figure 7B:
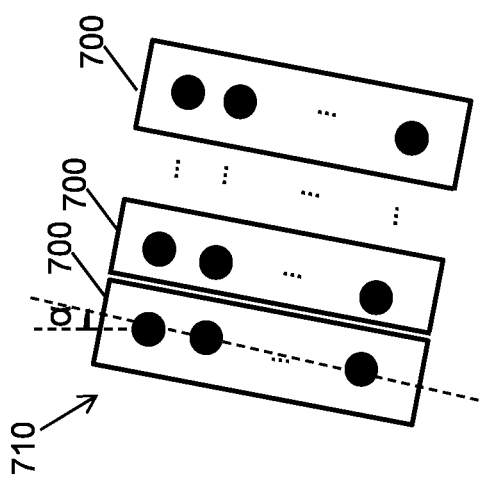
Figure 7A:
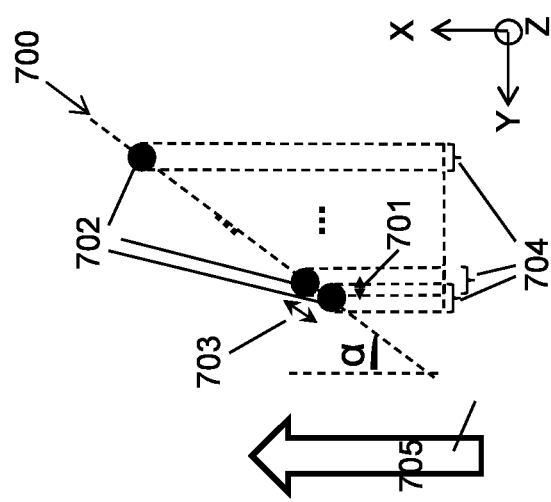

FIGS. 7A, 7B, 7C, 7D and 7E depict schematic diagrams of a manufacturing method, e.g., for manufacturing a flat panel display. In FIG. 7A, a column 700 of individually addressable elements 702 (such as individually addressable elements 102) is situated at an angle α relative to the scanning direction 705 of relative movement between the substrate 114 (not shown in FIG. 7 for convenience but would be above or below elements 702) and the individually addressable elements 702. The pitch 703 between adjacent individually addressable elements 702 is about 5 µm. Each individually addressable element 702 emits electromagnetic radiation toward the substrate 114, thereby generating a radiation spot on the substrate 114. Therefore, when there is a relative movement between the substrate 114 and the individually addressable elements 702 in the scanning direction 705, the radiation spots generated by different individually addressable elements 702 will pass over different areas of the substrate 114 (although there can be overlap between the areas covered by two or more of the individually addressable elements), thus producing a plurality of radiation lines 704 (brush lines of a brush) each with a width of about 1 µm. The turning "ON" or "OFF" of the individually addressable elements 702 is timed so that the appropriate pattern is formed along the length of each radiation line 704 on the substrate 114. In an embodiment, the emitter size of each individually addressable element is about 1 µm; so, in an embodiment, the radiation spot size is about 1 µm. In an embodiment, the effective pitch 701 (i.e., the displacement in the direction perpendicular to the scanning direction 705) between the adjacent individually addressable elements 702 is about 0.4 µm.

Additionally, the gray scale factor, which is the inverse of the effective pitch (or typically the effective pitch is determined based on the gray scale factor and is the inverse of the gray scale factor), is equal to about 2.5. The gray scale factor may be used to indicate the degree of overlap between adjacent radiation lines. For example, a large gray scale factor indicates a high degree of overlap, and a small gray scale factor indicates a low degree of overlap. The gray scale factor (and thus the effective pitch) is a design parameter based on, e.g. resist ability to form the pattern in response to the radiation from the spots, line width roughness specification, etc. It specifies the ratio between the optical spot size on the substrate and the required design grid (effective spot spacing or overlap) (e.g. 0.4 µm where the spot size is 1 µm and so the gray scale factor is 2.5) to expose patterns with sufficient quality. In an embodiment, a column 700 comprises 15 individually addressable elements 702, each of which produces a radiation line 704 with a width of about 1 µm on the substrate 114. As shown in FIG. 7A, the adjacent radiation lines 704 have a significant overlap. As a result, the radiation lines 704 are stitched together and collectively generate a continuous brush line. For example, considering a lens placement error of 0.5 µm on both sides of the row 700, the row 700 may collectively generate a brush line with a width of about 5 µm.

As shown in FIG. 7B, a plurality of the columns 700 are stacked generally in parallel to form an emitter array 710. Each column 700 is situated at the angle α relative to the scanning direction (i.e., the X-direction). In an embodiment, the pitch between adjacent columns is the same as the pitch 703 between adjacent individually addressable elements in the column 700. The brush lines produced by adjacent columns 700 of individually addressable elements 702 may have slight overlap so that the brush lines produced by all the columns 700 in the emitter array 710 collectively produce a brush with a brush width of about 70 µm, which effectively covers the field of view of the lens 122, 124 located between the emitter array 710 and the substrate. In an embodiment, the emitter array 710 comprises 15 rows 700 of the individually addressable elements 702. Since each row 700 may produce a brush line with a width of about 5 µm, the emitter array may therefore produce a brush with a brush width of about 70 µm when the adjacent brush lines have appropriate overlap.

In FIG. 7C, an emitter array 710 is associated with a lens 715 (such as lens 122, 124), forming an individual optical engine component 718. In an embodiment, the cross-sectional width (e.g., diameter) of the lens 715 is about 1 mm, and the field of view of the lens 715 is about 100 µm. A plurality of the individual optical engine components further forms a column 720 of the individual optical engine components 718. In an embodiment, the lenses 715 of adjacent individual optical engine components 718 are in contact or near contact. In this case, the spacing between emitter arrays 710 in the adjacent individual optical engine components 718 is determined by the cross-sectional width (e.g., diameter) of the lenses 715. The column 720 of the individual optical engine components is situated at an angle β relative to the scanning direction (i.e., the X-direction). The angle β is determined based on, for example, the brush width (e.g., about 70 µm), the cross-sectional width (e.g., diameter) of the lens 715 and the location of other optical engine components 718. The angle is provided so that, when there is relative movement between the substrate 114 and the optical engine components 718 in the scanning direction (i.e., the X-direction), the brushes generated on the substrate 114 by the individual optical engine components of a column 720 may have a slight overlap with one or more other brushes (e.g., adjacent brushes, a brush in another row (comprising a plurality of columns) of optical engine components, etc.). Further, in an embodiment, a set of brushes (and thus optical engine components 718) may collectively cover ("brush") an area on the substrate with a width substantially equal to the cross-sectional width of the lens 715. For example, column 720 can comprise 15 individual optical engine components. Each individual optical engine component may generate a brush with a brush width of 70 µm. By carefully selecting the angle β, a column 720 of individual optical engine components 718 can collectively cover an area on the substrate with a width of about 1 mm.

Figures 7D, 7E:
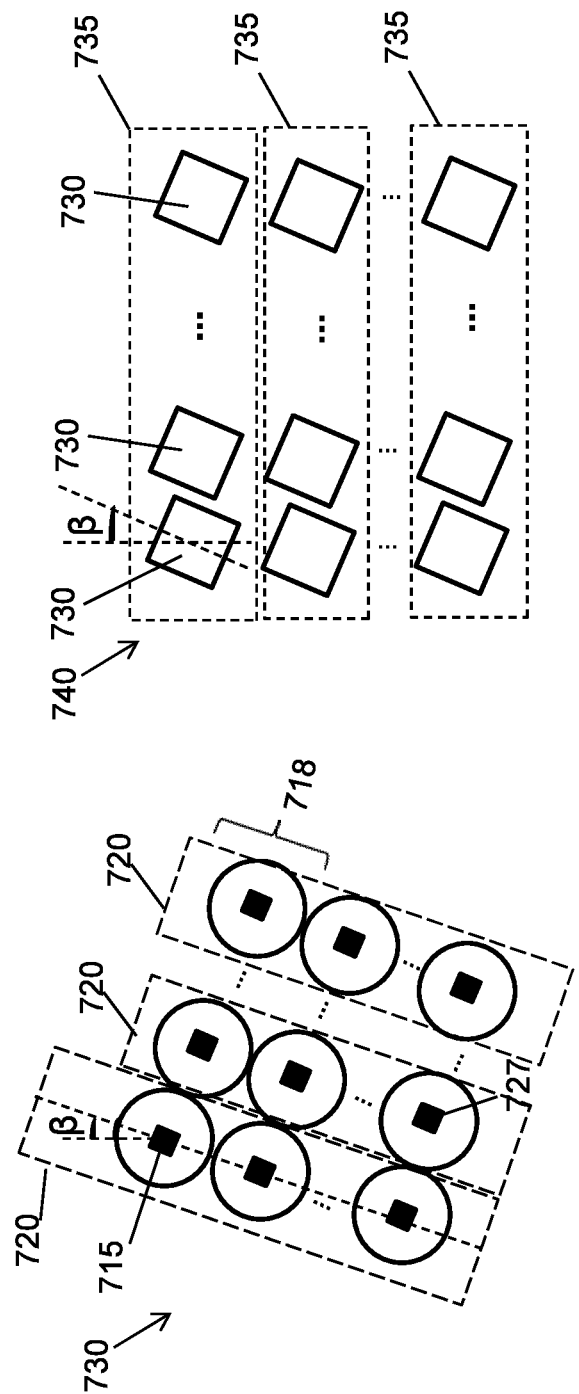

In FIG. 7D, a micro-lens array (MLA) module 730 is depicted. The MLA module 730 comprises a plurality of columns 720 of individual optical engine components 718 arranged in essentially in parallel. The columns 720 of individual optical engine components 718 are situated at the angle β relative to the scanning direction (the X-direction) so that the brush produced by the first individual optical engine component in a column (e.g., the individual optical engine component 715) has slight overlap with the brush produced by the last individual optical engine component in the adjacent column (e.g. the individual optical engine component 727), while the optical engine components 718 in the rows of a column 720 overlap with each other. Therefore, the brushes generated by the individual optical engine components in the MLA module 730 are stitched together. In an embodiment, columns 720 of individual optical engine components 718 in a MLA module 730 are in contact with the adjacent columns 720 of individual optical engine components 718, e.g., their lenses 715 are in contact or near contact. The number of columns 720 in an MLA module 730 is proportional to the width of area on the substrate that the MLA module 730 is intended to cover. In an embodiment, a MLA module 730 comprises 30 columns 720 of individual optical engine components. As described above, each column 720 of individual optical engine components can cover an area with a width of about 1 mm. Therefore, a MLA module 730 with 30 columns may collectively produce a pattern that covers an area on the substrate 114 with a width of about 30 mm. Ten MLA modules may be provided to cover a substrate with a width (e.g., diameter) of about 300 mm. It is appreciated that the MLA module 730 may comprise any number of columns 720 of the individual optical engine components.

FIG. 7E depicts a patterning device 740 (e.g., the patterning device 104), e.g., in manufacturing of a flat panel display. The patterning device 740 comprises a row 735 of MLA modules 730. For a single pass scan, the number of MLA modules 730 provided in the row 735 is typically determined by the width of the substrate 114 and the width of the pattern produced by each MLA module 730. For example, if the substrate 114 is 3 m wide, and each MLA module 730 is capable of covering an area on the substrate with a width of about 30 mm, at least 100 MLA modules 730 should be provided in the row 735 of the MLA modules 730. The row 735 is situated perpendicular to the scanning direction, and each MLA module 730 in the row 735 is situated at the angle β with relative to the scanning direction (i.e., the X-direction). The pitch between adjacent MLA modules 730 is carefully chosen so that the patterns produced by adjacent MLA modules 730 have a slight overlap. As a result, the row 735 of MLA modules 730 can collectively cover the whole width of the substrate 114 (e.g., 3 m).

In an embodiment, the patterning device 740 comprises two or more identical rows 735 of the MLA modules 730 stacked in essentially parallel and aligned in the scanning direction (i.e., the X-direction). This arrangement can, for example, allow at least part of a "redundant" MLA module 730 (e.g., one or more individually addressable elements 102 in a MLA module 730) in another 735 to be used when a corresponding part of a MLA module 730 in another row 735 (e.g., the first row) fails to operate or doesn't operate properly. In addition or alternatively, one or more extra rows 735 of the MLA modules 730 may have an advantage in controlling thermal load on the individually addressable elements 102 in the MLA modules 730. For example, a first row of the MLA modules 730 may be used for a certain period and then a second row is used for another period while the first row cools, and so on.

In an embodiment, the plurality of rows 735 of the MLA modules 730 may be operated at a fraction of their operating capacity at steady state. For example, the MLA modules 730 in each row 735 may be operated at around 80% of their capacity during steady state and should at least part of one or more MLA modules 730 in one or more rows fail or not operate properly, the remaining MLAs may be operated at a higher percent at steady state (e.g., 88% of their capacity) to provide close to or the same desired radiation power and brightness.

In photolithography, a desired feature may be created on a substrate by selectively exposing a layer of resist on a substrate to radiation, e.g. by exposing the layer of resist to patterned radiation. Areas of the resist receiving a certain minimum radiation dose ("dose threshold") undergo a chemical reaction, whereas other areas remain unchanged. The thus created chemical differences in the resist layer allow for developing the resist, i.e. selectively removing either the areas having received at least the minimum dose or removing the areas that did not receive the minimum dose. As a result, part of the substrate is still protected by a resist whereas the areas of the substrate from which resist is removed are exposed, allowing e.g. for additional processing steps, for instance selective etching of the substrate, selective metal deposition, etc. thereby creating the desired feature. In an embodiment, at least part of two or more MLA modules 730 in two or more rows in FIG. 7E collectively provide enough radiation dose to allow such chemical reaction to take place in a corresponding area of the substrate 114. Thus, an area on the substrate can be exposed to radiation a plurality of times by different optical engine components 718, either in the same MLA module 730 or desirably in different MLA modules 730.

In the above discussions, an emitter array 101 is described as being capable of producing a whole, contiguous brush, on the surface of the substrate 114, that effectively covers the field of view of the lens 122, 124. However, in an embodiment, this need not or may not be the case. The capability of producing a whole brush using an emitter array 101 depends on one or more factors selected from: the pitch between adjacent individually addressable elements 102, the field of view of the lens 122, 124, and/or the angle at which the emitter array 101 is situated relative to the scanning direction. In many examples, the lens 122, 124 is specified at the outset (e.g., only certain lens sizes are available and/or a desired NA is required) and so the field of view is determined. In this case, the capability of producing the whole brush by an emitter array 101 depends on, for example, the pitch between adjacent individually addressable elements 102 in the emitter array 101 and the angle at which the emitter array 101 is situated relative to the scanning direction.

Figures 8A, 8B:
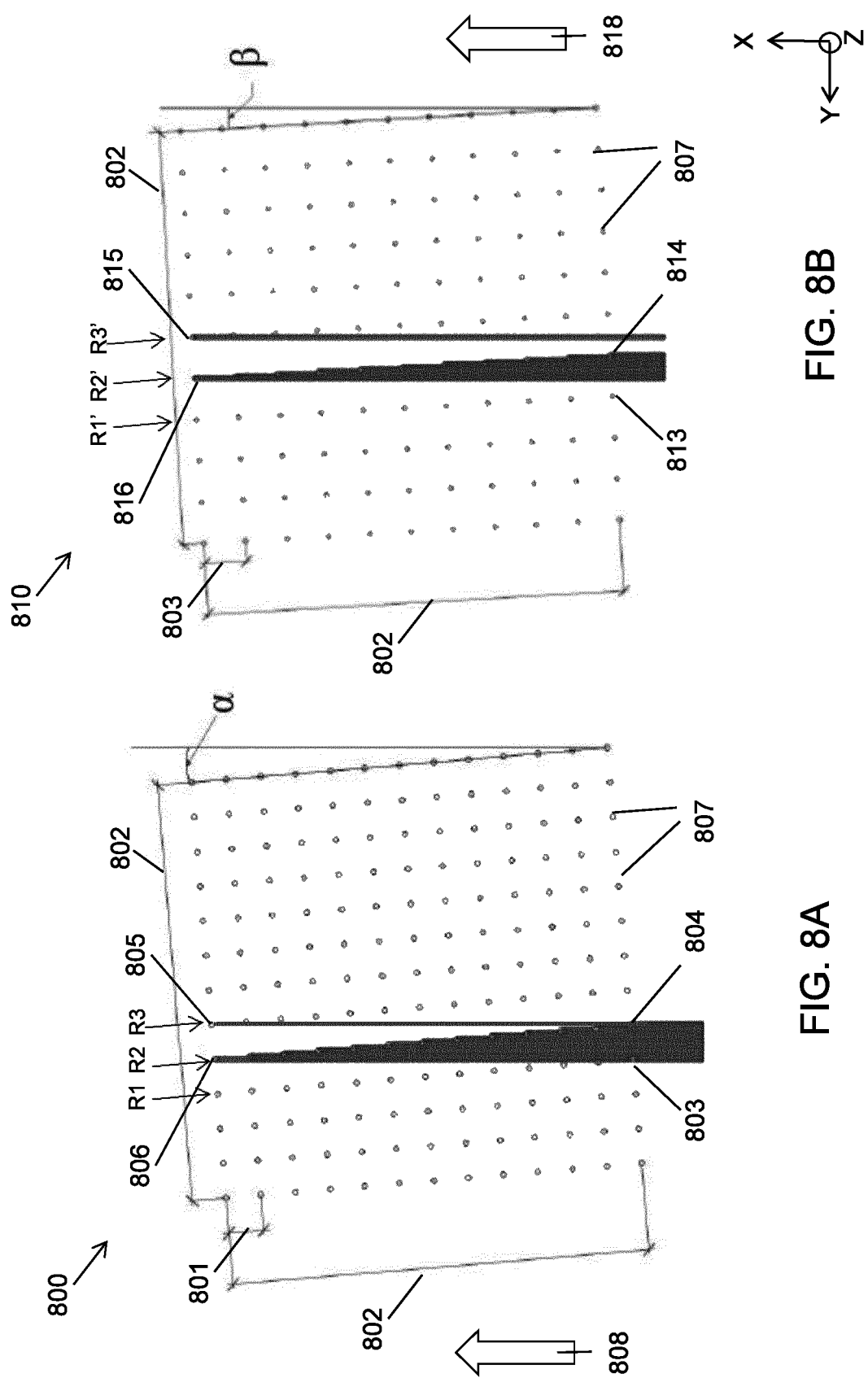
FIG. 8A and FIG. 8B depicts an embodiment of a scheme of transferring a pattern to a substrate.

Referring to FIG. 8A, a schematic top view of an emitter array 800 is depicted. Similar to as discussed above, the emitter array 800 is a part of an individual optical engine component and is optically associated with a lens (e.g., the lens 122, 124). In an embodiment, the field of view of the lens is determined to be 100 µm. As shown, the emitter array 800 comprises a plurality of columns (e.g., columns R1-R3) of individually addressable elements 807 (such as individually addressable elements 102 and includes elements 803, 804, 805, 806). Each column of the individually addressable elements comprises a plurality of individually addressable elements with a pitch 801 of, e.g., about 5 µm between adjacent individually addressable elements. In an embodiment, the spot size of each individually addressable element is about 1 µm. In an embodiment, each of the individually addressable elements is a LED. The columns of individually addressable elements (e.g., the columns R1-R3) are situated essentially in parallel also with a pitch 801 between adjacent columns of the individually addressable elements. Therefore, in an embodiment, the emitter array 800 forms a square array of individually addressable elements 807, i.e., the four sides 802 of the emitter array 800 have essentially equal lengths. In an embodiment, each side 802 of the emitter array 800 is 70 µm long. Therefore, the diagonal of the emitter array 800 is about 100 µm long, which is approximately equal to the field of view of the lens associated with the emitter array 800.

The emitter array 800 is situated at an angle α1 relative to the scanning direction 808. This is done so that, when the substrate (not shown) is irradiated by the beams from the emitter array 800 and there is relative movement between the substrate 114 and the emitter array 800 in the scanning direction 808, each radiation spot from the individually addressable element will effectively pass over a different area of the substrate, thereby allowing for production of different radiation lines.

As shown, the radiation lines have a slight overlap with adjacent radiation lines written by the individually addressable elements from the same column (e.g., the column R2). Further, the radiation line written by the first individually addressable element 806 of the column R2 has an overlap with the radiation line written by the last individually addressable element 803 of the column R1. In addition, the radiation line written by the last individually addressable element 804 of the column R2 has overlap with the radiation line written by the first individually addressable element 805 of the column R3. Therefore, the radiation lines written by all the columns of the individually addressable elements in the emitter array 800 may be stitched collectively to generate a brush with a width of, e.g., 70 µm.

Now, referring to FIG. 8B, a schematic top view of a further emitter array 810 is depicted. The emitter array 810 is a part of an individual optical engine component and is optically associated with a lens similar to that described in FIG. 8A. In an embodiment, the field of view of the lens is, for example, 100 µm. As shown, the emitter array 810 comprises a plurality of columns of individually addressable elements (e.g., columns R1'-R3'). Each column of individually addressable elements comprises a plurality of individually addressable elements with a pitch 809 of, e.g., about 7 µm between adjacent individually addressable elements. The size of each individually addressable element is about 1 µm. In an embodiment, each of the individually addressable elements is a LED. The columns of individually addressable elements (e.g., the columns R1'-R3') are situated essentially in parallel with the pitch 809 between adjacent columns of the individually addressable elements. Therefore, in an embodiment, the emitter array 810 forms a square array of individually addressable elements 807, i.e., the four sides 802 of the emitter array 810 have essentially equal lengths. In this case, the size of the emitter array 810 is similar to the size of the emitter array 800. In an embodiment, each side 802 of the emitter array 810 is 70 µm long. Therefore, the diagonal of the emitter array 810 is about 100 µm long, which is approximately equal to the field of view of the lens associated with the emitter array 810.

The emitter array 810 is situated at an angle β1 relative to the scanning direction 818. This is done so that, when the substrate (not shown) is irradiated by the beams from the emitter array 810 and there is relative movement between the substrate 114 and the emitter array 810 in the scanning direction, each radiation spot from the individually addressable elements will pass over a different area of the substrate, thereby allowing radiation lines written by the same column (e.g., the column R2') of individually addressable elements to have a slight overlap with adjacent radiation lines. But, due to the larger pitch (i.e., about 7 µm) compared with that in FIG. 8A (i.e., about 5 µm), the angle β1 is smaller than the angle α1.

Further, although the radiation lines written by the same column (e.g., the column R2') of individually addressable elements may stitch together, these radiation lines may not stitch with those written by one or more adjacent columns (e.g., the columns R1' and R3') of individually addressable elements. For example, the radiation line written by the first individually addressable element 816 of column R2' may not slightly overlap with the radiation line written by the last individually addressable element 813 of column R1'. Similarly, the radiation line written by the last individually addressable element 814 of column R2' may not slightly overlap with the radiation line written by the first individually addressable element 815 of column R3'. As a result, the emitter array 810 may not be capable of producing a whole brush with a width of 70 µm on the substrate 114. Furthermore, increasing the angle β1 in a counterclockwise direction may decrease the gap between the radiation lines produced by adjacent columns of individually addressable elements (e.g., R1' and R2', and/or R2' and R3'). However, this may create a gap between adjacent radiation lines produced by adjacent individually addressable elements in the same column (e.g., R2'). In either case, the emitter array 810 may produce undesirable "zebra" lines due to the relatively large pitch between adjacent individually addressable elements. To resolve this issue, two or more emitter arrays 810 with a displacement in a direction perpendicular to the scanning direction may be used to collectively create a brush.

Figure 9E:
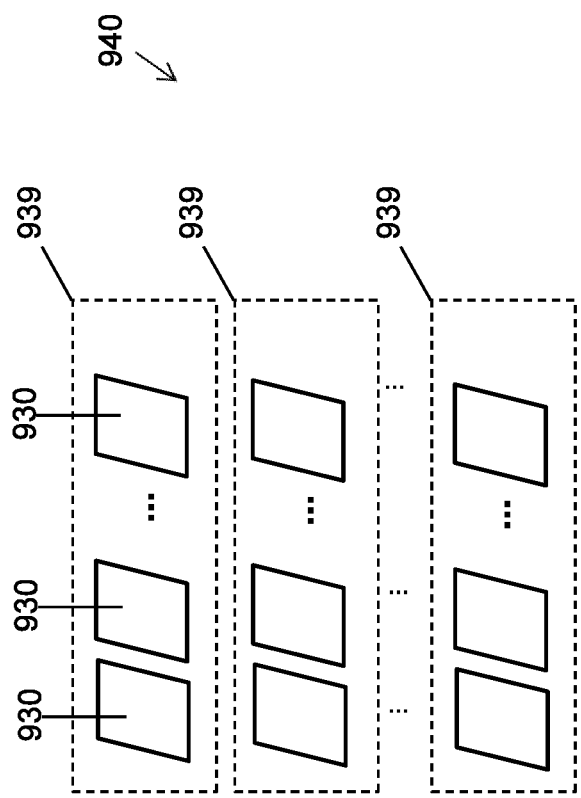

FIGS. 9A, 9B, 9C, 9D and 9E depict schematic diagrams of a manufacturing method, e.g., for manufacturing a flat panel display. In FIG. 9A, a column 907 of individually addressable elements 902 represented by solid circles is situated at angle θ relative to the scanning direction 901. In an embodiment, the pitch 911 between adjacent individually addressable elements 902 is about 7 µm. Each individually addressable element 902 emits electromagnetic radiation toward the substrate 114, thereby generating a radiation spot on the substrate 114. Therefore, when there is relative movement between the substrate 114 and the individually addressable elements 902 in the scanning direction 901, the radiation spots generated by different individually addressable elements 902 will pass over different areas of the substrate 114, thereby allowing production of a plurality of radiation lines 903 each with a width of 1 µm. The turning "ON" or "OFF" of the individually addressable elements 902 is timed so that the desired pattern is produced in each radiation line 903 on the substrate 114. In an embodiment, the radiation spot size is 1 µm. Due to the relatively large pitch (i.e., about 7 µm versus about 5 µm), the adjacent radiation lines 903 have a gap therebetween. For example, the gap may be about 0.4 µm, about 0.35 µm, about 0.3 µm, about 0.2 µm, etc.

As shown, another column 909 of individually addressable elements 904 represented by hollow circles is situated at the angle θ relative to the scanning direction 901. The column 909 is similar to the column 907 but has a small displacement in the direction perpendicular to the scanning direction so that the radiation lines 905 generated by the column 909 of individually addressable elements 904 may be interleaved with the radiation lines 903 generated by the column 907 of the individually addressable elements 902. Therefore, the radiation lines 905 may fill the gaps between the adjacent radiation lines 903. As a result, the radiation lines 903 and the radiation lines 905 may collectively produce a brush. In an embodiment, the displacement 906 between adjacent radiation lines is 0.4 µm, equal to the effective pitch in FIG. 7A. In an embodiment, both column 907 and column 909 comprise 11 individually addressable elements 902, 904. Considering a lens placement error of 0.5

μm on both sides of the columns 907 and 909, a brush line generated collectively by columns 907 and 909 may have a width of about 6.8 μm.

To enable the interleaving, FIG. 9B depicts two emitter arrays 910, 915 that respectively have the column 907 and the column 909. The first emitter array 910 comprises a plurality of columns 907 stacked essentially in parallel, each column situated at an angle θ relative to the scanning direction 901. The pitch of adjacent columns 907 is the same as the pitch between adjacent individually addressable elements 902 in column 907. In an embodiment, the pitch of adjacent columns 907 is about 7 μm. In an embodiment, each side of the first emitter array 910 is about 70 μm long so that the diagonal of the first emitter array 910 is about equivalent to the field of view (about 100 μm) of the lens associated with the first emitter array 910.

Similarly, the second emitter array 915 comprises a plurality of columns 909 stacked essentially in parallel, each column is situated at an angle α relative to the scanning direction 901. The pitch of adjacent columns 909 is the same as the pitch between adjacent individually addressable elements 904 in the column 909. In an embodiment, the pitch of adjacent columns 909 is about 7 μm. In an embodiment, each side of the second emitter array 915 is about 70 μm so that the diagonal of the second emitter array 915 is about equivalent to the field of view (about 100 μm) of the lens associated with the second emitter array 915. The second emitter array 915 has a small displacement in the direction perpendicular to the scanning direction relative to the first emitter array 910. This is so that the radiation lines 903 generated by the columns 907 of individually addressable elements 902 in the first emitter array 910 are interleaved with the radiation lines 905 generated by the columns 909 of individually addressable elements 904 in the second emitter array 915 as described in FIG. 9A. As a result, the first emitter array 910 and the second emitter array 915 may collectively produce a brush that covers the field of view of the lens associated with the first emitter array 910 or with the second emitter array 915. In an embodiment, the first emitter array 910 and the second emitter array 915 comprise eleven columns 907 of individually addressable elements 902 and eleven columns 909 of individually addressable elements 904, respectively. Each column 907 may be paired with a column 909 to produce a brush line with a width of about 6.8 μm. Therefore, a pair of the first emitter array 910 and the second emitter array 915 may collectively produce a brush with a brush width of about 6.8 μm*11=74.8 μm.

As will be appreciated, the interleaving need not be uniform and/or can be provided by more than one extra emitter array.

As shown in FIG. 9C, the first emitter array 910 and the second emitter array 915 are each associated with a lens 925, forming a first individual optical engine component 921 and a second individual optical engine component 923 respectively. In an embodiment, the width (e.g., diameter) of the lens 925 is about 1 mm, and the field of view of the lens 925 is about 100 μm. A pair 927 of a first individual optical engine component 921 and a second individual optical engine component 923 is used to produce a brush as described in FIG. 9B. A plurality of such pairs 927 may be arranged as shown and form a group 920 of pairs 927. The number of pairs in the group 920 is determined by, e.g., the width (e.g., diameter) of the lens 925; for example, so that the brushes contiguously extend to cover the width of a lens 925. In particular, in a group 920, adjacent pairs 927 have an appropriate displacement in the direction perpendicular to the scanning direction. This is done so that the group 920 of pairs 927 may collectively cover an area on the substrate with a width equivalent to the width of the lens 925. For example, the group 920 may comprise 14 pairs of first individual optical engine component 921 and second individual optical component 923. Since a brush produced by each pair 927 has a brush width of about 75 μm, the brushes produced by the group 920 may cover an area on the substrate with a width of about 1.05 mm, which is approximately equal to the width (e.g., 1 mm) of the lens 925.

Figure 9D:
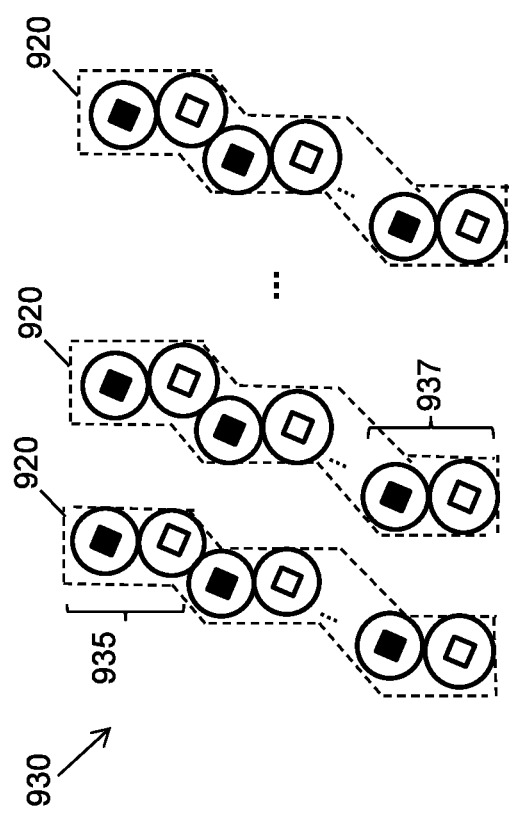

FIG. 9D depicts an example micro-lens array (MLA) module 930, which comprises a plurality of groups 920 arranged as shown so that the brush produced by the first pair 935 in a group has slight overlap with the brush produced by the last pair 937 in the adjacent group. In this way, the brushes generated by all the groups 920 in the MLA module 930 are stitched together. The width of area on the substrate that the MLA module 730 is capable of covering is determined by the number of groups 920 contained in the MLA module 930. In an embodiment, the MLA module 930 comprises thirty groups 920 of pairs 927. As described above, each group 920 of pairs 927 may cover an area with a width of about 1 mm. Therefore, the MLA module 930 may collectively produce a pattern that covers an area on the substrate with a width of about 30 mm. It is appreciated that the MLA module 930 may comprise a different number of groups 920.

FIG. 9E depicts a patterning device 940, e.g., for use in manufacturing of a flat panel display. The patterning device 940 comprises a row 939 of MLA modules 930. The number of MLA modules 930 provided in a row 939 is determined by, e.g., the width of the substrate 114 and the width of the pattern produced by each MLA module 930 if a substrate 114 is desired to be exposed in a single pass. For example, if the substrate 114 is 3 m wide, and each MLA module 930 is capable of covering an area on the substrate with a width of 30 mm, at least 100 MLA modules 930 should be provided in the row 939 of the MLA modules 930. The row 939 is situated perpendicular to the scanning direction. The pitch between adjacent MLA modules 930 is carefully chosen so that the patterns produced by adjacent MLA modules 930 have slight overlaps. As a result, in an embodiment, a row 939 of MLA modules 930 collectively covers the whole width of the substrate 114.

It should be noted that the total number of lenses required to cover an area on the substrate with widths equivalent to the diameters of the lenses is closely related to the pitches between adjacent individually addressable elements, the field of view of the lens, the lens position tolerance, the diameter of the lens, and the required redundancy which will be discussed further. In other words, when the field of view of the lens (e.g., 100 μm), the lens position tolerance (e.g., 0.5 μm on each side of the lens), the width (e.g., diameter) of the lens (e.g., 1 mm), and the required redundancy are all determined, the total number of the required lenses is closely related to the pitch between adjacent individually addressable elements. In an embodiment, the patterning device 940 comprises two or more rows 939 of MLA modules 930 stacked in parallel and aligned in the scanning direction for introduction of, for example, redundancy, etc. as similarly described with respect to FIG. 7E.

Thus, in an embodiment, direct emitter imaging is performed by writing patterns with arrays of emitters (e.g., LEDs) coupled to an array of microlenses. As discussed above, a single row of emitters essentially parallel to the scan direction (i.e., at the angle discussed above) defines a single brush line. Then, multiple brush lines next to each other over the width of the field of view of a microlens form a single brush. So, depending on, for example, the emitter bonding pitch (in other words, how close the emitters can be placed next to each other), one or more microlenses, each microlens having individually addressable elements that project beams therethrough and having the individually addressable elements stacked in the scan direction as discussed above, are employed to achieve the desired brush line width and brush width to effectively cover the field of view of a microlens. Additionally, multiple brushes are used to fill the width of the microlens pitch, by again stacking microlenses with emitters in the scan direction. Then, the above arrangements can be repeated in a direction perpendicular to the scanning direction as needed to accommodate the size of the substrate to be exposed.

So, besides emitter bonding pitch, several design parameters put a constraint on the number of emitters and microlenses that can be used. A first parameter is the field of view of a single microlens. The ratio between the width (e.g., diameter) of the lens and its field of view determines the amount of microlenses needed to write across the width of the microlens pitch. Another parameter is a redundancy for the pattern, which determines a minimum amount of emitters needed per pixel. Further, optical power of a single emitter in combination with the dose requirement of the application (e.g., the amount of dose needed to pattern a resist) sets a minimum amount of emitters needed per pixel. Additionally, microlens positioning error introduces a required overlap of emitter arrays and therefore influences the total amount of microlenses used to write a full pattern.

So, in an embodiment, given microlenses with, for example, a width (e.g., diameter) of 1 mm and a field of view of, e.g., 70 µm, at least 15 microlenses are needed to fill a 1 mm scan width corresponding to the pitch of the microlenses. For a 1 µm CD, taking into account a gray scale factor of 2.5 and a lens positioning error of 0.5 µm, to create a brush of 70 µm out of a single lens, at least 15×15 emitters are required in the field of view. This results in a maximum emitter pitch of about 5.0 µm (e.g., a 5.0 µm emitter bonding pitch) for a solution with a lowest number of lenses.

Figure 10:
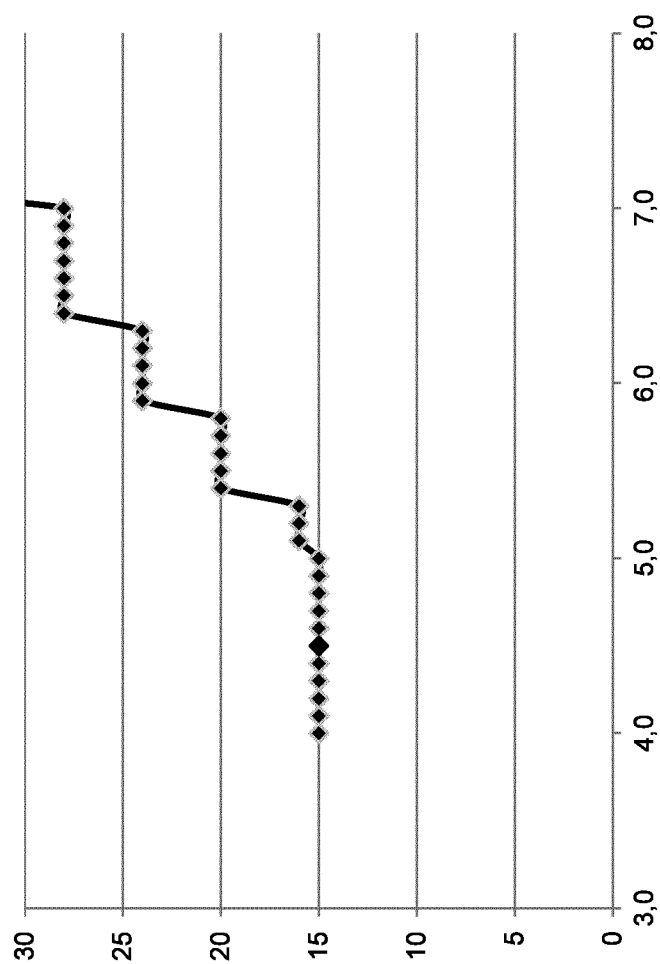
FIG. 10 is a graph of a number of lenses versus pitch between adjacent emitters.

The number of lenses used scales aggressively with the emitter pitch, as shown in FIG. 10. FIG. 10 depicts the relationship between the total number of lenses required to cover an area having a width equivalent to the diameter (e.g., 1 mm) of each lens and the pitch between adjacent individually addressable elements for a particular lens for about 0.4 micron CD. The X-axis represents the pitch between adjacent individually addressable elements and the Y-axis represents the total number of lenses required to cover an area with a width equivalent to that of each lens. As shown, when the emitter pitch is between 4 µm and 5 µm, 15 lenses are needed to cover an area with a 1 mm width. But, when the emitter pitch is increased (e.g., if it is not possible to provide an emitter pitch of about 5 µm, the number of the lenses needed varies as shown in FIG. 10 depending on the emitter pitch. For example, a next desirable emitter pitch would be about 7 µm. When the pitch is about 7 µm, about 28 lenses are needed to cover the area with a 1 mm width, as, for example, shown in FIG. 9C. Further, for example, as described in FIG. 9B, where the pitches between adjacent individually addressable elements are about 7 µm, two emitter arrays 910 and 915 are provided to collectively produce a brush covering the width of the field of view of a lens, i.e., two lenses are used per brush. Accordingly, FIG. 9C indicates 28 lenses 925 to cover an area on the substrate with a width equivalent to the width (e.g., 1 mm) of each lens 925. By changing the pitch from 5 µm to 7 µm, the number of lenses to cover an area of 1 mm width on the substrate approximately doubles.

A patterning device (e.g., the patterning devices 740, 940) may have thousands of individually addressable elements. One or more controllers may be provided to control these individually addressable elements (e.g., modulate these individually addressable elements "ON" and "OFF" including various gray levels in between, e.g. 8 bit addressing for 256 power levels). In an embodiment, the one or more controllers may be complementary metal-oxide semiconductor (CMOS) control circuits. The control circuits need to be connected to the individually addressable elements 102 but as will be appreciated, space is very limited. Direct bump bonding is a common method for interconnecting individual semiconductor devices to external circuitry by using solder bumps that have been deposited onto the semiconductor device. However, a bump pitch size is typically at least 20 µm. But, as discussed above, the size of an individually addressable element can be only 1 µm and the pitch can be about 5 or 7 µm, and so direct bump bonding technology may not provide enough resolution to allow one or more control circuits to interconnect with each individually addressable element.

Figure 11:
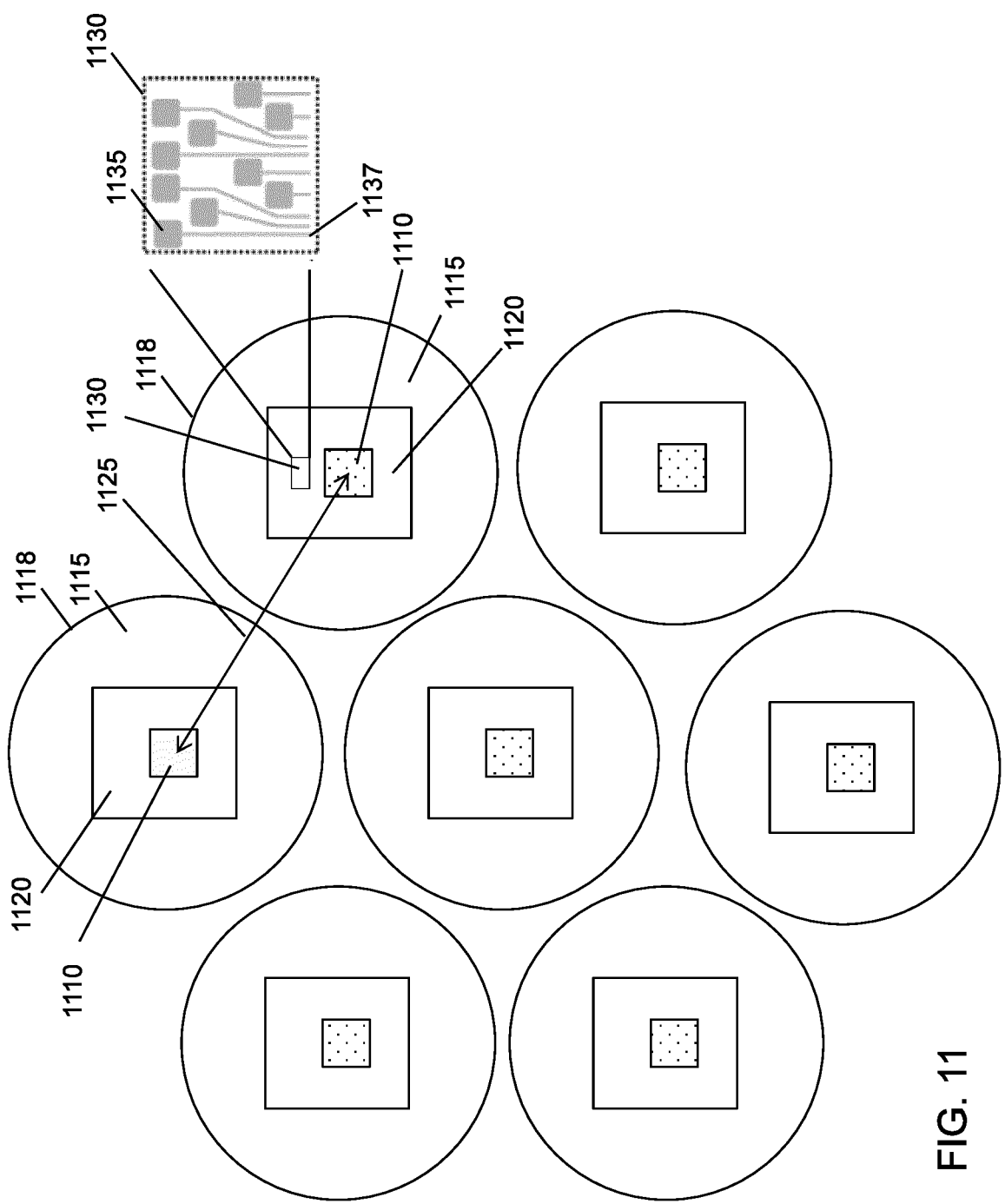
FIG. 11 depicts a schematic top view of a plurality of lenses each with an emitter array and a bond pad according to an embodiment.

FIG. 11 depicts a highly schematic top view of a portion of a patterning device (e.g., the patterning device 104, 740 or 940) comprising a plurality of individual optical engine components 1118. Each individual optical engine component 1118 comprises an emitter array 1110 and a lens 1115, which are similar to the emitter arrays 710, 910, 915 and the lenses 715, 925, respectively. In an embodiment, the lens 1115 has a field of view of, e.g., 100 µm (equivalent to the diagonal of the emitter array 1110) and a width of, e.g., 1 mm. Therefore, the spacing 1125 between two adjacent emitter arrays 1110 is about at least 1 mm. Each individual optical engine component 1118 further comprises a bond pad area 1120 adjacent to the emitter array 1110. For example, where the emitter array 1110 is above a lens 1115, the bond pad area 1120 is similarly above the lens 1115. In an embodiment, the bond pad area 1120 is attached to the lens 1115. Although the bond pad area is a square as shown in FIG. 11, the bond pad area may have any other suitable shape, for example, a circle, a polygon, etc.

A zoom-in view of a portion 1130 of the bond pad area 1120 is depicted in FIG. 11. As shown, the portion 1130 of the bond pad area 1120 includes a plurality of bonding pads 1135. Although the bonding pads 1135 have square shapes as shown in FIG. 11, the bonding pads 1135 may have any other suitable shapes such as circle, rectangular, etc. The size of each bonding pad 1135 may be more than or equal to about 400 µm$^2$ and less than or equal to about 1600 µm$^2$. A bonding pad 1135 may be larger than or equal to 20 µm*20 µm, larger than or equal to 30 µm*30 µm, larger than or equal to 40 µm*40 µm, etc. The bonding pad 1135 enable interconnection with one or more control circuits using direct bump bonding technology as mentioned above, or any other suitable technologies such as, for example, using bonding wires. As will be appreciated the bonding pads 1135 may be arranged all the way around the periphery of the emitter array 1110. Thus, the bond pad area may surround and even overlap with the emitter array 1110 (e.g., if it is produced in a physically different layer, and can thus be stacked on top of the emitter array). The bond pad area accordingly allows for more area to realize the bonding of all individual emitters. Because of the pitch mismatch between emitters and bonding technology, typically a larger area than the emitter array 1110 would be needed to realize the bonding.

Figure 12:
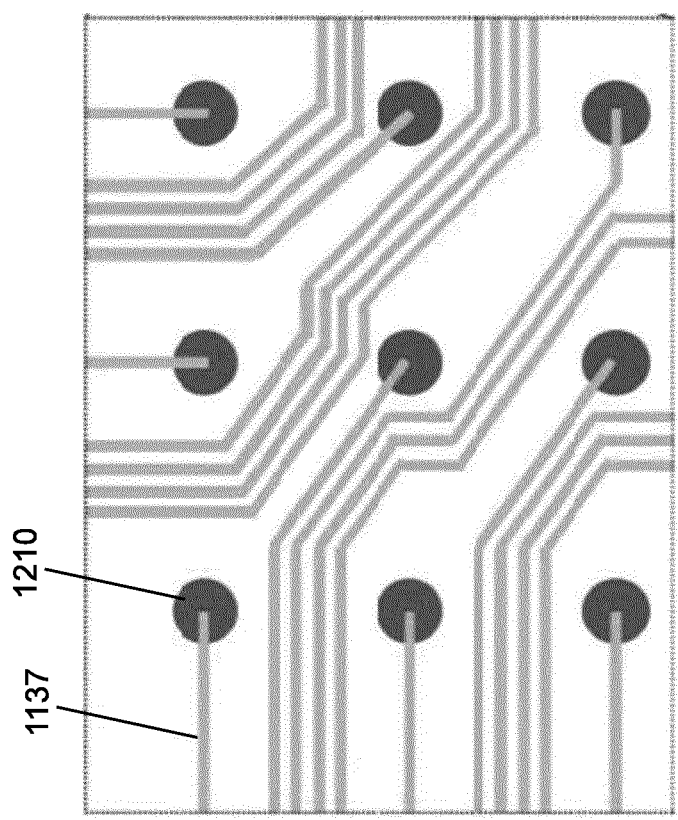
FIG. 12 depicts a schematic bottom view of an emitter array according to an embodiment.

As shown in the zoom-in view of a portion 1130 of the bond pad area 1120 as depicted in FIG. 11 and as shown in FIG. 12, each of the bonding pads 1135 is further connected to a corresponding individually addressable element 1210 in the emitter array 1110 via a metal line 1137, thereby allowing for control of the individually addressable element 1210. In an embodiment, the metal lines 1137 are copper, gold or aluminum lines. The metal lines 1137 may be produced using a conventional lithographic apparatus using, for example, a mask. The linewidth of each metal line 1137 may be at least a few hundred nanometers. The metal lines 1137 are not in contact with each other to avoid electrical problems such as shorting. Such a configuration of the bond pad area 1120, the bonding pads 1135 and the metal lines 1137 extending from the emitter array 1110 and around the periphery of the emitter array 1110 can be referred to as a fan-out structure.

Various embodiments may be employed to arrange the metal lines 1137 in the emitter array 1110. In an embodiment, all the metal lines 1137 are produced in a single layer on the surface of the emitter array 1110 as shown in FIG. 12. In an embodiment, the pitch between adjacent individually addressable elements 1210 is 5 μm and each of the individually addressable elements 1210 is connected to a metal line 1137. So, in an embodiment, the linewidths of the metal lines 1137 can be 429 nm or less. A spacing of between metal lines can be 429 nm or less and the spacing between the group of metal lines and an adjacent individually addressable element 1210 can be about 1 micron or less. In an embodiment, between adjacent individually addressable elements 1210 are at most four metal lines with an equal spacing of 429 nm.

Alternatively or in addition, the metal lines 1137 may be produced in 2 or more layers on the surface of the emitter array 1110 in a manner that any two of the metal lines 1137 do not cross with each other to avoid electrical problems such as shorting. An advantage of this scheme is that, e.g., wider metal lines 1137 could be produced on the surface of the emitter array 1110, thereby reducing the resistivity of the metal lines 1137. The reduction of the resistivity of the metal lines 1137 may mitigate a plurality of related electrical problems, such as heating and electromigration.

Linewidth roughness (LWR) can be one of the limiting factors of state-of-the-art lithography. LWR is the deviation of a feature shape from a smooth, ideal shape. It has been discovered that the effect of LWR may be limited by the largest distance between neighboring individually addressable elements in the emitter array. In other words, the effect of LWR may be mitigated by decreasing the maximum distance between neighboring individually addressable elements. However, as discussed above, the pitch of adjacent individually addressable elements is determined by various factors, such as lens width, etc. Thus, mitigating LWR by decreasing the pitch in an emitter array may not be possible. However, improved performance may be achieved by designing the emitter array according to a particular desirable configuration.

Figures 13A, 13B:
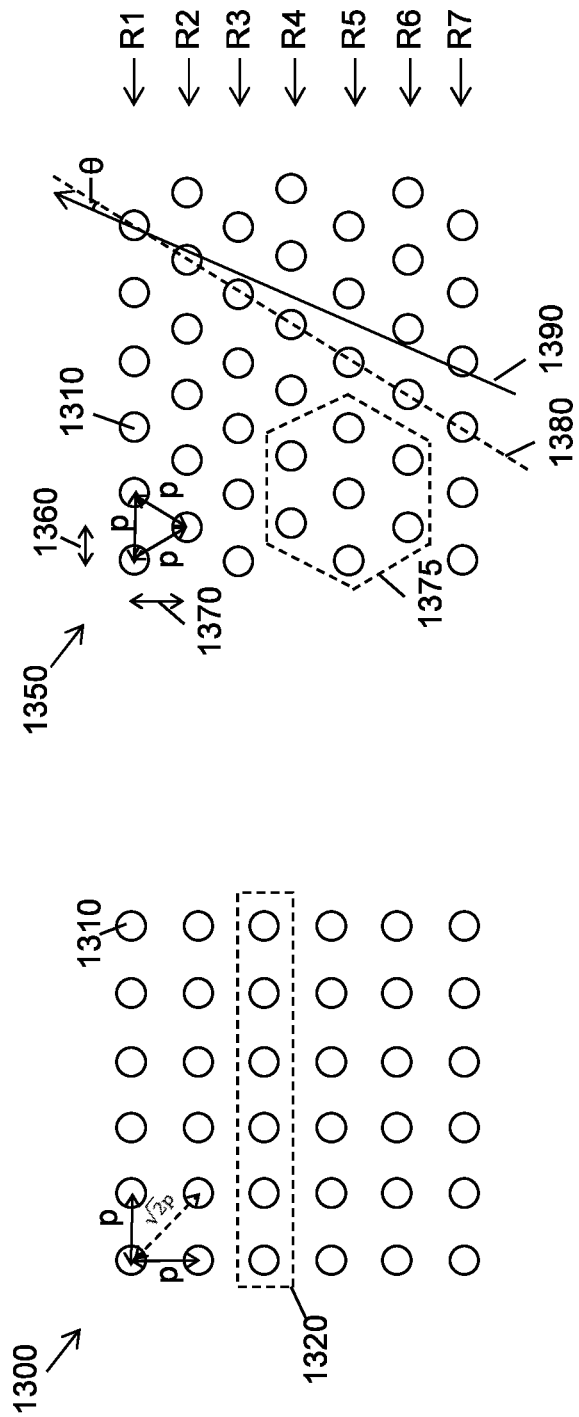
FIG. 13A depicts a schematic diagram of an emitter array according to an embodiment.
FIG. 13B depicts a schematic diagram of an emitter array according to an embodiment.

Similar to the emitter arrays 710, 910, and 915, an emitter array 1300 may have a plurality of individually addressable elements 1310 arranged in a rectangular shape as shown in FIG. 13A. As discussed above, the dimension of the emitter array should be selected to cover the field of view of the lens associated with the emitter array. As shown in FIG. 13A, the emitter array 1300 comprises six rows 1320 of individually addressable elements 1310. Each row 1320 comprises six individually addressable elements 1310. The pitch of the emitter array 1300 is denoted by "p". Therefore, an individually addressable element may have an equal distance ("p") with an adjacent individually addressable element in the same row or in the same column. However, a largest distance between adjacent individually addressable elements 1310 is between an individually addressable element and its neighboring individually addressable element in the diagonal direction, which is denoted by "√2p." In an embodiment, the emitter array 1300 can be referred to as an emitter array with adjacent individually addressable elements arranged in a square configuration.

For comparison, in an embodiment, FIG. 13B shows an emitter array 1350 with similar dimensions as the emitter array 1300. The emitter array 1350 comprises seven rows of individually addressable elements. Similar to 1320, each row (i.e., R1, R2, . . . , R7) comprises six individually addressable elements 1310, and the pitch between adjacent individually addressable elements 1310 in the same row is denoted by "p." Different from the emitter array 1300, the emitter array 1350 is configured that such that, e.g., the even rows (i.e., R2, R4, and R6) have a horizontal displacement 1360 of 0.5p with respect to the odd rows (i.e., R1, R3, R5, and R7). In an embodiment, the vertical displacement 1370 between adjacent rows is approximately 0.87p. Thus, in this configuration, the distances between neighboring individually addressable elements 1310 in the emitter array 1350 are all equal to p. As a result, the emitter array 1350 may comprise a plurality of hexagonal structures 1375. Therefore, the emitter array 1350 can be referred to as an emitter array with adjacent individually addressable elements arranged in a hexagonal configuration. In an embodiment, the emitter array 1350 may be situated at an angle θ between a column 1380 of individually addressable elements 1310 and the scanning direction 1390 for relative movement between the substrate (e.g., the substrate 114) and the emitter array 1350.

Compared with the emitter array 1300, the maximum distance between the neighboring individually addressable elements in emitter array 1350 is decreased from √2p (as in FIG. 13A) to p (as in FIG. 13B). Therefore, the LWR effect may be mitigated by a factor of √2. For example, when the emitter array 1350 is arranged at angle θ, the effective pitch is increased from 0.4 μm to 0.4√2 μm (i.e., 0.57 μm) for 1 μm CD. Further, a reduction can be achieved in the gray scale factor for a square configuration emitter array, which is determined based on, among other things, the largest distance neighbor to an individually addressable element to account for worst case LWR. Thus, the gray scale factor can be decreased from 2.5 to 2.5/√2 (i.e., 1.77).

In an embodiment, the emitter array 1350 has a higher density of individually addressable elements 1310 per lens than the emitter array 1300 at the same minimum pitch. Advantageously, this can reduce cost.

From another perspective, the pitch of the emitter array 1350 may be increased while keeping the density of individually addressable elements 1310 in the emitter array 1350 the same as the density of individually addressable elements 1310 in the emitter array 1300. Advantageously, the larger pitch induces less technological risk, e.g., with bonding as described above.

Thus, the hexagonal configuration can yield significant reduction in required number of emitters per unit area at constant imaging performance (excluding dose limitations per emitter), as well as a packing density gain versus the square configuration. Furthermore, the data path scales with the number of individually addressable elements and so the hexagonal configuration can yield, e.g., less complexity and reduced cost. Further, line width roughness can be improved with a hexagonal configuration at a same number of individually addressable elements per area compared to the square configuration.

The hexagonal configuration can also be extended to other elements. For example, the microlenses can be arranged in hexagonal configuration in a MLA. In another example, MLA modules can be arranged in hexagonal configuration.

In an embodiment, there is some focus dependency in the formation of features (e.g. their profile changes as a function of focus) and so focus control is provided by changing, e.g., changing a focal length, adjusting the relative position between the substrate and a focal point or range, etc. Among various parameters that can characterize the focus dependency in the formation of the features, depth of focus (DOF) parameter specifies the range of focus that can be tolerated before the quality of the features printed on the substrate become too degraded. For example, the expected DOF of a patterning device (e.g., the patterning device 104, 740 or 940) as described herein for flat panel display applications can be in the range of 3-5 µm. This indicates that features are not able to be printed well on a substrate where, for example, a distance of a portion of the substrate from a nominal plane of the substrate (hereinafter referred to as height variation of the substrate for convenience) is beyond the DOF selected from the range of, for example, 3-5 µm, without focus control. But, for a flat panel display application as an example, the substrate can exhibit up to 12 µm height variation over a distance of 150 mm on the substrate, which is far beyond the DOF described above. Therefore, local focus control of the patterning device (e.g., the patterning device 104, 740, or 940) with respect to the substrate is desired. A possible solution is adjusting the relative position between each individually addressable element in the patterning device and the substrate in a direction substantially orthogonal to the substrate (hereinafter referred to as height for convenience) using one or more actuators. This, for example, may not be cost effective due to the requirement of a large amount of actuators for implementing this solution. Moreover, with a small pitch of emitters, it may not be practical to implement focus control for each emitter independently.

So, in an embodiment, instead of adjusting the heights and/or tilts of each individually addressable element, one or more high precision actuators may be used to adjust the heights and/or tilts of a plurality of individually addressable elements collectively in a MLA module (e.g., the MLA modules 730 and 930). The dimensions of the MLA module in the plane orthogonal to the height direction are determined such that the maximum height variation of the substrate corresponding to the size of the MLA module is within the DOF. For example, the dimensions of a MLA module may be 10 mm*10 mm (specifically of the microlens array adjacent the substrate). Given a substrate height variation of 80 nm per lateral mm, a maximum height variation of the corresponding substrate is 10 mm*80 nm/mm=0.8 µm, which is well below the DOF of 3-5 µm. So, by operating one or more actuators to adjust the height and/or tilt of the individually addressable elements collectively relative to the substrate (e.g., within 20 µm with 0.5 µm precision), the relative position between the focus of the individually addressable elements of the MLA and the substrate can be precisely controlled within the DOF. Of course, the MLA module may have other suitable dimensions as long as the maximum height variation of the corresponding portion of the substrate is within the DOF. Further, since the patterning device may comprise a plurality of such MLA modules (e.g., 500-2500 MLA modules), the focus for the patterning device can be controlled within the DOF by precisely controlling each MLA module of the patterning device using the method described herein, e.g., one or more MLA modules can be controlled independently of one or more other MLA modules.

Additionally or alternatively to addressing focus, alignment between MLA modules may also need to corrected. That is, for example, one or more MLA modules may not be properly aligned (e.g., at initial setup or over time) relative to one or more other MLA modules. Accordingly, the one or more high precision actuators may be used to adjust the position in X and/or Y directions of a MLA module relative to another MLA module.

Figure 14:
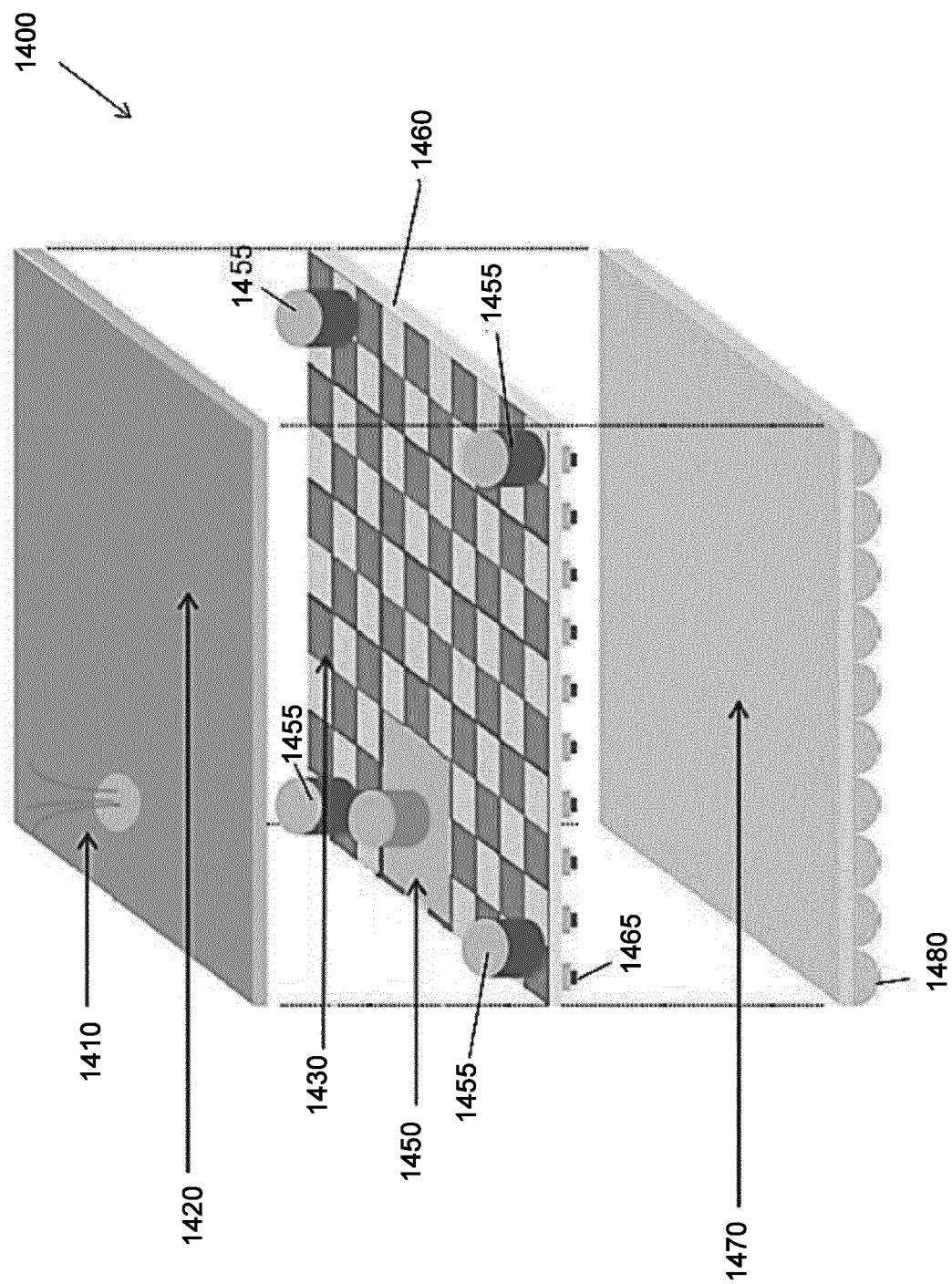
FIG. 14 depicts a schematic diagram of a micro-lens array (MLA) module according to an embodiment.

Referring to FIG. 14, a highly schematic view of a disassembled MLA module 1400 is depicted. The MLA module 1400 may be similar to the MLA modules 730 and 930. The MLA module 1400 comprises a microlens array (MLA) 1470, an electronics board 1460, and a structure 1420.

As shown, the MLA 1470 comprises a plurality of lenses 1480 arranged in a square array (of course, a different arrangement may be provided). In an embodiment, each lens 1480 has a width (e.g., diameter) of 1 mm. Each lens 1480 is configured to project beams from an associated emitter array 1465 to the substrate (not shown).

A plurality of emitter arrays 1465 is located on a (bottom) surface of the electronics board 1460. In an embodiment, the number of lenses 1480 equals the number of emitter arrays 1465. Each emitter array 1465 comprises a plurality of individually addressable elements as described above. In an embodiment, the individually addressable elements are LEDs. In an embodiment, the MLA 1470 is attached to the plurality of emitter arrays 1465, e.g., attached to the electronics board 1460.

One or more high precision actuators 1455 are located between the electronics board 1460 and the structure 1420. As shown in FIG. 14, four actuators 1455, for example, are located at the corners of the electronics board 1460; in an embodiment, less or more actuators may be provided and provided at one or more different locations (e.g., an actuator may be located in a central portion). The one or more actuators 1455 have a tuning range of, e.g., 20 µm with 0.5 µm precision. By tuning the one or more actuators 1455, the focuses of the plurality of emitter arrays 1465 and the associated lenses of the MLA 1470 may be collectively adjusted accordingly. For example, the one or more actuators 1455 can move the plurality of emitter arrays 1465 and the associated lenses of the MLA 1470 in the Z direction shown to, for example, enable focus adjustment. Further, in an embodiment, the one or more actuators 1455 can additionally or alternatively, move the plurality of emitter arrays 1465 and the associated lenses of the MLA 1470 around the X and/or Y directions shown to, for example, enable focus adjustment. Further, in an embodiment, the one or more actuators 1455 can additionally or alternatively, move the plurality of emitter arrays 1465 and the associated lenses of the MLA 1470 in the X and/or Y directions shown to enable, e.g., alignment of the plurality of emitter arrays 1465 and the associated lenses of the MLA 1470 relative to another plurality of emitter arrays and associated lenses of another MLA. While the structure 1420 is shown as covering the electronics board 1460, it need not do so.

In an embodiment, the electronics board 1460 further comprises a plurality of local memories 1430 and a local processing unit 1450. In an embodiment, the local memories 1430 are configured to store the data path signals (or other control signals) which cause the local processing unit 1450 to control each individually addressable elements of the plurality of emitter arrays 1465 in the MLA module 1400 (e.g., turning "ON" or "OFF" each individually addressable element). Certain control signals may cause the local processing unit 1450 to automatically tune the one or more actuators 1455 to control the focuses of the MLA module 1400 and/or the alignment of the MLA module 1400 relative to another MLA module.

The structure 1420 is coupled to the electronics board 1460 via the one or more actuators 1455. In an embodiment, the structure 1420 comprises an interface 1410 configured to couple the data path signals or other control signals from one or more external controllers to the local processing unit 1450 and/or the one or more actuators 1455. In an embodiment, the interface 1410 is further configured to couple the local processing unit 1450 and/or the individually addressable elements and/or the one or more actuators 1455 to an external power source (not shown), which provides electrical power to the processing unit 1450 and/or the individually addressable elements and/or the one or more actuators 1455.

As will be apparent from the above, in order to properly project the radiation beams of the MLA modules (e.g. modules 730, 930, 1400) as e.g. applied in an embodiment of the exposure apparatus onto a substrate, a substantial amount of data transfer and data processing is required. More specifically, in order to form the pattern on the substrate, it is necessary to set the patterning device to the requisite state at each stage during the exposure process. Therefore control signals, representing the requisite states, must be transmitted to the patterning device. Desirably, the exposure apparatus thus includes a control system or processing system that generates the control signals. Within the meaning of the present invention, the data transfer load may either refer to the total amount of data that is to be transferred and/or to a peak load of data that is to be transferred.

The present invention aims to provide in a more effective distribution of the required processing load of such a processing system, that enables to reduce the required data transfer load, i.e. either the total amount of data that is to be transferred or a peak load of the data that is to be transferred. In order to realise this, the processing system as applied in an embodiment of the present invention is a distributed processing system. In particular, the exposure apparatus comprises a distributed processing system that is configured to process projection related data to enable the projection of the desired pattern onto the substrate, whereby the distributed processing system comprises at least one central processing unit and a plurality of module processing units that are associated with respective plurality of radiation source modules, e.g. the MLA modules as described above. By distributing the required processing of data, a data transfer load can be reduced.

The exposure apparatus according to the present invention is provided with a plurality of radiation source modules, e.g. arranged in a one- or two-dimensional array. Examples of such radiation source modules, are the MLA modules 730, 930, 1400 as described above, which typically comprise a plurality of radiation sources, such as the optical engine components as described above. Within the meaning of the present invention, a radiation source module thus refers to a set of radiation sources that are grouped in a unit and which are arranged to expose a particular region on a substrate during a scanning exposure. In an embodiment, the module may contain a two-dimensional array of radiation sources, e.g. optical engine components as described above.

Figure 15:
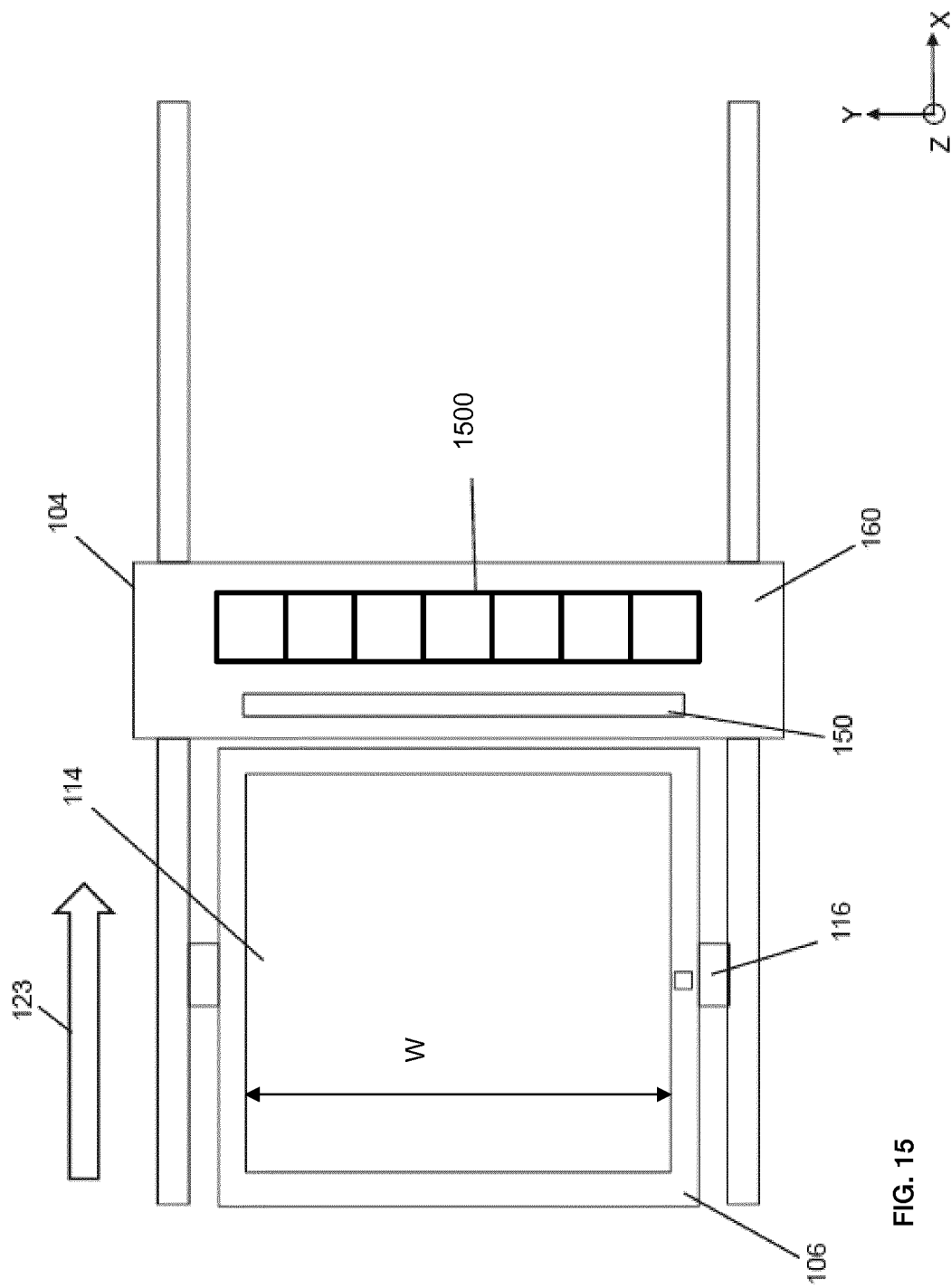
FIG. 15 depicts a schematic top view of a part of a patterning apparatus according to an embodiment.

FIG. 15 schematically shows a top view of an exposure apparatus according to the present invention having a patterning device 104 comprising a plurality of radiation sources; the radiation sources, e.g. the optical engine components as described above, being grouped in modules 1500, in particular in an array of radiation source modules 1500 substantially spanning a width W of the substrate 114 that is to be exposed. The apparatus further comprises a measurement system 150 and a positioning device 116 for displacing the substrate 114 in the scanning direction 123 and for accurate positioning the substrate 114 relative to the patterning device 104.

In a embodiment, a radiation source module, such as the MLA modules 730 or 930, may e.g. span a width of e.g. a few cm along the width W of the substrate. The choice of the size of the radiation source module, or the number of radiation sources that are grouped into a module, may be based on expected height variations of the substrate and on the available depth of focus of the modules, as e.g. described above.

In an embodiment, there may be multiple arrays of radiation source modules, such as the modules 930, e.g. as shown in FIG. 9E. The radiation source modules may have a hexagonal outline.

Within the meaning of the present invention, exposing the substrate to a desired pattern of radiation involves both:
1. The generation of the desired pattern to be projected onto the substrate and
2. Projecting the desired pattern on the desired location on the substrate.

The data that needs to be processed to arrive at this exposing of the substrate to a desired pattern of radiation may be referred to as projection related data.

Step 1 as indicated above, i.e. the generation of the desired pattern, may involve, within the meaning of the present invention, the following steps:
a) Receiving a (mathematical) description of the desired pattern that is to be exposed;
b) Converting the data describing the desired pattern into data describing the desired radiation to be generated by each of the radiation source modules, as a function of the relative position of the substrate and the module;
c) Converting the data describing the desired radiation per module into commands or control signals for controlling the individual emitters of the module.

The (mathematical) description of the desired pattern as referred to in step a) may e.g. be provided to the lithographic apparatus in a vector-defined format e.g., GDSII. Such data, also referred to as the pattern related data or design information, may thus be considered the input data for the distributed processing system. As such, in an embodiment, the pattern description data is provided to the exposure apparatus via an input terminal of the central processing unit of the distributed processing system. In order to convert the design information into the commands or control signals for controlling the individual emitters of the module, the distributed processing system includes at least one central processing unit and a plurality of module processing units associated with respective plurality of radiation source modules. Such central processing units or module processing units may be considered data manipulation devices, each configured to perform a processing step on a data stream. Within the meaning of the present invention, the processing units or data manipulation devices may collectively be referred to as the "data path".

Figure 16:
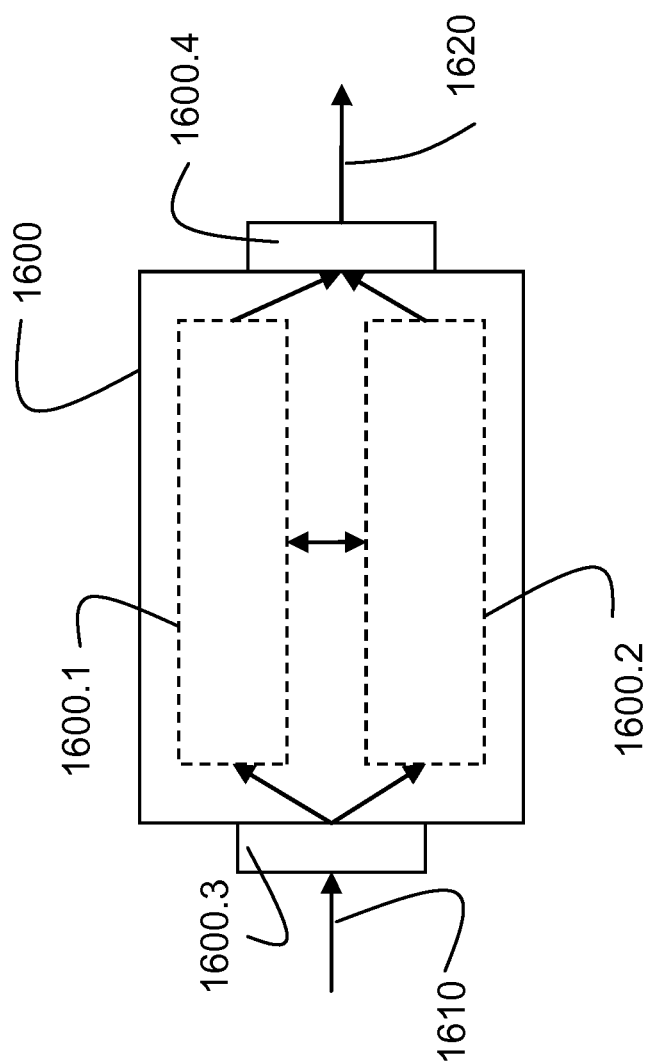
FIG. 16 depicts a processing unit as can be applied in an exposure apparatus according to an embodiment.

FIG. 16 schematically shows a possible structure of a processing unit as can be applied in the present invention, e.g. either as a central processing unit or a module processing unit. In FIG. 16, a processing unit 1600 as can be applied in an exposure apparatus according to the present invention, is schematically shown. A processing unit 1600 as applied in the present invention may e.g. comprise a processor 1600.1, a microprocessor, a computer or the like for processing data such as the output signals received. In an embodiment, the processing unit may further comprise a memory 1600.2 or memory unit for storing data such as any received signals, e.g. from a measurement system or received data. In the embodiment as shown, the processing unit 1600 comprises an input terminal 1600.3 for receiving data or signals 1610 and an output terminal 1600.4 for outputting a signals or data 1620, e.g. data or signals obtained after being processed by the processor 1600.1 of the processing unit 1600. Communications paths may be provided inside the processing unit 1600 (indicated by the arrows) between the input and output terminals 1600.3, 1600.4 and the processor and memory unit 1600.1, 1600.2.

Steps b and c as indicated above involve the processing of the pattern related data, i.e. the (mathematical) description of the pattern into commands or control signals for controlling the individual emitters of a radiation source module. Such commands may e.g. be formulated as an array of set points indicating whether or not a particular individual emitter should be turned on or not and the desired intensity. In an embodiment of the present invention, the processing steps b and c may be performed by the central processing unit of the distributed processing system, such a central processing unit e.g. having the structure as shown in FIG. 16. In such embodiment, the processing steps b and c may thus be primarily be performed by a central processing unit of the distributed processing system. In this respect, it can be pointed out that, in order to arrive at a control signal for controlling the individual emitters, the actual physical performance of each emitter should be taken into account. Such data may typically be obtained via a calibration process to determine, for each of the individual emitters applied in a particular module, how a desired radiation set point may be achieved. Such data may e.g. be referred to as intensity calibration data, indicating, for the individual emitters, an obtained intensity as a function of the applied control signal, the control signal e.g. representing a desired current supplied to the particular emitter. As such, step c as indicated above may typically involve taking account of calibration data such as the intensity calibration data, of the individual radiation sources to arrive at the required control signals. In an embodiment, the calibration data may also involve variations observed in the emitted spectrum or wavelength of the individual emitters. As this wavelength or spectrum may e.g. affect the interaction with the material of the substrate, a variation of the emitted spectrum, e.g. a deviation from an expected spectrum, as observed may be taken into account by adjusting the intensity.

As an alternative to the processing of such calibration data by the central processing unit, an embodiment of the present invention decentralises this processing and performs the conversion of a desired or required set point to a control signal for the emitter on a local level, in particular on a module level. In such an embodiment, the central processing unit may be configured to convert the description of the desired pattern into a description of the desired radiation to be generated by each of the radiation source modules, as a function of the relative position of the substrate and the module, i.e. perform step b as indicated above, resulting in a set point (describing the desired radiation) for each radiation source. The central processing unit may then be configured to output this set point (either in real time or in advance), for each of the radiation sources to the required radiation source module, in particular to an input terminal of the module processing unit associated with the required radiation source module, whereupon the module processing unit may be configured to convert the set points as received, i.e. describing the desired radiation for the emitters of the module into commands or control signals for controlling the individual emitters of the module, i.e. substantially performing step c as indicated above. In order to do so, the module processing unit may e.g. make use of calibration data for the associated radiation source module, said data e.g. being stored in a memory unit of the module processing unit.

Figure 17:
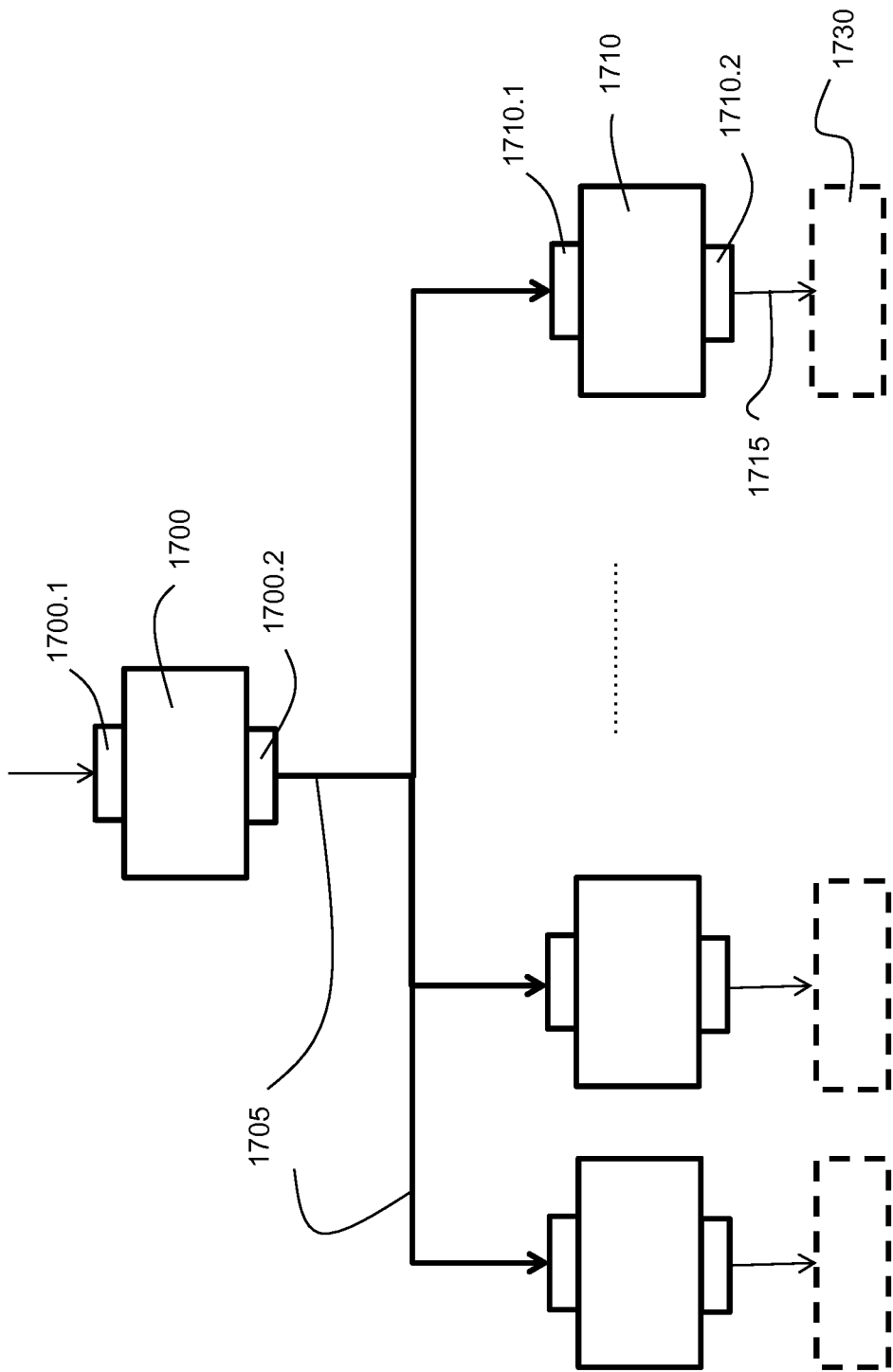
FIG. 17 depicts a distributed processing system as can be applied in an exposure apparatus according to an embodiment.

In such embodiment, the processing steps b and c as indicated above are thus distributed over the central processing unit and the module processing units, as is schematically illustrated in FIG. 17. FIG. 17 schematically shows a central processing unit 1700 comprising an input terminal 1700.1 and an output terminal 1700.2, the central processing unit 1700 being configured to provide commands and/or data 1705 to a plurality of module processing units 1710, the module processing units having an input terminal 1710.1 for receiving the commands and/or data from the central processing unit 1700 and an output terminal 1710.2 for outputting commands and/or data 1715, e.g. control signals for controlling the radiation source modules 1730 associated with the module processing units 1710.

In an embodiment of the present invention, the central processing unit 1700 may thus be configured to at least partly process the pattern related data, e.g. pattern layout data 1650 in a vector-defined format such as GDSII by:
receiving, at the input terminal 1700.1, as the pattern related data, pattern layout data indicative of the desired pattern that is to be projected onto the substrate;
process the pattern layout data, e.g. in an processor of the processing unit 1700, by converting the pattern layout data to radiation set point data for each of the radiation source modules; and
provide the radiation set point data, via the output terminal 1700.2 to the module processing units 1710 associated with the respective radiation source modules 1730.

In such embodiment, the plurality of module processing units 1710 may then be configured to process the radiation set point data 1705 as received from the central processing unit 1700 by converting the radiation set point data to radiation source control signals 1715 for the respective plurality of radiation source modules 1730.

In such embodiment, the module processing units 1710 may e.g. comprise respective memory units for temporarily storing the radiation set point data as received. In addition, in an embodiment of the present invention, the memory units of the module processing units may comprise the aforementioned calibration data of the associated radiation source module, thus enabling the module processing unit 1710 to determine the appropriate control signals 1715 based on the calibration data.

Alternatively, in an embodiment of the present invention, both steps b and c as indicated above may be performed by the module processing units, e.g. based on the pattern related data, e.g. the pattern layout data. In such embodiment, the central processing unit may e.g. receive pattern layout data and distribute it to the module processing units, the module processing units processing the received pattern layout data to radiation set point data for their respective radiation source module.

In an embodiment of the present invention, the data transfer load is reduced by making use of a compression of the data that is to be transferred, e.g. making use of any known method of data compression, in particular lossless data compression methods. Preferably, the data compression and decompression methods should require little computation effort or load, thus enabling to meet any real time requirements for data transport and possibly reducing processor complexity, thus reducing costs and heat load. In such embodiments, the central processing unit 1700 of the exposure apparatus may be configured to:

- receive, at the input terminal 1700.1, as the pattern related data, pattern layout data indicative of the desired pattern that is to be projected onto the substrate;
- compress the pattern layout data into compressed pattern layout data, e.g. data 1705 as shown in FIG. 17 and provide to compressed pattern layout data, e.g. via the output terminal 1700.2, to the module processing units 1710.

In such an embodiment, the module processing units 1710 associated with the radiation source modules 1730 may be configured to process the compressed pattern layout data by:

- decompressing the compressed pattern layout data as received, e.g. via the input terminal 1710.1;
- converting the pattern layout data to radiation set point data for the respective radiation source module;
- converting the radiation set point data to radiation source control signals for the radiation source module.

In an embodiment of the present invention, the data transfer load is thus reduced by making use of a compression of the data that is to be transferred to the module processing units, by the central processing unit 1700, and decompressing the compressed data by the module processing units 1710. As will be clear to the skilled person, this measure to reduce the data transfer load may be combined by the aforementioned measure to perform the conversion indicated as step c by the module processing unit, thus further reducing the data transfer to the radiation source modules.

In an embodiment of the exposure apparatus according to any preceding claim, the module processing units 1710 may be integrated in the respective radiation source modules 1730.

Step 2 as indicated above, i.e. projecting the desired pattern on the desired location on the substrate involves the accurate positioning of the substrate relative to the radiation source modules. In general, in order to ensure proper operation of the device that is being manufactured by the exposure apparatus, the desired pattern needs to be projected at the appropriate in plane location on the substrate, i.e. at the appropriate position in the XY-plane as shown in FIGS. 2, 3 and 15. In particular, in order to ensure proper operation of the device that is made, the pattern as projected may need to be aligned to a previously applied pattern on the substrate. In addition to a proper alignment in the XY-plane, a proper positioning of the substrate relative to the radiation source modules in the Z-direction may be required as well, in order to keep the substrate in or near the focal plane of the radiation source modules, such as modules 730, 930, 1400, 1500 or 1730.

With reference to FIG. 14, an embodiment of the present invention provides in controlling an appropriate match between the focal plane or focuses of the radiation source module, i.e. the MLA module 1400, and the surface of the substrate by controlling a position of the focal plane or focus of the MLA using high precision actuators 1455 incorporated in the radiation source module 1400.

Alternative or additional embodiments for controlling a focus position of the modules and controlling an appropriate alignment in the XY-plane will now be discussed.

In an embodiment, as e.g. shown in FIGS. 2, 3 and 15, the exposure apparatus according to the present invention comprises a positioning device, such as positioning device 116 as described above, which can be used to displace and position the substrate 114 relative to the patterning device 104. In order to accurately position the substrate relative to the patterning device, an embodiment of the present invention comprises a measurement system, such as the level sensor/alignment sensor 150 shown in FIGS. 2, 3 and 15 configured to measure a geometric property of the substrate. Examples of such geometric properties are:

- a position of a previously applied pattern or layer on the substrate;
- a position of markings, features or structures on the substrate, the markings, also referred to as alignment marks, being indicative for a desired location of the pattern to be projected;
- a height position of the substrate relative to the patterning device.

The latter geometric property of the substrate may e.g. be used to control the relative position of the substrate and a focal plane of the radiation source modules, whereas the former geometric properties, the positions of a previously applied pattern or layer or markings, may e.g. be used to control an in-plane position of the substrate relative to the radiation source modules.

Within the meaning of the present invention, the measurement data as obtained from such a measurement system is referred to as substrate related data, as it relates to a geometric property of the substrate. In an embodiment of the present invention, the processing of at least part of the substrate related data is performed by a dedicated processing unit, e.g. a processing unit that is separate from the central processing unit, such as the central processing unit 1700, of the distributed processing system.

In an embodiment of the present invention, the measurement system 150 comprises a height measurement system such as the level sensor as described above. In such embodiment, the height measurement system may comprise an array of height sensors, e.g. arranged parallel to the array of radiation source modules comprising the individually addressable elements. In such embodiment, the array of height sensors may be configured to generate one or more height signals representative of a height of the substrate along the array of radiation source modules. The height measurement system may further comprise, as part of the distributed processing system of the exposure apparatus, a height processing unit configured to process the height signals of the array of height sensors. Such a height processing unit may e.g. have the same or similar structure as the processing unit 1600 of FIG. 16.

Based on the height signals of the array of height sensors, the height processing unit may e.g. determine one or more control signals for controlling a positioning device of the apparatus, e.g. positioning device 116 as shown in FIGS. 2, 3 and 15.

In particular, based on the height signals as obtained from the height measurement system, the height processing unit may determine a height profile of the substrate, in particular at or near locations where the pattern is to be projected. Using such a height profile, the height processing unit may determine control signals to control a height of the substrate, e.g. by actuation of the positioning device 116, in order to maintain the substrate in a focal plane of the patterning device. Such an arrangement implies that the positioning device 116 includes one or more actuators for positioning the substrate, e.g. substrate 114 of FIGS. 2, 3 and 16, in the Z-direction. Alternatively, or in addition, the distance between the substrate and the pattering device 104 may also be adjusted by adjusting a position of the patterning device 104. As such, rather than positioning the substrate in the Z-direction by means of the positioning device, the patterning device 104, in particular the radiation source modules such as modules 730, 930, 1400, 1500 or 1730, may be displaceably mounted relative to the base 136 of the apparatus, e.g. via one or more actuators. In such an arrangement, the radiation source modules may be mounted to a common frame, whereby the frame may be positioned by means of one or more frame actuators, in the Z-direction, in order to maintain the substrate into focus during the projection of the pattern. In such an embodiment, the height processing system may thus be configured to determine, based on the received height signals, one or more control signals for controlling the one or more frame actuators, thereby controlling a relative position of the substrate and the patterning device.

Using the positioning device 116 or the one or more frame actuators may enable to control a relative position of the substrate and the patterning device in the Z-direction, by translating the patterning device 104 or the substrate in the Z-direction, and/or by rotating the patterning device 104 or the substrate about an axis parallel to the scanning direction.

As will be appreciated by the skilled person, controlling the relative position of the substrate and the patterning device in the Z-direction, by translating the patterning device 104 or the substrate 114 in the Z-direction, and/or by rotating the patterning device 104 or the substrate 114 about an axis parallel to the scanning direction only provides in a coarse, first order matching between the surface of the substrate 114 and the focal plane of the patterning device 104.

In order to more accurately match the focal plane of the radiation source modules with the local height of the substrate, high precision actuators as discussed above with reference to FIG. 14 may be used to adjust the height and/or tilts of the radiation source module as a unit, thereby collectively adjusting a height and/or tilts of the individually addressable elements of the radiation source module. Examples of such actuators, also referred to as module actuators, may e.g. by piezo-electric, magneto-strictive, or electromagnetic actuators.

As such, in an embodiment of the present invention, the radiation source modules comprise one or more module actuators configured to adjust a height and/or tilt of the module, in order to adjust a position of the focal plane of the module to a height of the substrate as determined by the height measurement system.

In such embodiment, the height measurement system, in particular the height processing unit of the height measurement system, may be configured to process the height signals of the array of height sensors and determine, based on the height signals as received, control signals for each of the module actuators of the radiation source modules.

As an alternative to array of height sensors, a single sensor may be applied, the sensor e.g. being configured to scan the substrate height along the width of the substrate. As yet another alternative, a measurement beam, e.g. a flow of air, of an air gauge arrangement may also be applied as a height sensor.

In an embodiment of the present invention, the height signals as provided by the height measurement system need not be processed by the height measurement system but are provided to the radiation source modules, in particular to the module processing units that are associated with respective plurality of radiation source modules. In such an arrangement, the module processing units may be configured to receive the height signals (or a selection thereof) from the height measurement system and process them to determine control signals for the module actuators of the associated radiation source module.

In the embodiment as described, the module actuators may be external to the module and configured to displace the module as a unit.

The above described options to position the radiation source modules relative to the substrate in order to maintain the substrate surface within the depth of focus of the modules may be applied in addition or as an alternative to the embodiment as described with reference to FIG. 14. In the embodiment described in FIG. 14, the high precision actuators are used to displace the emitter arrays 1465 and/or the associated lenses of the MLA 1470 to realise an adjustment of the focal plane of the MLA module 1400.

In the embodiments as described above, various options are discussed to control a relative Z-position of the substrate and the plurality of radiation source modules. As explained, the required data processing of the height signals may be performed by a dedicated processing unit such as the height processing unit or by the module processing units. In addition, it may be advantageous to also provide the height signals to the central processing unit. In such embodiment, the central processing unit may e.g. process the set of height signals as a whole. Such processing may e.g. include determining an average height level of the substrate over the width W of the substrate. Such an average height of the substrate may e.g. be used to control the positioning device 116 or the aforementioned frame actuators to control the relative position of the substrate and the radiation source modules as a whole. By doing so, the required operating range of the high precision actuators 1455 or module actuators, which provide in a positioning of the focal plane or focus relative to the local substrate height, may be reduced.

Such positioning may thus be considered a two-stage positioning to match the focus of the individual radiation source modules to the substrate surface, whereby the positioning device 116 or the frame actuators provide in a coarse positioning and the high precision actuators 1455 or the module actuators provide in a fine positioning. Such a two-stage positioning may also be referred to as a long stroke/short stroke positioning whereby the frame actuators are configured to displace the radiation source modules over a longer stroke than the high precision actuators or module actuators. In an embodiment of the present invention, the processing of data to realise this two-stage positioning is distributed using a distributed processing system, whereby the height signals are processed by the central processing unit to generate the required control signals to realise the coarse positioning and whereby the height signals are processed by either the height processing unit or the module processing units to generate the required control signals to realise the fine positioning.

In an embodiment of the present invention, the central processing unit may process the height signals to assess whether or not there are any outliers or discrepancies in the height signals, which could be indicative of a measurement error. Such outliers or discrepancies may e.g. be detected by comparing the individual measurements to an average of the measurements or a curve fitted through the measurements. When such an indication of a measurement error is noticed, the central processing unit may be configured to filter out this outlier and provide a corrected height signal to the module processing unit involved.

Alternatively, or in addition, an assessment whether or not the height signals as received by a particular module processing unit are correct, can be made on a local level, i.e. on module level, as well. This can e.g. be realised by providing the module processing unit with additional height signals intended to be processed by one or more adjacent modules. By comparing these height signals, discrepancies or outliers in the measurements can be detected and corrected for, e.g. by filtering.

Figure 18:
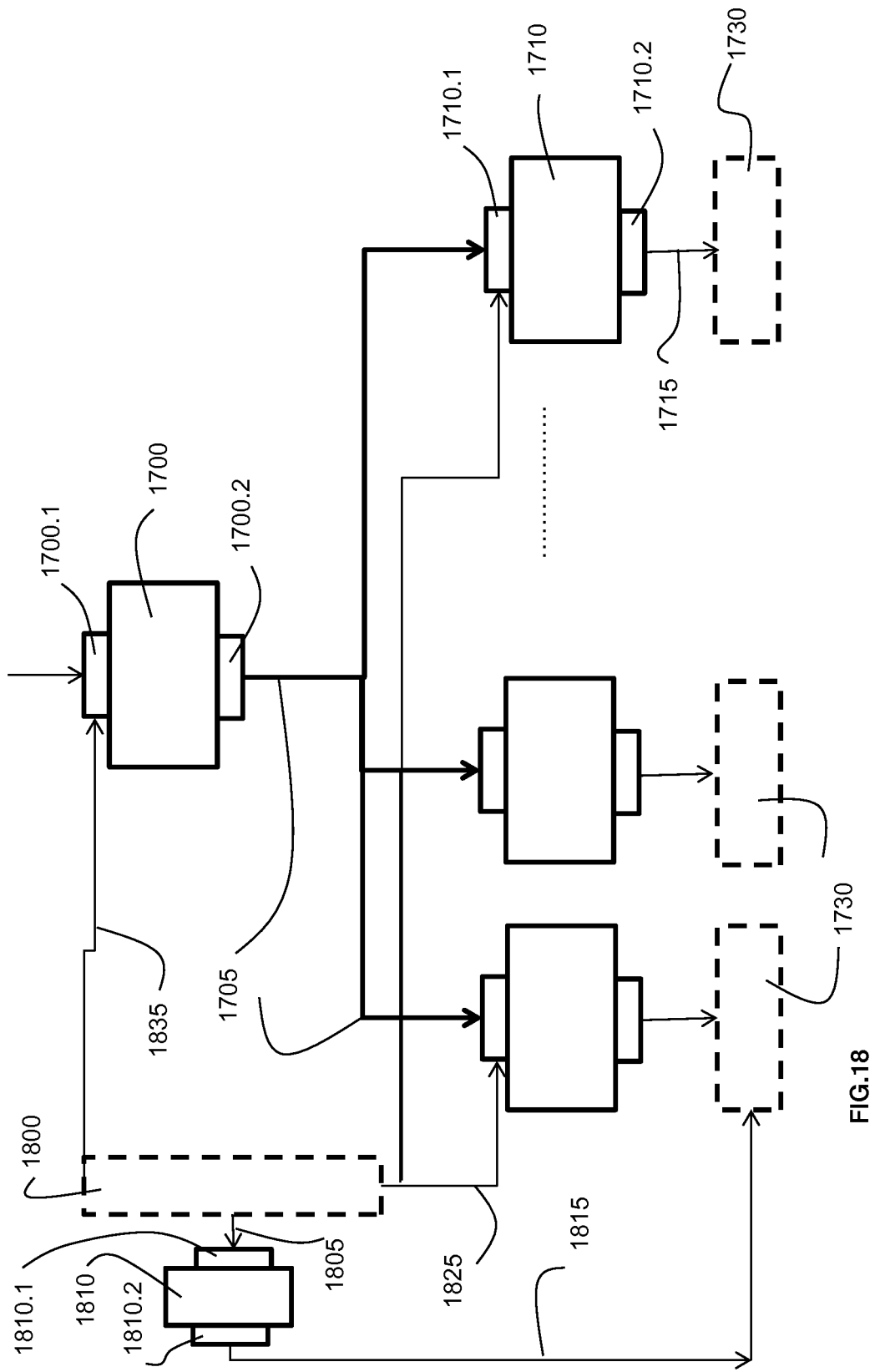
FIG. 18 depicts another distributed processing system as can be applied in an exposure apparatus according to an embodiment.

The possible flow and processing of data as applied in the embodiments of the present invention that include a height measurement system are schematically illustrated in FIG. 18.

FIG. 18 schematically shows, in addition to the distributed processing system of FIG. 17, a height measurement system 1800 and an associated height processing unit 1810, the height processing unit having an input terminal 1810.1, e.g. to receive height signals 1805 as measured by the height measurement system 1800.

In such an embodiment, the height processing unit 1810 may be configured to:
determine, based on the received one or more signals 1805, one or more control signals 1815 for the respective radiation source modules 1730, in particular for the high precision actuators and/or module actuators of the modules, to control a relative position of the focus or focal plane of the radiation source module and the substrate;
output, via an output terminal 1810.2 of the height processing unit 1810, the control signals 1815 to the radiation source modules 1730.

In addition or as an alternative, the one or more height signals may also be provided to the module processing units 1710, as indicated by reference number 1825. In such an arrangement, the module processing units 1710 may be configured to process the height signals 1825 and determine the required control signals for controlling the radiation source modules 1730.

In addition, the height signals as generated by the height measurement system 1800 may also, as described above, be provided to the central processing unit 1700, as indicated by reference number 1835, e.g. to determine the required control signals for a coarse positioning of the patterning device relative to the substrate or to perform diagnostics on the measurement data, e.g. to detect measurement errors in the data.

In an embodiment of the present invention, the exposure apparatus according to the present invention comprises a measurement system 150 to facilitate the in plane positioning of the substrate 114 and the patterning device 104, i.e. a relative positioning of the substrate and the pattering device, in particular the radiation source modules, in the XY-plane. In order to realise this, the measurement system 150 may comprise a pattern position measurement system, i.e. a measurement system that is configured to determine an in-plane position of previously applied pattern or pattern portion or a marking on the substrate. As an example of such a pattern position measurement system is an alignment system or alignment sensor as described above.

In general, such a pattern position measurement system can make use of any measurement principle to determine the position of a marking or part of a pattern. Such measurement principles e.g. include image based measurement, thereby capturing an image of the substrate or a portion thereof and determining, using pattern recognition functionality/software, a position of the relevant feature. As another example, a measurement beam may be projected at an oblique angle to the substrate and the reflected beam may be assessed to determine a feature's position.

In an embodiment, the pattern position measurement system may be configured to observe the position of an edge of a pattern already present on the substrate. This edge position data, in general, the pattern position data, may be applied by the distributed processing system to determine the required position of the pattern to be projected, in order to obtain a proper alignment of the projected pattern and the pattern that is already present. In this respect, it should be pointed out that, due to processing and handling of the substrate, there may a discrepancy between the actual position of the pattern and the expected position of the pattern, i.e. due to the processing and handling of the substrate, the pattern on the substrate may have been deformed.

Figure 19:
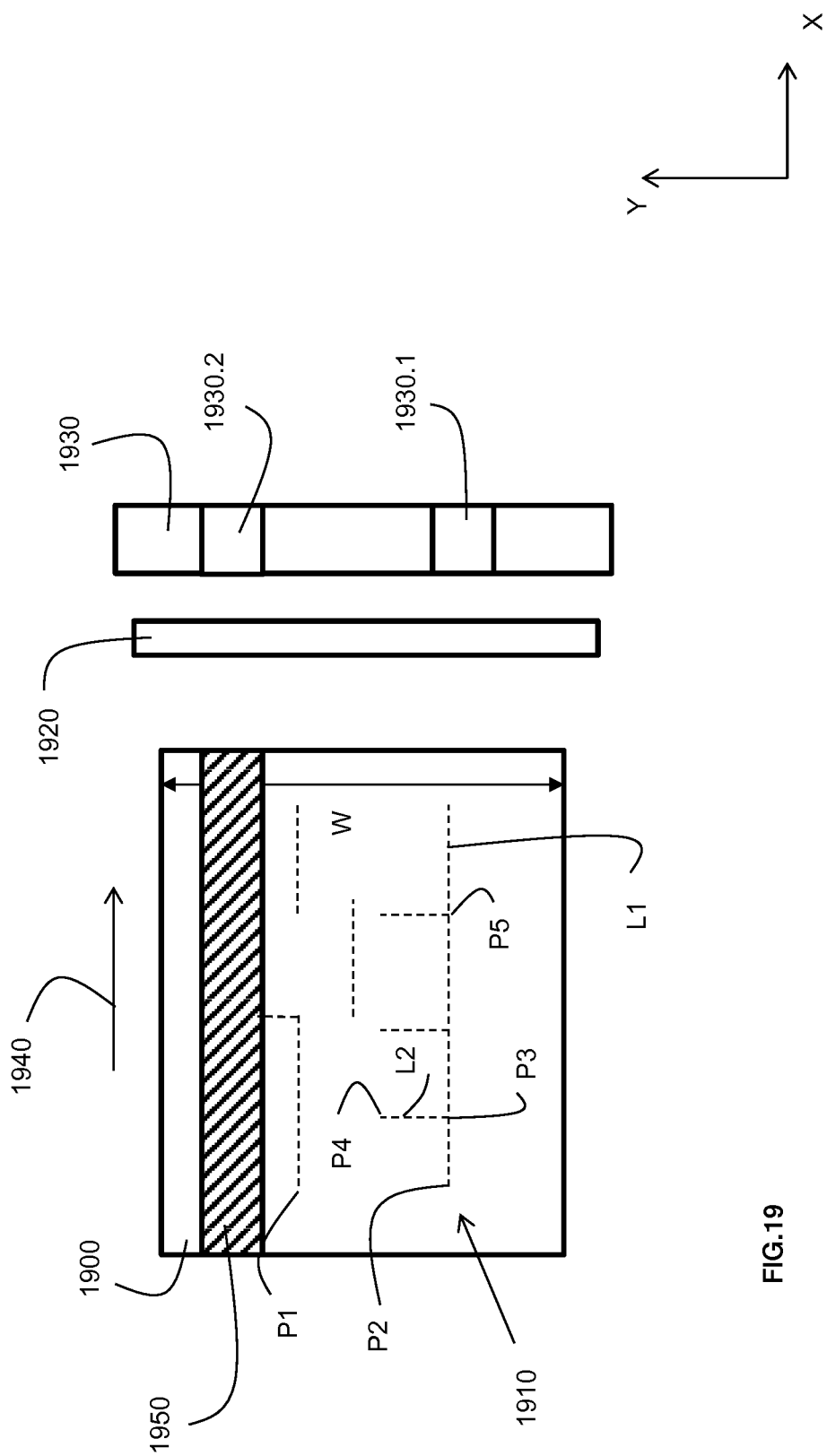
FIG. 19 depicts a schematic top view of a substrate and a part of a patterning apparatus according to an embodiment.

FIG. 19 schematically depicts a top view of part of an exposure apparatus according to the present invention and a substrate mounted thereto. FIG. 19 schematically shows a substrate 1900 including (in the dotted lines 1910), fragments of a pattern that is present on the substrate. FIG. 19 further schematically shows a pattern position detection system 1920 configured to determine a position of the pattern that is present on the substrate 1900 and an array of radiation source modules 1930 configured to project a pattern onto the substrate 1900. Preferably, the pattern position measurement system 1920 is configured to measure a position of the pattern at a plurality of positions both along the width W of the substrate and along the length of the substrate. By comparing the measurement positions of particular pattern portions or markings to the expected positions, a deformation of the substrate may be determined and the projection of the pattern that is to be applied can be adjusted. In this respect, use can be made of both absolute positions of markings or pattern portions and of relative positions as determined between markings and pattern portions. As an example, assume that position measurements of the end points P1, P2, P3, P4, P5 have been made, e.g. by using the pattern position measurement system 1920 when the substrate 1900 is scanned (in the direction 1940) underneath the measurement system 1920. Measurements P2, P3 and P5 can be used to determine the position of line L1, which may need to be 'followed' by a particular radiation source module 1930.1 of the array 1930. A difference between measurements P3 and P4 may be indicative of a deformation of line L2. Such deformations may e.g. include a displacement of the pattern, or a portion thereof, or a distortion of the shape of the pattern, or a (de)magnification of the pattern, or a combination thereof.

In an embodiment of the present invention, the pattern position measurement system is configured to measure a position of the previously applied pattern during the exposure or projection of the pattern to be applied. In such an arrangement, the pattern position measurement system may be configured to measure the position of the pattern that is present at a plurality of positions along the array of radiation source modules thereby generating a plurality of pattern position signals. The processing of such signals may be performed, in an analogue manner as the processing of the height signals of the height measurement system. In particular, the pattern position measurement system may, in an embodiment, be provided with a pattern position processing unit that is configured to receive the pattern position signals, e.g. at an input terminal of the pattern position processing unit and determine, based on the received pattern position signals, control signals for the radiation source modules. Alternatively or in addition, the pattern position signals may also be provided to the central processing unit. In an embodiment, the central processing unit may e.g. be configured to use the pattern position signals to adjust the set point data for the radiation source modules.

In accordance with the present invention, there are various manners to control the radiation source modules to project the desired pattern onto the desired location, i.e. to keep the projected pattern aligned with the pattern or markings already present on the substrate.

In an embodiment, the projection of the desired pattern can be made to follow the pattern that is already present by adjusting the pattern itself, i.e. by adjusting the pattern that is projected by each of the radiation source modules. In general, each of the radiation source modules is arranged to project a pattern onto a certain region of the substrate. This is schematically illustrated in FIG. 19, where radiation source module 1930.2 is configured to expose or project a pattern onto the region 1950 of the substrate 1900. As discussed above, it may be advantageous to ensure that there is some overlap between the regions that are exposed by the different radiation source modules. Such an overlap may also be advantageously applied to account for a deformation of the pattern, e.g. a lateral displacement (along the Y-axis) of the pattern. As such, the radiation source modules may be provided with set point data for the individual emitters that spans a width that is wider than the region that needs to be exposed. In such embodiment, in case it is noticed that the pattern already present is e.g. shifted in the Y-direction, the radiation source module may still have the appropriate set point data to project the appropriate pattern onto the region it is intended to expose. In such an embodiment, there is thus no adjustment of the actual region onto which each radiation source module is projecting a pattern; only the pattern itself is adjusted, based on the pattern position measurements.

In another embodiment, the radiation source module is configured to adjust the region onto which the pattern is projected, rather than adjusting the pattern itself. In such an embodiment, the radiation source modules may e.g. be provided with actuators, similar to the module actuators or the high precision actuators as described above that can displace the radiation source module, such that the pattern to be projected is projected onto the appropriate location, the appropriate location being determined based on the pattern position measurements. In an embodiment, the radiation source modules may e.g. be equipped with one or more actuators to displace the radiation source module in the indicated Y or −Y direction, in order to take a displacement of the pattern that is already present into account. A similar displacement of the location where the pattern is projected may also be obtained by rotating the radiation source module about an axis parallel to the scanning direction 1940. In case corrections are required in the scanning direction, i.e. the X or −X direction, this may be accounted for by an appropriate timing of the control signals to the radiation source modules. Such a timing adjustment may e.g. be enabled by ensuring that data may be buffered, e.g. in a memory or memory unit of the module processing units associated with the radiation source modules.

In an embodiment of the present invention, the pattern position measurement, e.g. at a plurality of locations along the array of radiation source modules is performed prior to the projection of the pattern. In such an embodiment, the substrate is, in a first step, scanned by the pattern position measurement system, thereby obtaining pattern position data, which can be considered part of the substrate related data. This pattern position data may then be processed, e.g. by the central processing unit or a dedicated separate processing unit such as a pattern position processing unit as described above. Using the pattern position data, the central processing unit or the pattern position processing unit may determine a deformation of the pattern that is already present, i.e. the previously applied pattern. Using this deformation, the central processing unit may provide in a more accurate set point data for each of the radiation source modules, taking into account the deformation.

In an embodiment, the central processing unit or the pattern position processing unit may be configured to determine deformation patterns of the substrate, based on the pattern position data. In such embodiment, the deformation may e.g. be described as a combination of basic or modal deformation shapes, e.g. a magnification or de-magnification, a translation, etc.

In case the set point data that is provided to each of the radiation source modules already takes account of the actual position of the pattern and thus contains the required set point data for the nominal region, e.g. region 1950 in FIG. 19, onto which a particular radiation source module has to project a pattern, one can understand that the overlap in data that is provided to the radiation source modules can be reduced.

As such, by providing the radiation source modules with set point data that is already corrected for a deformation of the previously applied pattern, the data transfer load may also be reduced.

The processing units or data manipulation devices of the data path may be configured to perform one or more of the following functions: converting vector-based design information into bitmap pattern data (and then to a required radiation dose map (namely a required radiation dose profile across the substrate)) or to the required radiation dose map; converting a required radiation dose map into required radiation intensity values for each individually addressable element; and converting the required radiation intensity values for each individually addressable element into corresponding control signals.

In an embodiment, the control signals may be supplied to the individually addressable elements 102 and/or one or more other devices (e.g., a sensor) by wired or wireless communication. Further, signals from the individually addressable elements 102 and/or from one or more other devices (e.g., a sensor) may be communicated to the controller. In a similar manner to the control signals, power may be supplied to the individually addressable elements 102 or one or more other devices (e.g., a deflector and/or sensor) by wired or wireless means. For example, in a wired embodiment, power may be supplied by one or more lines, whether the same as the ones that carry the signals or different. A sliding contact arrangement may be provided to transmit power. In a wireless embodiment, power may be delivered by RF coupling.

While the previous discussion focused on the control signals supplied to the individually addressable elements 102 and/or one or more other devices (e.g., a deflector and/or a sensor), they should be understood to encompass in addition or alternatively, through appropriate configuration, transmission of signals from the individually addressable elements 102 and/or from one or more other devices (e.g., a sensor) to the controller. So, communication may be one-way (e.g., only to or from the individually addressable elements 102 and/or one or more other devices (e.g., a sensor)) or two-way (i.e., from and to the individually addressable elements 102 and/or one or more other devices (e.g., a sensor)).

In an embodiment, the control signals to provide the pattern may be altered to account for factors that may influence the proper supply and/or realization of the pattern on the substrate. For example, a correction may be applied to the control signals to account for the heating of one or more of the individually addressable elements 102, lenses, etc. Such heating may cause changed pointing direction of the individually addressable elements 102, lenses, etc., change in uniformity of the radiation, etc. In an embodiment, a measured temperature and/or expansion/contraction associated with an individually addressable element 102 and/or other element from, e.g., a sensor may be used to alter the control signals that would have been otherwise provided to form the pattern. So, for example, during exposure, the temperature of the individually addressable elements 102 may vary, the variance causing a change of the projected pattern that would be provided at a single constant temperature. Accordingly, the control signals may be altered to account for such variance. Similarly, in an embodiment, results from the alignment sensor and/or the level sensor 150 may be used to alter the pattern provided by the individually addressable elements 102. The pattern may be altered to correct, for example, distortion, which may arise from, e.g., optics (if any) between the individually addressable elements 102 and the substrate 114, irregularities in the positioning of the substrate 114, unevenness of the substrate 114, etc.

In an embodiment, the change in the control signals may be determined based on theory of the physical/optical results on the desired pattern arising from the measured parameter (e.g., measured temperature, measured distance by a level sensor, etc.). In an embodiment, the change in the control signals may be determined based on an experimental or empirical model of the physical/optical results on the desired pattern arising from the measured parameter. In an embodiment, the change of the control signals may be applied in a feedforward and/or feedback manner.

In an embodiment, the lithographic apparatus may comprise a sensor 118 to measure a characteristic of the radiation that is or to be transmitted toward the substrate by one or more individually addressable elements 102. Such a sensor may be a spot sensor or a transmission image sensor. The sensor may be used to, for example, determine the intensity of radiation from an individually addressable element 102, uniformity of radiation from an individually addressable element 102, a cross-sectional size or area of the spot of radiation from an individually addressable element 102, and/or the location (in the X-Y plane) of the spot of radiation from an individually addressable element 102.

In an embodiment, a controller is provided to control the individually addressable elements 102 and/or patterning device 104. For example, in an example where the individually addressable elements are radiation emitting devices, the controller may control when the individually addressable elements are turned "ON" or "OFF" and enable high frequency modulation of the individually addressable elements. The controller may control the power of the radiation emitted by one or more of the individually addressable elements. The controller may modulate the intensity of radiation emitted by one or more of the individually addressable elements. The controller may control/adjust intensity uniformity across all or part of an array of individually addressable elements. The controller may adjust the radiation output of the individually addressable elements to correct for imaging errors, e.g., etendue and optical aberrations (e.g., coma, astigmatism, etc.).

In an embodiment, patterning the radiation may be effected by controlling the patterning device 104 such that the radiation that is transmitted to an area of the resist layer on the substrate within the desired feature is at a sufficiently high intensity that the area receives a dose of radiation above the dose threshold during the exposure, whereas other areas on the substrate receive a radiation dose below the dose threshold by providing a zero or significantly lower radiation intensity.

In practice, the radiation dose at the edges of the desired feature may not abruptly change from a given maximum dose to zero dose even if set to provide the maximum radiation intensity on one side of the feature boundary and the minimum radiation intensity on the other side. Instead, due to diffractive effects, the level of the radiation dose may drop off across a transition zone. The position of the boundary of the desired feature ultimately formed after developing the resist is then determined by the position at which the received dose drops below the radiation dose threshold. The profile of the drop-off of radiation dose across the transition zone, and hence the precise position of the feature boundary, can be controlled more precisely by providing radiation to points on the substrate that are on or near the feature boundary not only to maximum or minimum intensity levels but also to intensity levels between the maximum and minimum intensity levels. This is commonly referred to as "grayscaling" or "grayleveling".

Grayscaling may provide greater control of the position of the feature boundaries than is possible in a lithography system in which the radiation intensity provided to the substrate can only be set to two values (namely just a maximum value and a minimum value). In an embodiment, at least three different radiation intensity values can be projected, e.g. at least 4 radiation intensity values, at least 8 radiation intensity values, at least 16 radiation intensity values, at least 32 radiation intensity values, at least 64 radiation intensity values, at least 100 radiation intensity values, at least 128 radiation intensity values, or at least 256 radiation intensity values. If the patterning device is a radiation source itself (e.g. an array of light emitting diodes or laser diodes), grayscaling may be effected, e.g., by controlling the intensity levels of the radiation being transmitted. If the patterning device include a deflector, grayscaling may be effected, e.g., by controlling the tilting angles of the deflector. Also, grayscaling may be effected by grouping a plurality of programmable elements and/or deflectors and controlling the number of elements and/or deflectors within the group that are switched on or off at a given time.

In one example, the patterning device may have a series of states including: (a) a black state in which radiation provided is a minimum, or even a zero contribution to the intensity distribution of its corresponding pixel; (b) a whitest state in which the radiation provided makes a maximum contribution; and (c) a plurality of states in between in which the radiation provided makes intermediate contributions. The states are divided into a normal set, used for normal beam patterning/printing, and a compensation set, used for compensating for the effects of defective elements. The normal set comprises the black state and a first group of the intermediate states. This first group will be described as gray states, and they are selectable to provide progressively increasing contributions to corresponding pixel intensity from the minimum black value up to a certain normal maximum. The compensation set comprises the remaining, second group of intermediate states together with the whitest state. This second group of intermediate states will be described as white states, and they are selectable to provide contributions greater than the normal maximum, progressively increasing up to the true maximum corresponding to the whitest state. Although the second group of intermediate states is described as white states, it will be appreciated that this is simply to facilitate the distinction between the normal and compensatory exposure steps. The entire plurality of states could alternatively be described as a sequence of gray states, between black and white, selectable to enable grayscale printing.

It should be appreciated that grayscaling may be used for additional or alternative purposes to that described above. For example, the processing of the substrate after the exposure may be tuned such that there are more than two potential responses of regions of the substrate, dependent on received radiation dose level. For example, a portion of the substrate receiving a radiation dose below a first threshold responds in a first manner; a portion of the substrate receiving a radiation dose above the first threshold but below a second threshold responds in a second manner; and a portion of the substrate receiving a radiation dose above the second threshold responds in a third manner. Accordingly, grayscaling may be used to provide a radiation dose profile across the substrate having more than two desired dose levels. In an embodiment, the radiation dose profile has at least 2 desired dose levels, e.g. at least 3 desired radiation dose levels, at least 4 desired radiation dose levels, at least 6 desired radiation dose levels or at least 8 desired radiation dose levels.

It should further be appreciated that the radiation dose profile may be controlled by methods other than by merely controlling the intensity of the radiation received at each point, as described above. For example, the radiation dose received by each point may alternatively or additionally be controlled by controlling the duration of the exposure of said point. As a further example, each point may potentially receive radiation in a plurality of successive exposures. The radiation dose received by each point may, therefore, be alternatively or additionally controlled by exposing said point using a selected subset of said plurality of successive exposures.

Further, while the discussion above regarding gray scaling focused on photolithography, similar concepts may be applied to the material deposition discussed herein. For example, power levels and/or flow rates may be controlled to provide gray scaling associated with the material deposition.

In order to form the pattern on the substrate, it is necessary to set the patterning device to the requisite state at each stage during the exposure process. Therefore control signals, representing the requisite states, must be transmitted to the patterning device. Desirably, the lithographic apparatus includes a distributed processing system as described above, that generates the control signals. The pattern to be formed on the substrate may be provided to the lithographic apparatus in a vector-defined format e.g., GDSII. In order to convert the design information into the control signals, the distributed processing system includes one or more data manipulation devices or processing units, each configured to perform a processing step on a data stream that represents the pattern. The data manipulation devices or processing units may collectively be referred to as the "data path".

The data manipulation devices or processing units of the data path may be configured to perform one or more of the following functions: converting vector-based design information into bitmap pattern data (and then to a required radiation dose map (namely a required radiation dose profile across the substrate)) or to the required radiation dose map; converting a required radiation dose map into required radiation intensity values for each individually addressable element; and converting the required radiation intensity values for each individually addressable element into corresponding control signals.

In an embodiment, the control signals may be supplied to the individually addressable elements 102 and/or one or more other devices (e.g., a sensor) by wired or wireless communication. Further, signals from the individually addressable elements 102 and/or from one or more other devices (e.g., a sensor) may be communicated to the controller. In a similar manner to the control signals, power may be supplied to the individually addressable elements 102 or one or more other devices (e.g., a deflector and/or sensor) by wired or wireless means. For example, in a wired embodiment, power may be supplied by one or more lines, whether the same as the ones that carry the signals or different. A sliding contact arrangement may be provided to transmit power. In a wireless embodiment, power may be delivered by RF coupling.

While the previous discussion focused on the control signals supplied to the individually addressable elements 102 and/or one or more other devices (e.g., a deflector and/or a sensor), they should be understood to encompass in addition or alternatively, through appropriate configuration, transmission of signals from the individually addressable elements 102 and/or from one or more other devices (e.g., a sensor) to the controller. So, communication may be one-way (e.g., only to or from the individually addressable elements 102 and/or one or more other devices (e.g., a sensor)) or two-way (i.e., from and to the individually addressable elements 102 and/or one or more other devices (e.g., a sensor)).

In an embodiment, the control signals to provide the pattern may be altered to account for factors that may influence the proper supply and/or realization of the pattern on the substrate. For example, a correction may be applied to the control signals to account for the heating of one or more of the individually addressable elements 102, lenses, etc. Such heating may cause changed pointing direction of the individually addressable elements 102, lenses, etc., change in uniformity of the radiation, etc. In an embodiment, a measured temperature and/or expansion/contraction associated with an individually addressable element 102 and/or other element from, e.g., a sensor may be used to alter the control signals that would have been otherwise provided to form the pattern. So, for example, during exposure, the temperature of the individually addressable elements 102 may vary, the variance causing a change of the projected pattern that would be provided at a single constant temperature. Accordingly, the control signals may be altered to account for such variance. Similarly, in an embodiment, results from the alignment sensor and/or the level sensor 150 may be used to alter the pattern provided by the individually addressable elements 102. The pattern may be altered to correct, for example, distortion, which may arise from, e.g., optics (if any) between the individually addressable elements 102 and the substrate 114, irregularities in the positioning of the substrate 114, unevenness of the substrate 114, etc.

In an embodiment, the change in the control signals may be determined based on theory of the physical/optical results on the desired pattern arising from the measured parameter (e.g., measured temperature, measured distance by a level sensor, etc.). In an embodiment, the change in the control signals may be determined based on an experimental or empirical model of the physical/optical results on the desired pattern arising from the measured parameter. In an embodiment, the change of the control signals may be applied in a feedforward and/or feedback manner.

In an embodiment, the lithographic apparatus may comprise a sensor 118 to measure a characteristic of the radiation that is or to be transmitted toward the substrate by one or more individually addressable elements 102. Such a sensor may be a spot sensor or a transmission image sensor. The sensor may be used to, for example, determine the intensity of radiation from an individually addressable element 102, uniformity of radiation from an individually addressable element 102, a cross-sectional size or area of the spot of radiation from an individually addressable element 102, and/or the location (in the X-Y plane) of the spot of radiation from an individually addressable element 102.

Although specific reference may be made in this text to the use of a lithographic apparatus in the manufacture of a specific device or structure (e.g. an integrated circuit or a flat panel display), it should be understood that the lithographic apparatus and lithographic method described herein may have other applications. Applications include, but are not limited to, the manufacture of integrated circuits, integrated optical systems, guidance and detection patterns for magnetic domain memories, flat panel displays, LCDs, OLED displays, thin film magnetic heads, micro-electromechanical devices (MEMS), micro-opto-electromechanical systems (MOEMS), DNA chips, packaging (e.g., flip chip, redistribution, etc.), flexible displays or electronics (which are displays or electronics that may be rollable, bendable like paper and remain free of deformities, conformable, rugged, thin, and/or lightweight, e.g., flexible plastic displays), etc. Also, for instance in a flat panel display, the present apparatus and method may be used to assist in the creation of a variety of layers, e.g. a thin film transistor layer and/or a color filter layer. Thus, a variation of the same apparatus herein could be used in the manufacture of various electronic and other devices or patterns, including, e.g., on flexible substrates, such as plastic or metal foil using e.g. roll-to-roll techniques and/or foil on a glass carrier.

The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (e.g., a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

A flat panel display substrate may be rectangular in shape. A lithographic apparatus designed to expose a substrate of this type may provide an exposure region which covers a full width of the rectangular substrate, or which covers a portion of the width (for example half of the width). The substrate may be scanned underneath the exposure region, while the patterning device synchronously provides the patterned beam. In this way, all or part of the desired pattern is transferred to the substrate. If the exposure region covers the full width of the substrate then exposure may be completed with a single scan. If the exposure region covers, for example, half of the width of the substrate, then the substrate may be moved transversely after the first scan, and a further scan is typically performed to expose the remainder of the substrate.

The term "patterning device", used herein should be broadly interpreted as referring to any device that can be used to modulate the cross-section of a radiation beam such as to create a pattern in (part of) the substrate. It should be noted that the pattern imparted to the radiation beam may not exactly correspond to the desired pattern in the target portion of the substrate, for example if the pattern includes phase-shifting features or so called assist features. Similarly, the pattern eventually generated on the substrate may not correspond to the pattern formed at any one instant by the array of individually addressable elements. This may be the case in an arrangement in which the eventual pattern formed on each part of the substrate is built up over a given period of time or a given number of exposures during which the pattern provided by the array of individually addressable elements and/or the relative position of the substrate changes. Generally, the pattern created on the target portion of the substrate will correspond to a particular functional layer in a device being created in the target portion, e.g., an integrated circuit or a flat panel display (e.g., a color filter layer in a flat panel display or a thin film transistor layer in a flat panel display). Examples of such patterning devices include, e.g., reticles, programmable mirror arrays, laser diode arrays, light emitting diode arrays, grating light valves, and LCD arrays. Patterning devices whose pattern is programmable with the aid of an electronic devices (e.g., a computer), e.g., patterning devices comprising a plurality of programmable elements that can each modulate the intensity of a portion of the radiation beam, (e.g., all the devices mentioned in the previous sentence except for the reticle), including electronically programmable patterning devices having a plurality of programmable elements that impart a pattern to the radiation beam by modulating the phase of a portion of the radiation beam relative to adjacent portions of the radiation beam, are collectively referred to herein as "contrast devices". In an embodiment, the patterning device comprises at least 10 programmable elements, e.g. at least 100, at least 1000, at least 10000, at least 100000, at least 1000000, or at least 10000000 programmable elements. Embodiments of several of these devices are discussed in some more detail below:

A programmable mirror array. The programmable mirror array may comprise a matrix-addressable surface having a viscoelastic control layer and a reflective surface. The basic principle behind such an apparatus is that, for example, addressed areas of the reflective surface reflect incident radiation as diffracted radiation, whereas unaddressed areas reflect incident radiation as undiffracted radiation. Using an appropriate spatial filter, the undiffracted radiation can be filtered out of the reflected beam, leaving only the diffracted radiation to reach the substrate. In this manner, the beam becomes patterned according to the addressing pattern of the matrix-addressable surface. As an alternative, the filter may filter out the diffracted radiation, leaving the undiffracted radiation to reach the substrate. An array of diffractive optical MEMS devices may also be used in a corresponding manner. A diffractive optical MEMS device may comprise a plurality of reflective ribbons that may be deformed relative to one another to form a grating that reflects incident radiation as diffracted radiation. A further embodiment of a programmable mirror array employs a matrix arrangement of tiny mirrors, each of which may be individually tilted about an axis by applying a suitable localized electric field, or by employing piezoelectric actuation means. The degree of tilt defines the state of each mirror. The mirrors are controllable, when the element is not defective, by appropriate control signals from the controller. Each non-defective element is controllable to adopt any one of a series of states, so as to adjust the intensity of its corresponding pixel in the projected radiation pattern. Once again, the mirrors are matrix-addressable, such that addressed mirrors reflect an incoming radiation beam in a different direction to unaddressed mirrors; in this manner, the reflected beam may be patterned according to the addressing pattern of the matrix-addressable mirrors. The required matrix addressing may be performed using suitable electronic means. More information on mirror arrays as here referred to can be gleaned, for example, from U.S. Pat. Nos. 5,296,891 and 5,523,193, and PCT Patent Application Publication Nos. WO 98/38597 and WO 98/33096, which are incorporated herein by reference in their entirety.

A programmable LCD array. An example of such a construction is given in U.S. Pat. No. 5,229,872, which is incorporated herein by reference in its entirety.

The lithographic apparatus may comprise one or more patterning devices, e.g. one or more contrast devices. For example, it may have a plurality of arrays of individually addressable elements, each controlled independently of each other. In such an arrangement, some or all of the arrays of individually addressable elements may have at least one of a common illumination system (or part of an illumination system), a common support structure for the arrays of individually addressable elements and/or a common projection system (or part of the projection system).

Where pre-biasing of features, optical proximity correction features, phase variation techniques and/or multiple exposure techniques are used, for example, the pattern "displayed" on the array of individually addressable elements may differ substantially from the pattern eventually transferred to a layer of or on the substrate. Similarly, the pattern eventually generated on the substrate may not correspond to the pattern formed at any one instant on the array of individually addressable elements. This may be the case in an arrangement in which the eventual pattern formed on each part of the substrate is built up over a given period of time or a given number of exposures during which the pattern on the array of individually addressable elements and/or the relative position of the substrate changes.

The projection system and/or illumination system may include various types of optical components, e.g., refractive, reflective, magnetic, electromagnetic, electrostatic or other types of optical components, or any combination thereof, to direct, shape, or control the beam of radiation.

The lithographic apparatus may be of a type having two (e.g., dual stage) or more substrate tables (and/or two or more patterning device tables) or one or more substrate tables in combination with another table not holding a substrate (e.g., a table for cleaning, and/or measurement, etc.). In such "multiple stage" machines the additional table(s) may be used in parallel, or preparatory steps may be carried out on one or more tables while one or more other tables are being used for exposure.

The lithographic apparatus may also be of a type wherein at least a portion of the substrate may be covered by an "immersion liquid" having a relatively high refractive index, e.g. water, so as to fill a space between the projection system and the substrate. An immersion liquid may also be applied to other spaces in the lithographic apparatus, for example, between the patterning device and the projection system. Immersion techniques are used to increase the NA of projection system. The term "immersion" as used herein does not mean that a structure, e.g., a substrate, must be submerged in liquid, but rather only means that liquid is located between the projection system and the substrate during exposure.

Further, the apparatus may be provided with a fluid processing cell to allow interactions between a fluid and irradiated parts of the substrate (e.g., to selectively attach chemicals to the substrate or to selectively modify the surface structure of the substrate).

In an embodiment, the substrate has a substantially circular shape, optionally with a notch and/or a flattened edge along part of its perimeter. In an embodiment, the substrate has a polygonal shape, e.g. a rectangular shape. Embodiments where the substrate has a substantially circular shape include embodiments where the substrate has a diameter of at least 25 mm, for instance at least 50 mm, at least 75 mm, at least 100 mm, at least 125 mm, at least 150 mm, at least 175 mm, at least 200 mm, at least 250 mm, or at least 300 mm. In an embodiment, the substrate has a diameter of at most 500 mm, at most 400 mm, at most 350 mm, at most 300 mm, at most 250 mm, at most 200 mm, at most 150 mm, at most 100 mm, or at most 75 mm. Embodiments where the substrate is polygonal, e.g. rectangular, include embodiments where at least one side, e.g. at least 2 sides or at least 3 sides, of the substrate has a length of at least 5 cm, e.g. at least 25 cm, at least 50 cm, at least 100 cm, at least 150 cm, at least 200 cm, or at least 250 cm. In an embodiment, at least one side of the substrate has a length of at most 1000 cm, e.g. at most 750 cm, at most 500 cm, at most 350 cm, at most 250 cm, at most 150 cm, or at most 75 cm. In an embodiment, the substrate is a rectangular substrate having a length of about 250-350 cm and a width of about 250-300 cm The thickness of the substrate may vary and, to an extent, may depend, e.g., on the substrate material and/or the substrate dimensions. In an embodiment, the thickness is at least 50 μm, for instance at least 100 μm, at least 200 μm, at least 300 μm, at least 400 μm, at least 500 μm, or at least 600 μm. In one embodiment, the thickness of the substrate is at most 5000 μm, for instance at most 3500 μm, at most 2500 μm, at most 1750 μm, at most 1250 μm, at most 1000 μm, at most 800 μm, at most 600 μm, at most 500 μm, at most 400 μm, or at most 300 μm. The substrate referred to herein may be processed, before or after exposure, in for example a track (a tool that typically applies a layer of resist to a substrate and develops the exposed resist). Properties of the substrate may be measured before or after exposure, for example in a metrology tool and/or an inspection tool.

In an embodiment, a resist layer is provided on the substrate. In an embodiment, the substrate is a wafer, for instance a semiconductor wafer. In an embodiment, the wafer material is selected from the group consisting of Si, SiGe, SiGeC, SiC, Ge, GaAs, InP, and InAs. In an embodiment, the wafer is a III/V compound semiconductor wafer. In an embodiment, the wafer is a silicon wafer. In an embodiment, the substrate is a ceramic substrate. In an embodiment, the substrate is a glass substrate. Glass substrates may be useful, e.g., in the manufacture of flat panel displays and liquid crystal display panels. In an embodiment, the substrate is a plastic substrate. In an embodiment, the substrate is transparent (for the naked human eye). In an embodiment, the substrate is colored. In an embodiment, the substrate is absent a color. In an embodiment, the substrate comprises a plastic foil on temporary glass carrier. This can include a coated layer of e.g. polyimide on a glass substrate, which is processed in similar fashion to a glass display, but where the glass is removed after processing using, e.g., a UV laser step, desirably after laminating the remaining foil with a protective plastic foil for increased robustness and ease of handling.

The embodiments may further be described using the following clauses:

1. An exposure apparatus comprising:
    a substrate holder constructed to support a substrate;
    a patterning device configured to provide radiation modulated according to a desired pattern, the patterning device comprising an array of a plurality of radiation source modules configured to project the modulated radiation onto a respective array of a plurality of exposure regions on the substrate;
    a distributed processing system configured to process projection related data to enable the projection of the desired pattern onto the substrate, the distributed processing system comprising at least one central processing unit and a plurality of module processing units associated with respective plurality of radiation source modules.
2. The exposure apparatus according to clause 1, further comprising a positioning device configured to provide relative motion between the substrate and the array of radiation source modules in a scanning direction to expose the substrate.
3. The exposure apparatus according to clause 1 or clause 2, wherein the projection related data comprises substrate related data and pattern related data.
4. The exposure apparatus according to clause 3, wherein the exposure apparatus further comprises a measurement system for generating the substrate related data.
5. The exposure apparatus according to clause 4, wherein the measurement system comprises a height measurement system to determine a height of the substrate.
6. The exposure apparatus according to clause 5, wherein the height measurement system is configured to determine a height of the substrate at a plurality of locations along the array of radiation source modules.
7. The exposure apparatus according to clause 6, wherein the height measurement system comprises an array of height sensors associated with the array of radiation source modules, the array of height sensors being configured to generate one or more height signals representative of a height of the array of exposure regions of the substrate and to provide the one or more height signals to the plurality of module processing units as at least part of the substrate related data.
8. The exposure apparatus according to clause 3, wherein the central processing unit is configured to at least partly process the pattern related data.
9. The exposure apparatus according to clause 8, wherein the pattern related data comprises pattern layout data indicative of the desired pattern that is to be projected onto the substrate.
10. The exposure apparatus according to clause 9, wherein the central processing unit is configured to:
    receive, at an input terminal, the pattern layout data;
    process the pattern layout data by converting the pattern layout data to radiation set point data for each of the radiation source modules; and
    provide the radiation set point data to the module processing units associated with the respective radiation source modules.
11. The exposure apparatus according to clause 10, wherein the plurality of module processing units are configured to process the radiation set point data by converting the radiation set point data to radiation source control signals for the respective plurality of radiation source modules.
12. The exposure apparatus according to clause 11, wherein the module processing units comprise respective memory units, the memory units comprising calibration data for the respective radiation source modules.
13. The exposure apparatus according to clause 12, wherein the converting of the radiation set point data to control signals for the respective plurality of radiation source modules is based on the calibration data of the respective radiation source modules.
14. The exposure apparatus according to any of the clauses 3 to 13, wherein the central processing unit is configured to:
    receive, at an input terminal, as the pattern related data, pattern layout data indicative of the desired pattern that is to be projected onto the substrate;
    compress the pattern layout data into compressed pattern layout data and provide to compressed pattern layout data to the module processing units.
15. The exposure apparatus according to clause 14, wherein the module processing units are configured to process the compressed pattern layout data by:
    decompressing the compressed pattern layout data;
    converting the pattern layout data to radiation set point data for the respective radiation source module;
    converting the radiation set point data to radiation source control signals for the radiation source module.
16. The exposure apparatus according to any preceding clauses, wherein the module processing units are integrated in the respective radiation source modules.
17. The exposure apparatus according to clause 4, wherein the measurement system comprises a pattern position measurement system, configured to detect a position of a previously applied pattern on the substrate.
18. The exposure apparatus according to clause 17, wherein the pattern position measurement system is configured to determine the position of the previously applied pattern at a plurality of locations along the array of radiation source modules.
19. The exposure apparatus according to clause 18, wherein the pattern position measurement system comprises an array of position sensors associated with the array of radiation source modules, the array of position sensors being configured to generate one or more position signals representative of a position of the previously applied pattern at the plurality of locations along the array of radiation source modules and to provide the one or more position signals to the plurality of module processing units as at least part of the substrate related data.
20. The exposure apparatus according to clause 19, wherein the central processing unit is configured to determine a deformation of the previously applied pattern based on the one or more position signals.
21. The exposure apparatus according to clause 20, wherein the central processing unit is configure to determine the radiation set point data based on the deformation.
22. The exposure apparatus according to any of the preceding clauses, wherein the radiation source modules are individually displaceable in a direction substantially perpendicular to a plane of the substrate.
23. The exposure apparatus according to clause 16, wherein the radiation source modules comprise a module actuator configured to displace the radiation source module in the direction substantially perpendicular to a plane of the substrate.

24. The exposure apparatus according to clause 7 or 19, wherein the module processing units are configured to control the module actuators based on the one or more height signals or the one or more position signals.

25. The exposure apparatus according to clause 5, wherein the height measurement system comprises an array of height sensors, the array of height sensors being configured to generate one or more height signals representative of a height of the substrate along the array of radiation source modules, wherein the radiation source modules comprise a module actuator configured to displace the radiation source module in a direction substantially perpendicular to the plane of the substrate and wherein the height measurement system further comprising a height processing unit of the processing system, the height processing unit being configured to
   receive, at an input terminal of the height processing unit, the one or more signals representative of the height of the substrate along the array of radiation source modules;
   determine, based on the received one or more signals, a control signal for each of the module actuators of the respective radiation source modules for controlling a position of the radiation source module in the direction;
   output, via an output terminal of the height processing unit, the control signal for each of the radiation source modules to the radiation source modules.

26. The exposure apparatus according to clause 25, wherein the height processing unit is configured to mitigate outliers in the one or more signals by filtering.

27. The exposure apparatus according to clause 25 or 26, wherein the radiation source modules are mounted to a common frame and wherein the common frame is displaceable in a direction substantially perpendicular to a plane of the substrate by means of a frame actuator.

28. The exposure apparatus according to clause 26, wherein the height processing unit is further configured to determine, based on the height measurements, a control signal for the frame actuator to control a position of the common frame.

29. The exposure apparatus according to any preceding clauses, wherein a focal plane position of the radiation source modules is adjustable by adjusting an optical component of the radiation source modules.

30. The exposure apparatus according to any preceding clauses, wherein a radiation source module of the array of radiation source modules comprises a two-dimensional array of radiation sources, each radiation source configured to emit a radiation beam.

31. The exposure apparatus according to any preceding clauses, wherein a radiation source module of the array of radiation source modules comprises an MLA module.

While, in an embodiment, the patterning device 104 is described and/or depicted as being above the substrate 114, it may instead or additionally be located under the substrate 114. Further, in an embodiment, the patterning device 104 and the substrate 114 may be side by side, e.g., the patterning device 104 and substrate 114 extend vertically and the pattern is projected horizontally. In an embodiment, a patterning device 104 is provided to expose at least two opposite sides of a substrate 114. For example, there may be at least two patterning devices 104, at least on each respective opposing side of the substrate 114, to expose those sides. In an embodiment, there may be a single patterning device 104 to project one side of the substrate 114 and appropriate optics (e.g., beam directing mirrors) to project a pattern from the single patterning device 104 onto another side of the substrate 114.

In the description herein, the term "lens" should be understood generally to encompass any refractive, reflective, and/or diffractive optical element that provides the same function as the referenced lens. For example, an imaging lens may be embodied in the form of a conventional refractive lens having optical power, in the form of a Schwarzschild reflective system having optical power, and/or in the form of a zone plate having optical power. Moreover, an imaging lens may comprise non-imaging optics if the resulting effect is to produce a converged beam.

While specific embodiments have been described above, it will be appreciated that the invention may be practiced otherwise than as described. For example, an embodiment of the invention may take the form of a computer program containing one or more sequences of machine-readable instructions describing a method as disclosed above, or a data storage medium (e.g. semiconductor memory, magnetic or optical disk) having such a computer program stored therein.

Moreover, although certain embodiments and examples have been described, it will be understood by those skilled in the art that the present invention extends beyond the specifically disclosed embodiments to other alternative embodiments and/or uses of the invention and obvious modifications and equivalents thereof. In addition, while a number of variations of the invention have been shown and described in detail, other modifications, which are within the scope of this invention, will be readily apparent to those of skill in the art based upon this disclosure. For example, it is contemplated that various combination or sub-combinations of the specific features and aspects of the embodiments may be made and still fall within the scope of the invention. Accordingly, it should be understood that various features and aspects of the disclosed embodiments can be combined with or substituted for one another in order to form varying modes of the disclosed invention. In an embodiment, one or more features or aspects disclosed in U.S. patent application publication no. US 2011-0188016 and PCT patent application publication no. WO 2010/032224, the entire contents of U.S. patent application publication no. US 2011-0188016 and PCT patent application publication no. WO 2010/032224 incorporated herein by reference, may be combined with or substituted for one or more features or aspects disclosed herein.

Thus, while various embodiments have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. An exposure apparatus comprising:
   a substrate holder constructed to support a substrate;
   a patterning device configured to provide radiation modulated according to a desired pattern, the patterning device comprising an array of radiation source modules configured to project the modulated radiation onto a respective array of exposure regions on the substrate; and a distributed processing system configured to process projection related data to enable the projection of the desired pattern onto the substrate, the distributed processing system comprising at least one central processing unit and a plurality of module processing units, each module processing unit associated with a respective radiation source module of the array of radiation source modules, wherein the pattern related data comprises pattern layout data indicative of the desired pattern that is to be projected onto the substrate, and wherein the at least one central processing unit is configured to at least:

receive, at an input terminal, the pattern layout data, process the pattern layout data by converting the pattern layout data to radiation set point data for each of the radiation source modules, and provide the radiation set point data to the module processing units associated with the respective radiation source modules.

2. The exposure apparatus according to claim 1, wherein the projection related data comprises substrate related data and pattern related data.

3. The exposure apparatus according to claim 2, wherein the exposure apparatus further comprises a measurement system configured to generate the substrate related data.

4. The exposure apparatus according to claim 3, wherein the measurement system comprises a height measurement system to determine a height of the substrate.

5. The exposure apparatus according to claim 4, wherein the height measurement system is configured to determine a height of the substrate at a plurality of locations along the array of radiation source modules, and wherein the height measurement system comprises an array of height sensors associated with the array of radiation source modules, the array of height sensors configured to generate one or more height signals representative of a height of the array of exposure regions of the substrate and to provide the one or more height signals to the plurality of module processing units as at least part of the substrate related data.

6. The exposure apparatus according to claim 1, wherein the module processing units are configured to process the radiation set point data by converting the radiation set point data to radiation source control signals for the respective radiation source modules.

7. The exposure apparatus according to claim 6, wherein the module processing units comprise respective memory units, the memory units comprising calibration data for the respective radiation source modules.

8. The exposure apparatus according to claim 7, wherein the conversion of the radiation set point data to control signals for the respective plurality of radiation source modules is based on the calibration data of the respective radiation source modules.

9. The exposure apparatus according to claim 2, wherein the at least one central processing unit is configured to:

receive, at an input terminal, as the pattern related data, pattern layout data indicative of the desired pattern that is to be projected onto the substrate; and compress the pattern layout data into compressed pattern layout data and provide the compressed pattern layout data to the module processing units.

10. The exposure apparatus according to claim 9, wherein the module processing units are configured to:

decompress the compressed pattern layout data;

convert the pattern layout data to radiation set point data for the respective radiation source module; and convert the radiation set point data to a radiation source control signal for the respective radiation source module.

11. The exposure apparatus according to claim 3, wherein the measurement system comprises a pattern position measurement system, configured to detect a position of a previously applied pattern on the substrate.

12. The exposure apparatus according to claim 11, wherein the pattern position measurement system is configured to determine the position of the previously applied pattern at a plurality of locations along the array of radiation source modules.

13. The exposure apparatus according to claim 11, wherein the pattern position measurement system comprises an array of position sensors associated with the array of radiation source modules, the array of position sensors configured to generate one or more position signals representative of a position of the previously applied pattern at the plurality of locations along the array of radiation source modules and to provide the one or more position signals to the plurality of module processing units as at least part of the substrate related data.

14. The exposure apparatus according to claim 1, wherein the radiation source modules are individually displaceable in a direction substantially perpendicular to a plane of the substrate.

15. The exposure apparatus according to claim 14, wherein the radiation source modules comprise a module actuator configured to displace the radiation source modules in the direction substantially perpendicular to a plane of the substrate.

16. The exposure apparatus according to claim 1, wherein a focal plane position of the radiation source modules is adjustable by adjustment of an optical component of the radiation source modules.

17. The exposure apparatus according to claim 1, wherein a radiation source module of the array of radiation source modules comprises a two-dimensional array of radiation sources, each radiation source configured to emit a radiation beam.

18. An exposure apparatus comprising:

a substrate holder constructed to support a substrate;

a patterning device configured to provide radiation modulated according to a desired pattern, the patterning device comprising an array of radiation source modules configured to project the modulated radiation onto a respective array of exposure regions on the substrate; and a distributed processing system configured to process projection related data to enable the projection of the desired pattern onto the substrate, the distributed processing system comprising at least one central processing unit and a plurality of module processing units, each module processing unit associated with a respective radiation source module of the array of radiation source modules, wherein the at least one central processing unit is configured to at least:

receive, at an input terminal, as projection related data, pattern layout data indicative of the desired pattern that is to be projected onto the substrate; and compress the pattern layout data into compressed pattern layout data and provide the compressed pattern layout data to the module processing units.

19. The exposure apparatus according to claim 18, wherein the module processing units are configured to:

decompress the compressed pattern layout data;

convert the pattern layout data to radiation set point data for the respective radiation source module; and convert the radiation set point data to a radiation source control signal for the respective radiation source module.

20. An exposure apparatus comprising:

a substrate holder constructed to support a substrate;

a patterning device configured to provide radiation modulated according to a desired pattern, the patterning device comprising an array of radiation source modules configured to project the modulated radiation onto a respective array of exposure regions on the substrate; and a distributed processing system configured to process pattern data of a desired pattern that is to be projected onto the substrate to enable the projection of the desired pattern onto the substrate, the distributed processing system comprising at least one central processing unit and a plurality of module processing units, each module processing unit associated with a respective radiation source module of the array of radiation source modules, wherein the at least one central processing unit is configured to at least:

receive, at an input terminal, the pattern data, process the pattern data by converting the pattern layout data to radiation data for each of the radiation source modules, and provide the radiation data to the module processing units associated with the respective radiation source modules.

* * * * *